(12) United States Patent
Lee et al.

(10) Patent No.: US 11,024,668 B2
(45) Date of Patent: Jun. 1, 2021

(54) DISPLAY DEVICE HAVING LIGHT EMITTING STACKED STRUCTURE

(71) Applicant: SEOUL VIOSYS CO., LTD., Ansan-si (KR)

(72) Inventors: Chung Hoon Lee, Ansan-si (KR); Jong Hyeon Chae, Ansan-si (KR)

(73) Assignee: SEOUL VIOSYS CO., LTD.

( * ) Notice: Subject to any disclaimer, the term of this patent is extended or adjusted under 35 U.S.C. 154(b) by 0 days.

(21) Appl. No.: 16/236,737

(22) Filed: Dec. 31, 2018

(65) Prior Publication Data

US 2019/0206927 A1 Jul. 4, 2019

Related U.S. Application Data

(60) Provisional application No. 62/613,357, filed on Jan. 3, 2018, provisional application No. 62/612,997, filed on Jan. 2, 2018.

(51) Int. Cl.
*H01L 27/15* (2006.01)
*H01L 33/30* (2010.01)
(Continued)

(52) U.S. Cl.
CPC ........ *H01L 27/156* (2013.01); *H01L 25/0753* (2013.01); *H01L 27/153* (2013.01);
(Continued)

(58) Field of Classification Search
CPC . H01L 2224/32245; H01L 2224/73265; H01L 2224/45139; H01L 2224/45144; H01L 2224/48091; H01L 2224/48247; H01L 2224/48257; H01L 2924/00011; H01L 2924/181; H01L 2924/00012; H01L 2924/00014; H01L 2924/01049; H01L 2224/16145; H01L 2224/32257;
(Continued)

(56) References Cited

U.S. PATENT DOCUMENTS 5,583,349 A 12/1996 Norman et al.
5,696,389 A 12/1997 Ishikawa et al.
(Continued)

FOREIGN PATENT DOCUMENTS

EP 3122158 1/2017
JP 2007-057667 3/2007
(Continued)

OTHER PUBLICATIONS

International Search Report dated Apr. 18, 2019, issued in international Application No. PCT/KR2019/000062.
(Continued)

*Primary Examiner* — Cuong B Nguyen
(74) *Attorney, Agent, or Firm* — H.C. Park & Associates, PLC

(57) ABSTRACT

A display device includes a plurality of pixel tiles spaced apart from each other, each of the pixel tiles including a substrate and a plurality of light emitting stacked structures disposed on the substrate, in which a distance between two adjacent light emitting stacked structures in the same pixel tile is substantially equal to a shortest distance between two adjacent light emitting stacked structures of different pixel tiles.

20 Claims, 49 Drawing Sheets

(51) Int. Cl.
*H01L 33/08* (2010.01)
*H01L 33/62* (2010.01)
*H01L 33/40* (2010.01)
*H01L 25/075* (2006.01)
*G09G 3/32* (2016.01)
*H01L 33/22* (2010.01)

(52) U.S. Cl.
CPC .............. *H01L 33/08* (2013.01); *H01L 33/30* (2013.01); *H01L 33/405* (2013.01); *H01L 33/62* (2013.01); *G09G 3/32* (2013.01); *G09G 2300/0404* (2013.01); *G09G 2300/0426* (2013.01); *G09G 2300/0452* (2013.01); *H01L 33/22* (2013.01)

(58) Field of Classification Search
CPC ........... H01L 2224/49107; F21V 29/77; F21V 29/78; F21V 29/83; F21V 5/008; F21V 5/02; F21V 5/04; F21V 7/0025; F21V 7/0033; F21V 7/005; F21V 7/0091; F21V 7/06; F21V 7/22; F21V 7/24; F21V 7/28; F21V 9/08
See application file for complete search history.

(56) References Cited

U.S. PATENT DOCUMENTS

| | | | |
|---|---|---|---|
| 5,703,436 | A | 12/1997 | Forrest et al. |
| 5,739,552 | A | 4/1998 | Kimura et al. |
| 6,046,543 | A | 4/2000 | Bulovic et al. |
| 6,100,103 | A | 8/2000 | Shim et al. |
| 6,717,358 | B1 | 4/2004 | Liao et al. |
| 6,934,309 | B2 | 8/2005 | Nishikawa et al. |
| 7,282,741 | B2 | 10/2007 | Kim et al. |
| 7,732,803 | B2 | 6/2010 | Shum et al. |
| 7,745,986 | B2 | 6/2010 | Ito et al. |
| 8,017,955 | B2 | 9/2011 | Wang et al. |
| 8,035,115 | B2 | 10/2011 | Ogihara et al. |
| 8,058,663 | B2 | 11/2011 | Fan et al. |
| 8,089,074 | B2 | 1/2012 | Kim et al. |
| 8,283,191 | B2 | 10/2012 | Rode et al. |
| 8,324,803 | B2 | 12/2012 | Forrest et al. |
| 8,436,346 | B2 | 5/2013 | Ushikubo et al. |
| 8,466,542 | B2 | 6/2013 | Kriman et al. |
| 8,546,836 | B2 | 10/2013 | Kamiya et al. |
| 8,563,144 | B2 | 10/2013 | Kim et al. |
| 8,624,274 | B2 | 1/2014 | Hsueh et al. |
| 8,766,295 | B2 | 7/2014 | Kim |
| 8,884,316 | B2 | 11/2014 | Weaver et al. |
| 9,006,752 | B2 | 4/2015 | So et al. |
| 9,018,834 | B2 | 4/2015 | Ide et al. |
| 9,052,096 | B2 | 6/2015 | Nishimura et al. |
| 9,076,929 | B2 | 7/2015 | Katsuno et al. |
| 9,099,631 | B2 | 8/2015 | Yang et al. |
| 9,142,748 | B2 | 9/2015 | Ohmae et al. |
| 9,153,750 | B2 | 10/2015 | Seo et al. |
| 9,281,446 | B2 | 3/2016 | Suh et al. |
| 9,312,249 | B2 | 4/2016 | Choi et al. |
| 9,337,400 | B2 | 5/2016 | Hashimoto et al. |
| 9,406,908 | B2 | 8/2016 | Kim et al. |
| 9,419,031 | B1 | 8/2016 | Or-Bach et al. |
| 9,443,833 | B2 | 9/2016 | Oraw |
| 9,559,263 | B2 | 1/2017 | Matsui et al. |
| 9,577,012 | B2 | 2/2017 | Ooki et al. |
| 9,786,817 | B2 | 10/2017 | Kim et al. |
| 9,847,051 | B2 | 12/2017 | Choi et al. |
| 9,893,233 | B2 | 2/2018 | Kong et al. |
| 9,905,725 | B2 | 2/2018 | Lee |
| 9,966,369 | B2 | 5/2018 | Kim et al. |
| 10,056,535 | B2 | 8/2018 | Chang et al. |
| 10,079,265 | B1 | 9/2018 | Wu et al. |
| 10,170,666 | B2 | 1/2019 | Cha et al. |
| 10,205,058 | B2 | 2/2019 | Lee |
| 10,304,811 | B2 | 5/2019 | Zhang et al. |
| 10,326,056 | B2 | 6/2019 | Jung et al. |
| 10,381,519 | B2 | 8/2019 | Seo et al. |
| 10,559,557 | B2 | 2/2020 | Chang et al. |
| 10,686,149 | B2 | 6/2020 | Park et al. |
| 10,811,475 | B2 | 10/2020 | Zhang et al. |
| 2002/0154259 | A1 | 10/2002 | Freidhoff et al. |
| 2003/0213967 | A1 | 11/2003 | Forrest et al. |
| 2004/0232433 | A1 | 11/2004 | Doverspike et al. |
| 2005/0067627 | A1 | 3/2005 | Shen et al. |
| 2005/0140278 | A1 | 6/2005 | Kato |
| 2005/0264550 | A1 | 12/2005 | Ohshima et al. |
| 2006/0231852 | A1 | 10/2006 | Kususe et al. |
| 2007/0069220 | A1 | 3/2007 | Ogihara |
| 2007/0170444 | A1 | 7/2007 | Cao |
| 2007/0222922 | A1 | 9/2007 | Jin et al. |
| 2008/0068315 | A1 | 3/2008 | Kurosaki et al. |
| 2008/0099770 | A1* | 5/2008 | Mendendorp ........ H05K 1/0206 257/79 |
| 2008/0128728 | A1 | 6/2008 | Nemchuk et al. |
| 2008/0251799 | A1 | 10/2008 | Ikezawa |
| 2008/0308819 | A1 | 12/2008 | Louwsma et al. |
| 2009/0009101 | A1 | 1/2009 | Kang et al. |
| 2009/0078955 | A1 | 3/2009 | Fan et al. |
| 2009/0272989 | A1 | 11/2009 | Shum et al. |
| 2010/0045175 | A1 | 2/2010 | Mathai et al. |
| 2010/0051975 | A1 | 3/2010 | Suzuki et al. |
| 2010/0065867 | A1 | 3/2010 | Unno |
| 2010/0084668 | A1 | 4/2010 | Choi et al. |
| 2010/0144073 | A1 | 6/2010 | Louwsma et al. |
| 2011/0057211 | A1 | 3/2011 | Lee et al. |
| 2011/0086486 | A1 | 4/2011 | Lee et al. |
| 2011/0204376 | A1 | 8/2011 | Su et al. |
| 2012/0223875 | A1 | 9/2012 | Lau et al. |
| 2012/0236532 | A1 | 9/2012 | Koo et al. |
| 2012/0305959 | A1 | 12/2012 | Yu et al. |
| 2013/0264587 | A1 | 10/2013 | Chang |
| 2013/0285076 | A1 | 10/2013 | Liu et al. |
| 2013/0292711 | A1 | 11/2013 | Ogihara et al. |
| 2014/0191243 | A1 | 7/2014 | Singh et al. |
| 2014/0284633 | A1 | 9/2014 | Tsay et al. |
| 2015/0001572 | A1 | 1/2015 | Katsuno et al. |
| 2015/0221627 | A1 | 8/2015 | Nielson et al. |
| 2015/0340348 | A1 | 11/2015 | Katsuno et al. |
| 2015/0362165 | A1 | 12/2015 | Chu et al. |
| 2016/0005375 | A1 | 1/2016 | Naijo et al. |
| 2016/0043290 | A1 | 2/2016 | Sogo et al. |
| 2016/0099384 | A1 | 4/2016 | Kim et al. |
| 2016/0155378 | A1 | 6/2016 | Hack et al. |
| 2016/0155892 | A1 | 6/2016 | Li et al. |
| 2016/0315068 | A1 | 10/2016 | Lee et al. |
| 2016/0322293 | A1 | 11/2016 | Kimura et al. |
| 2016/0336482 | A1 | 11/2016 | Lu et al. |
| 2016/0359143 | A1 | 12/2016 | Osawa et al. |
| 2017/0012173 | A1 | 1/2017 | Lee et al. |
| 2017/0025593 | A1 | 1/2017 | Bower et al. |
| 2017/0062680 | A1 | 3/2017 | Yoo et al. |
| 2017/0064785 | A1 | 3/2017 | Kim et al. |
| 2017/0069612 | A1 | 3/2017 | Zhang et al. |
| 2017/0084876 | A1 | 3/2017 | Suzuki |
| 2017/0104035 | A1 | 4/2017 | Lee et al. |
| 2017/0117259 | A1 | 4/2017 | Xu |
| 2017/0133357 | A1 | 5/2017 | Kuo et al. |
| 2017/0194298 | A1 | 7/2017 | Negley et al. |
| 2017/0194535 | A1 | 7/2017 | Park et al. |
| 2017/0236866 | A1 | 8/2017 | Lee et al. |
| 2017/0250329 | A1 | 8/2017 | Takeya et al. |
| 2017/0288088 | A1 | 10/2017 | Won Cheol |
| 2017/0331009 | A1 | 11/2017 | Shioji |
| 2017/0331021 | A1 | 11/2017 | Chae et al. |
| 2017/0338275 | A1 | 11/2017 | Banna et al. |
| 2018/0083170 | A1 | 3/2018 | Shepherd |
| 2018/0151548 | A1 | 5/2018 | Pfeuffer et al. |
| 2018/0156965 | A1 | 6/2018 | El-Ghoroury et al. |
| 2018/0166499 | A1 | 6/2018 | Pfeuffer et al. |
| 2018/0233492 | A1* | 8/2018 | Liu ................ H01L 25/0753 |
| 2018/0240952 | A1 | 8/2018 | Moon et al. |
| 2018/0283642 | A1 | 10/2018 | Liao et al. |
| 2019/0053347 | A1 | 2/2019 | Lee et al. |
| 2019/0074324 | A1 | 3/2019 | Kim et al. |

(56) References Cited

U.S. PATENT DOCUMENTS

| | | | |
|---|---|---|---|
| 2019/0097088 A1 | 3/2019 | Huppmann et al. |
| 2019/0148612 A1 | 5/2019 | Lee et al. |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0212262 A1 | 7/2020 | Jang et al. |

FOREIGN PATENT DOCUMENTS

| | | |
|---|---|---|
| JP | 2012-195529 | 10/2012 |
| JP | 2012-209264 | 10/2012 |
| KR | 10-2006-0095690 | 9/2006 |
| KR | 10-2007-0089172 | 8/2007 |
| KR | 10-2008-0054626 | 6/2008 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |

OTHER PUBLICATIONS

Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Feb. 10, 2020, in U.S. Appl. No. 16/198,796.
Non-Final Office Action dated Mar. 5, 2020, in U.S. Appl. No. 16/228,601.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR20181014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.L..I —.
Notice of Allowance dated Nov. 7, 2019, in U.S. Appl. No. 16/207,881.

Non-Final Office Action dated Oct. 24, 2019, in U.S. Appl. No. 16/228,621.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action issued on Nov. 19, 2019, in U.S. Appl. No. 16/198,796.
Non-Final Office Action dated Oct. 31, 2019, in U.S. Appl. No. 16/198,850.
Non-Final Office Action dated Jan. 9, 2020, in U.S. Appl. No. 16/673,184.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society for Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
Notice of Allowance dated Mar. 31, 2020, in U.S. Appl. No. 16/234,541.
Notice of Allowance dated Apr. 9, 2020, in U.S. Appl. No. 16/198,792.
Non-Final Office Action dated Apr. 15, 2020, in U.S. Appl. No. 16/198,873.
Final Office Action dated Apr. 20, 2020, in U.S. Appl. No. 16/228,621.
Notice of Allowance dated Mar. 12, 2020, in U.S. Appl. No. 16/198,784.
Non-Final Office Action dated Mar. 23, 2020, in U.S. Appl. No. 16/219,716.
Final Office Action dated May 29, 2020, in U.S. Appl. No. 16/198,850.
Final Office Action dated Jun. 25, 2020, in U.S. Appl. No. 16/228,601.
Final Office Action dated Jul. 23, 2020, in U.S. Appl. No. 16/673,184.
Final Office Action for U.S. Appl. No. 16/198,873 dated Oct. 15, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/200,036 dated Sep. 24, 2020.
Non-Final Office Action for U.S. Appl. No. 16/228,621 dated Sep. 29, 2020.
Non-Final Office Action for U.S. Appl. No. 16/198,784 dated Nov. 19, 2020.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.

(56) References Cited

OTHER PUBLICATIONS

Non-Final Office Action dated Mar. 18, 2021 in U.S. Appl. No. 16/228,601.
Final Office Action dated Mar. 25, 2021 in U.S. Appl. No. 16/200,036.
Non-Final Office Action dated Apr. 7, 2021, in U.S. Appl. No. 16/915,384.
Non-Final Office Action dated Apr. 15, 2021, in U.S. Appl. No. 16/673,184.

* cited by examiner

DISPLAY DEVICE HAVING LIGHT EMITTING STACKED STRUCTURE

CROSS-REFERENCE TO RELATED APPLICATIONS

This application claims the benefit of U.S. Provisional Application No. 62/612,997, filed on Jan. 2, 2018, and U.S. Provisional Application No. 62/613,357, filed Jan. 3, 2018, which are hereby incorporated by reference for all purposes as if fully set forth herein.

BACKGROUND

Field

Exemplary embodiments of the invention relate generally to a light emitting stacked structure and a display including the same and, more specifically, to a micro light emitting diode having a stacked structure and a display device having the same.

Discussion of the Background

As an inorganic light source, light emitting diodes have been used in various technical fields, such as displays, vehicular lamps, general lighting, and the like. With advantages of long lifespan, low power consumption, and high response speed, light emitting diodes have been rapidly replacing existing light sources.

Light emitting diodes have been mainly used as a backlight light source in a display apparatus. However, micro-LED displays have been recently developed as a next generation display that are capable of implanting an image directly using the light emitting diodes.

In general, a display apparatus implements various colors of light by using mixed colors of light of blue, green, and red light. The display apparatus includes pixel each having subpixels that correspond to blue, green, and red colors, and a color of a certain pixel may be determined based on the colors of the sub-pixels therein, and an image can be displayed through combination of the pixels.

In a micro-LED display, micro-LEDs corresponding to each subpixel are arranged on a two-dimensional plane. Therefore, a large number of micro-LEDs are required to be disposed on one substrate. In particular, since different types of micro-LEDs correspond to blue, green, and red subpixels, respectively, micro-LEDs grown on different substrates may be mounted on one display panel.

The micro-LED has a very small size with a surface area of about 10,000 square μm or less, and thus, there are various problems due to this small size. In particular, it is difficult to mount the micro-LEDs on a display panel due to its small size, especially as over hundreds of thousands or millions are required, and it is also difficult to replace a defective micro-LED with a good quality micro-LED.

The above information disclosed in this Background section is only for understanding of the background of the inventive concepts, and, therefore, it may contain information that does not constitute prior art.

SUMMARY

Light emitting stacked structures constructed according to the principles and some exemplary implementations of the invention have a structure that can be manufactured with a simplified method. For example, the pixels according to the exemplary embodiments are capable of being manufactured simultaneously to obviate the process of individually mounting the LEDs.

Light emitting diodes and a display using the light emitting diodes, e.g., micro LEDs, constructed according to the principles and some exemplary implementations of the invention are capable of providing high level of color purity and color reproducibility.

Additional features of the inventive concepts will be set forth in the description which follows, and in part will be apparent from the description, or may be learned by practice of the inventive concepts.

A display device according to an exemplary embodiment includes a plurality of pixel tiles spaced apart from each other, each of the pixel tiles including a substrate, and a plurality of light emitting stacked structures disposed on the substrate, in which a distance between two adjacent light emitting stacked structures in the same pixel tile is substantially equal to a shortest distance between two adjacent light emitting stacked structures of different pixel tiles.

Each of the pixel tiles may have substantially the same shape.

The substrate may have a substantially polygonal shape, and the light emitting stacked structures may be disposed at vertices of the polygonal shape.

The substrate may have substantially a triangular shape, and the light emitting stacked structures may be disposed at vertices of the triangular shape.

The light emitting stacked structures may be arranged substantially regularly along at least one of a first direction and a second direction intersecting the first direction.

The pixel tiles may have different shapes from each other.

The substrate may include a silicon substrate.

The substrate may include a penetrating electrode that penetrates upper and lower surfaces of the substrate and is electrically connected to the light emitting stacked structures.

Each of the light emitting stacked structures may include a plurality of epitaxial sub-units sequentially disposed one over another, emit different colored light, and has overlapping light emitting areas, and at least one of the epitaxial sub-units may have an area different from that of another one of the epitaxial sub-units.

The area of the epitaxial sub-units may gradually decrease along a first direction.

An upper epitaxial sub-unit may completely overlap a lower epitaxial sub-unit.

Light emitted from each epitaxial sub-units may have a different energy band, and the energy band of light may gradually increase along a first direction.

Each of the epitaxial sub-units may be independently drivable.

Light emitted from a lower epitaxial sub-unit may be configured to be emitted to the outside of the display device through an epitaxial sub-unit disposed thereon.

An upper epitaxial stack may be configured to transmit about 80% or more of light emitted from a lower epitaxial stack.

The epitaxial sub-units may include a first epitaxial stack configured to emit a first color light, a second epitaxial stack disposed on the first epitaxial stack to emit a second color light having a wavelength band different from the first color light, and a third epitaxial stack disposed on the second epitaxial stack to emit a third color light having a wavelength band different from the first and second color lights.

The first, second, and third color lights may be red light, green light, and blue light, respectively.

Each of the first, second, and third epitaxial stacks may include a p-type semiconductor layer, an active layer disposed on the p-type semiconductor layer, and an n-type semiconductor layer disposed on the active layer.

The display device may be configured to be driven in at least one of a passive matrix manner and an active matrix manner.

At least one of the light emitting stacked structures may include a micro LED having a surface area less than about 10,000 square µm.

A display apparatus according to an exemplary embodiment includes a support substrate, and a plurality of pixel regions disposed on the support substrate, each of the pixel regions includes a plurality of light emitting stacked structures, each of the light emitting stacked structures including a first epitaxial sub-unit disposed on the support substrate, a second epitaxial sub-unit disposed on the first epitaxial sub-unit, and a third epitaxial sub-unit disposed on the second epitaxial sub-unit, in which light generated from the first epitaxial sub-unit is configured to be emitted to the outside of the display apparatus through the second and third epitaxial sub-units, and light generated from the second epitaxial sub-unit is configured to be emitted to the outside of the display apparatus through the third epitaxial sub-unit.

One of the light emitting stacked structures within each pixel region may be configured to be selected and driven independent of the other light emitting stacked structures within the pixel region.

The first, second, and third epitaxial sub-units of the selected light emitting stacked structure may include a first epitaxial stack, a second epitaxial stack, and a third epitaxial stack configured to emit red light, green light, and blue light, respectively.

The display apparatus may further include data lines and scan lines, in which the first, second, and third epitaxial sub-units of the selected light emitting stacked structure may be commonly connected to the same data line, and connected to different scan lines.

Remaining first, second and third epitaxial sub-units of an unselected light emitting stacked structure within each pixel regions may be connected to the data line and the scan lines, and the remaining first, second and third epitaxial sub-units of the unselected light emitting stacked structure within each pixel regions may be configured to be in an inactive state during operation.

Remaining first, second, and third epitaxial sub-units of an unselected light emitting stacked structure within each pixel region may be disconnected from the data lines and scan lines, respectively.

The plurality of pixel regions may be arranged substantially in a matrix form, the first, second, and third epitaxial sub-units of the selected light emitting stacked structures in the same column may be connected to the same data line, and the first, second, and third epitaxial sub-units of the selected light emitting stacked structures in the same row may be connected to the different scan lines, respectively.

Light emitting stacked structures may be disposed along at least two columns and two rows in each pixel region.

At least one light emitting stacked structure may further include a reflective electrode disposed between the first epitaxial sub-unit and the support substrate, and in ohmic contact with the first epitaxial sub-unit.

The reflective electrode may be commonly electrically connected to the first, second, and third epitaxial sub-units.

The reflective electrode may be disposed over at least two pixel regions.

The reflective electrode may include a data line.

At least one of the light emitting stacked structures may further include an ohmic electrode interposed between the first epitaxial sub-unit and the second epitaxial sub-unit and in ohmic contact with the first epitaxial sub-unit.

At least one of the light emitting stacked structures may further include a second-p transparent electrode in ohmic contact with a p-type semiconductor layer of the second epitaxial sub-unit, and a third-p transparent electrode in ohmic contact with a p-type semiconductor layer of the third epitaxial sub-unit.

The display apparatus may further include a first color filter interposed between the first epitaxial sub-unit and the second epitaxial sub-unit to transmit light generated from the first epitaxial sub-unit and reflect light generated from the second epitaxial sub-unit, and a second color filter interposed between the second epitaxial sub-unit and the third epitaxial sub-unit to transmit light generated from the first and second epitaxial sub-units and reflect light generated from the third epitaxial sub-unit.

Each of the first color filter and the second color filter may include at least one of a low pass filter, a band pass filter, and a band stop filter.

The display apparatus may further include a first bonding layer interposed between the support substrate and the first epitaxial sub-unit, a second bonding layer interposed between the first and second epitaxial sub-units, and a third bonding layer interposed between the second and third epitaxial sub-units, in which the second bonding layer may be configured to transmit light generated from the first epitaxial sub-unit, and the third bonding layer may be configured to transmit light generated from the first and second epitaxial sub-units.

The display apparatus may further include a lower insulation layer covering at least a portion of side surfaces of the first, second, and third epitaxial sub-units.

The lower insulation layer may be configured to block light generated from the first, second, and third epitaxial sub-units.

The light emitting stacked structures in each pixel region may have substantially the same stacking structure.

At least one of the light emitting stacked structures may include a micro LED having a surface area less than about 10,000 square µm.

The first epitaxial sub-unit may be configured to emit any one of red, green, and blue light, the second epitaxial sub-unit may be configured to emit one of red, green, and blue light different from the first epitaxial sub-unit and the third epitaxial sub-unit may be configured to emit one of red, green, and blue light different from the first and second epitaxial sub-units.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
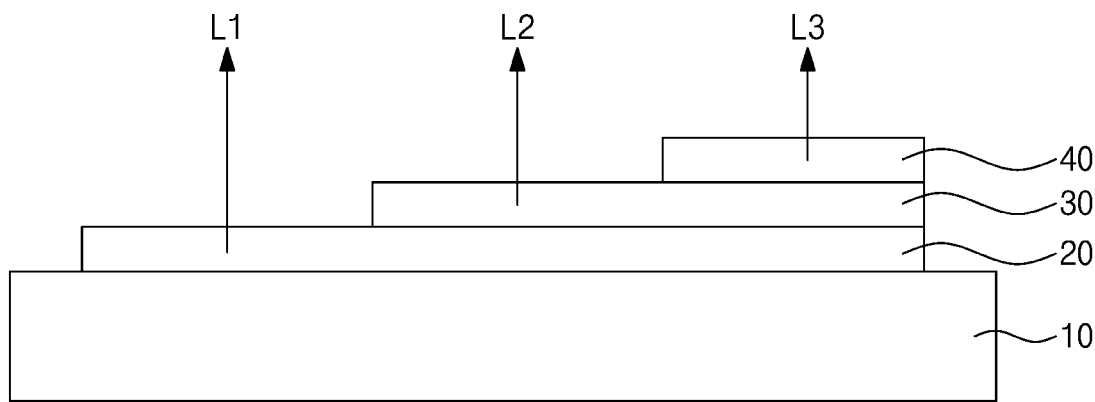
FIG. 1 is a cross-sectional view of a light emitting stacked structure according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The light emitting staked structure constructed according to the principles of the invention may be employed in various devices as a light source. As used herein, a light emitting stacked structure or a light emitting diode according to exemplary embodiments may include a micro LED, which has a surface area less than about 10,000 square µm as known in the art. In other exemplary embodiments, the micro LED's may have a surface area of less than about 4,000 square µm, or less than about 2,500 square µm, depending upon the particular application.

FIG. 1 is a cross-sectional view of a light emitting stacked structure according to an exemplary embodiment.

Referring to FIG. 1, the light emitting stacked structure according to an exemplary embodiment includes a plurality of epitaxial stacks stacked one over another. The epitaxial stacks are disposed on a substrate 10.

The substrate 10 has a substantially plate shape with a front surface and a rear surface. The substrate 10 may have various shapes with a front surface on which the epitaxial stacks are mounted. The substrate 10 may include an insulating material. For example, the substrate 10 may include a glass, a quartz, a silicon, an organic polymer, or an organic-inorganic composite material, without being limited thereto. The material forming the substrate 10 is not particularly limited as long as the substrate has an insulating property. In some exemplary embodiments, a line part may be further disposed on the substrate 10 to apply a light emitting signal and a common voltage to each of the epitaxial stacks. In an exemplary embodiment, a driving device including a thin film transistor may be further disposed on the substrate 10 in addition to the line part to drive each of the epitaxial stack in an active matrix method. To this end, the substrate 10 may be provided as a printed circuit board or a composite substrate, which may be formed by forming the line part and/or the driving device on the glass, quartz, silicon, organic polymer, or organic-inorganic composite material.

The epitaxial stacks are sequentially stacked on the front surface of the substrate 10, and each epitaxial stack may emit light.

Two or more epitaxial stacks may be disposed on the substrate 10 to emit light having different wavelength bands from each other. However, the inventive concepts are not limited to a particular number of epitaxial stacks, and the epitaxial stacks may have different energy bands from each other.

Each of the epitaxial stacks may have various sizes. In an exemplary embodiment, at least one of the epitaxial stacks may have an area different from the other epitaxial stacks.

When the epitaxial stacks are sequentially stacked in an upward direction from a lower portion, the area of the epitaxial stacks may become smaller in the upward direction. Among two adjacent epitaxial stacks, at least a portion of the upper epitaxial stack may overlap the lower epitaxial stack. In some exemplary embodiments, the upper epitaxial stack may completely overlap with the lower epitaxial stack, and in this case, the upper epitaxial stack may be disposed within an area of the lower epitaxial stack in a plan view.

The light emitting stacked structure according to an exemplary embodiment includes three epitaxial stacks sequentially stacked on the substrate 10, as shown in FIG. 1. Hereinafter, the three layers sequentially stacked on the substrate 10 will be referred to as first, second, and third epitaxial stacks 20, 30, and 40, respectively.

The first, second, and third epitaxial stacks 20, 30, and 40 may have different sizes from each other. More particularly, the first, second, and third epitaxial stacks 20, 30, and 40 may have different areas from each other in a plan view, and/or have different widths from each other in a cross-sectional view. In an exemplary embodiment, the area of the first, second, and third epitaxial stacks 20, 30, and 40 may be gradually decreased in the order of the first epitaxial stack 20, the second epitaxial stack 30, and the third epitaxial stack 40. The second epitaxial stack 30 is stacked on a portion of the first epitaxial stack 20. Accordingly, the portion of the first epitaxial stack 20 is covered by the second epitaxial stack 30, and the other portion of the first epitaxial stack 20 is exposed in a plan view. The third epitaxial stack 40 is stacked on a portion of the second epitaxial stack 30. Accordingly, the portion of the second epitaxial stack 30 is covered by the third epitaxial stack 40, and the other portion of the second epitaxial stack 30 is exposed in a plan view.

The area of the first, second, and third epitaxial stacks 20, 30, and 40 may be changed in various ways. For example, an area ratio of the first, second, and third epitaxial stacks 20, 30, and 40 may be about 3:2:1, without being limited thereto. Each of the first, second, and third epitaxial stacks 20, 30, and 40 may have different areas in consideration of an amount of light from each epitaxial stack. For example, when the amount of light emitted from the third epitaxial stack 40 is small, the area ratio of the third epitaxial stack 40 may be relatively increased.

Each of the epitaxial stacks may emit a color light in a visible light band. In an exemplary embodiment, light emitted from the lowermost epitaxial stack may have a color having the longest wavelength with the lowest energy band, and the wavelength of the color light emitted from the epitaxial stacks may become shorter in an upward direction. As such, light emitted from the uppermost epitaxial stack may have a color having the shortest wavelength with the highest energy band. For example, the first epitaxial stack 20 emits a first color light L1, the second epitaxial stack 30 emits a second color light L2, and the third epitaxial stack 40 emits a third color light L3. The first, second, and third color lights L1, L2, and L3 may have different colors and different wavelength bands. In particular, the first, second, and third color lights L1, L2, and L3 may have different wavelength bands from each other, and in an exemplary embodiment, wavelength bands may become higher from the first color light L1 to the third color light L3.

In an exemplary embodiment, the first color light L1 may be a red light, the second color light L2 may be a green light, and the third color light L3 may be a blue light. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first epitaxial stack 20 may emit any one of red, green, and blue light, and the second and third epitaxial stacks 30 and 40 may emit a different one of red, green, and blue light, without adversely affecting operation, due to the small form factor of a micro LED.

Each epitaxial stack may emit light in a direction facing away the substrate 10. In this case, light emitted from one epitaxial stack may be emitted to the outside directly or through another epitaxial stack disposed thereon along an optical path of light. As used herein, the direction facing away the front surface of the substrate 10 may correspond to a direction to which the first, second, and third epitaxial stacks 20, 30, and 40 are stacked. Hereinafter, the direction facing away the front surface of the substrate 10 will be referred to as a "front surface direction" or an "upward direction", and a direction facing the substrate 10 faces will be referred to as a "rear surface direction" or a "downward direction". However, the terms "upward" and "downward" may be relative terms that may vary depending on an arrangement or a stacked direction of the light emitting stacked structure.

Each epitaxial stack emits the light in the upward direction. Light emitted from each epitaxial stack may directly travel in the upward direction or through another epitaxial stack disposed thereon. In an exemplary embodiment, a portion of light emitted from the first epitaxial stack 20 directly travels in the upward direction through the exposed upper surface thereof, another portion of light emitted from the first epitaxial stack 20 travels in the upward direction after passing through the second epitaxial stack 30, and the other portion of light emitted from the first epitaxial stack 20 travels in the upward direction after passing through the second and third epitaxial stacks 30 and 40. In addition, a portion of light emitted from the second epitaxial stack 30 directly travels in the upward direction through the exposed upper surface thereof, and the other portion of light emitted from the second epitaxial stack 30 travels in the upward direction after passing through the third epitaxial stack 40. The light emitted from the third epitaxial stack 40 directly travels in the upward direction.

In an exemplary embodiment, each epitaxial stack transmits most of light emitted from the epitaxial stack disposed thereunder. In particular, the portion of light emitted from the first epitaxial stack 20 travels in the front surface direction after passing through the second epitaxial stack 30 and the third epitaxial stack 40, and the portion of light emitted from the second epitaxial stack 30 travels in the front surface direction after passing through the third epitaxial stack 40. To this end, at least a portion, or substantially the entire portion of other epitaxial stacks except for the lowermost epitaxial stack disposed may be formed of a light transmitting material. As used herein, the term "light transmitting material" may refer to a material that transmits all light, or that transmits light having a predetermined wavelength or a portion of light having a predetermined wavelength. In an exemplary embodiment, each epitaxial stack may transmit about 60% or more of light emitted from the epitaxial stack disposed thereunder. According to other exemplary embodiments, each epitaxial stack may transmit about 80% or more, or about 90% or more of light emitted from the epitaxial stack disposed thereunder.

The epitaxial stacks may be independently driven by independently connecting signal lines that respectively apply light emitting signals to the epitaxial stacks, and may display various colors depending whether light is emitted from each epitaxial stack. In addition, since the epitaxial stacks that emit light having difference wavelengths are formed to overlap each other, the light emitting stacked structure may be formed in a narrow area.

Figure 2:
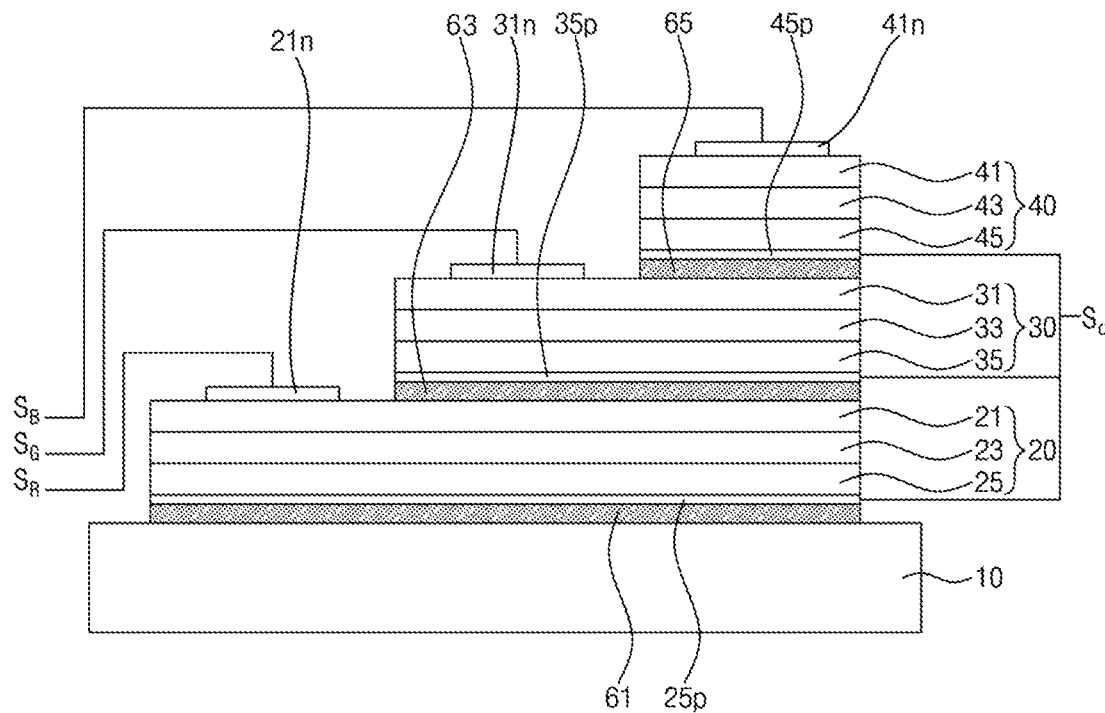
FIG. 2 is a cross-sectional view of a light emitting stacked structure according to an exemplary embodiment.

FIG. 2 is a cross-sectional view of a light emitting stacked structure according to an exemplary embodiment.

Referring to FIG. 2, in the light emitting stacked structure according to an exemplary embodiment may include a line part by which each epitaxial stack may be independently driven. Each of the first, second, and third epitaxial stacks 20, 30, and 40 may be disposed on the substrate 10 with corresponding first, second, and third adhesive layers 61, 63, and 65 interposed therebetween. The first adhesive layer 61 may include a conductive or non-conductive material. In some exemplary embodiments, the first adhesive layer 61 may have a conductivity in some areas thereof to be electrically connected to the substrate 10 disposed thereunder. The first adhesive layer 61 may include a transparent or non-transparent material. In an exemplary embodiment, when the substrate 10 includes a non-transparent material and the line part is formed on the substrate 10, the first adhesive layer 61 may include the non-transparent material, for example, a light absorbing material, such as various polymer adhesives, for example, an epoxy-based polymer adhesive.

The second and third adhesive layers 63 and 65 may include a non-conductive material, and may include a light transmitting material. For example, the second and third adhesive layers 63 and 65 may include an optically clear adhesive (OCA). The material forming the second and third adhesive layers 63 and 65 is not particularly limited as long as the material is optically clear and is capable of stably attaching each epitaxial stack. For example, the second and third adhesive layers 63 and 65 may include an organic material, such as an epoxy-based polymer like SU-8, various resists, parylene, poly(methyl methacrylate) (PMMA), benzocyclobutene (BCB), and spin on glass (SOG) and an inorganic material, such as silicon oxide and aluminum oxide. In some exemplary embodiments, the adhesive material may include a conductive oxide. In this case, the conductive oxide may be insulated from other components. When an organic material is used as the adhesive layer, the first, second, and third epitaxial stacks 20, 30, and 40 and the substrate 10 are attached to each other by coating the material on an adhesive side of the first, second and third epitaxial stacks 20, 30, and 40 and the substrate 10, and applying high temperature and high pressure to the material under high vacuum state. When the inorganic material is used as the adhesive layer, the first, second, and third epitaxial stacks 20, 30, and 40 and the substrate 10 are attached to each other by depositing the inorganic material on the adhesive side of the first, second, and third epitaxial stacks 20, 30, and 40 and the substrate 10, planarizing the inorganic material using a chemical-mechanical planarization (CMP), and performing a plasma treatment on a surface of the inorganic material and attaching under high vacuum state.

Each of the first, second, and third epitaxial stacks 20, 30, and 40 includes p-type semiconductor layers 25, 35, and 45, active layers 23, 33, and 43, and n-type semiconductor layers 21, 31, and 41, respectively.

The p-type semiconductor layer 25, the active layer 23, and the n-type semiconductor layer 21 of the first epitaxial stack 20 may include a semiconductor material that may emit red light, for example, such as aluminum gallium arsenide (AlGaAs), gallium arsenide phosphide (GaAsP), aluminum gallium indium phosphide (AlGaInP), and gallium phosphide (GaP), without being limited thereto.

A first p-type contact electrode layer 25p may be disposed under the p-type semiconductor layer 25 of the first epitaxial stack 20. The first p-type contact electrode layer 25p of the first epitaxial stack 20 may have a single-layer structure or a multi-layer structure of a metal material. For example, the first p-type contact electrode layer 25p may include metal, such as Al, Ti, Cr, Ni, Au, Ag, Sn, W, Cu, or an alloy thereof. The first p-type contact electrode layer 25p may include metal having high reflectance to improve light emission efficiency of light emitted from the first epitaxial stack 20 in the upward direction.

A first n-type contact electrode 21n may be disposed on the n-type semiconductor layer of the first epitaxial stack 20. The first n-type contact electrode 21n of the first epitaxial stack 20 may have a single-layer structure or a multi-layer structure of a metal material. For example, the first n-type contact electrode 21n may include metal, such as Al, Ti, Cr, Ni, Au, Ag, Sn, W, Cu, or an alloy thereof, without being limited thereto, or other conductive materials.

The second epitaxial stack 30 includes the p-type semiconductor layer 35, the active layer 33, and the n-type semiconductor layer 31, which are sequentially stacked. The p-type semiconductor layer 35, the active layer 33, and the n-type semiconductor layer 31 may include a semiconductor material that may emit green light, for example, such as indium gallium nitride (InGaN), gallium nitride (GaN), gallium phosphide (GaP), aluminum gallium indium phosphide (AlGaInP), and aluminum gallium phosphide (AlGaP), without being limited thereto.

A second p-type contact electrode layer 35p is disposed under the p-type semiconductor layer 35 of the second epitaxial stack 30. The second p-type contact electrode layer 35p is disposed between the first epitaxial stack 20 and the second epitaxial stack 30, in more detail, between the second adhesive layer 63 and the second epitaxial stack 30.

A second n-type contact electrode 31n may be disposed on the n-type semiconductor layer of the second epitaxial stack 30. The second n-type contact electrode 31n of the second epitaxial stack 30 may have a single-layer structure or a multi-layer structure of a metal material. For example, the second n-type contact electrode 31n may include metal, such as Al, Ti, Cr, Ni, Au, Ag, Sn, W, Cu, or an alloy thereof, or other conductive materials.

The third epitaxial stack 40 includes the p-type semiconductor layer 45, the active layer 43, and the n-type semiconductor layer 41, which are sequentially stacked. The p-type semiconductor layer 45, the active layer 43, and the n-type semiconductor layer 41 may include a semiconductor material that may emit blue light, for example, such as gallium nitride (GaN), Indium gallium nitride (InGaN), and zinc selenide (ZnSe), without being limited thereto.

A third p-type contact electrode layer 45p is disposed under the p-type semiconductor layer 45 of the third epitaxial stack 40. The third p-type contact electrode layer 45p is disposed between the second epitaxial stack 30 and the third epitaxial stack 40, in more detail, between the third adhesive layer 65 and the third epitaxial stack 40.

A third n-type contact electrode 41n may be disposed on the n-type semiconductor layer of the third epitaxial stack 40. The third n-type contact electrode 41n of the third epitaxial stack 40 may have a single-layer structure or a multi-layer structure of a metal material. For example, the third n-type contact electrode 41n may include metal, such as Al, Ti, Cr, Ni, Au, Ag, Sn, W, Cu, or an alloy thereof, or other conductive materials.

In an exemplary embodiment, each of the n-type semiconductor layers 21, 31, and 41 and each of the p-type semiconductor layers 25, 35, and 45 of the first, second, and third epitaxial stacks 20, 30, and 40 has a single-layer structure. However, the inventive concepts are not limited thereto and the semiconductor layers may have a multi-layer structure and may include a superlattice layer. The active layers 23, 33, and 43 of the first, second, and third epitaxial stacks 20, 30, and 40 may have a single quantum well structure or a multiple quantum well structure.

The second p-type contact electrode layer 35p may have an area that substantially covers the second epitaxial stack 30. In addition, the third p-type contact electrode layer 45p may have an area that substantially covers the third epitaxial stack 40. The second and third p-type contact electrode layers 35p and 45p may include a transparent conductive material to transmit light from the epitaxial stack disposed thereunder. For example, each of the second and third p-type contact electrode layers 35p and 45p may include the transparent conductive oxide (TCO). The transparent conductive oxide may include tin oxide (SnO), indium oxide (InO$_2$), zinc oxide (ZnO), indium tin oxide (ITO), and indium tin zinc oxide (ITZO). The transparent conductive oxide may be deposited by a chemical vapor deposition (CVD) or a physical vapor deposition (PVD) using an evaporator or a sputter. The second and third p-type contact electrode layers 35$p$ and 45$p$ may have a thickness of about 2000 angstroms to about 2 micrometers, that may function as an etch stopper during manufacturing process described below and that satisfies a predetermined transmittance.

In an exemplary embodiment, the first, second, and third p-type contact electrode layers 25$p$, 35$p$, and 45$p$ may be connected to a common line. The common line is a line to which the common voltage is applied. In addition, light emitting signal lines may be respectively connected to the first, second, and third n-type contact electrodes 21$n$, 31$n$, and 41$n$. In particular, the common voltage Sc is applied to the first p-type contact electrode layer 25$p$, the second p-type contact electrode layer 35$p$, and the third p-type contact electrode layer 45$p$ through the common line, and the light emitting signal is applied to the first, second, and third n-type contact electrodes 21$n$, 31$n$, and 41$n$ through the light emitting signal lines. In this manner, the first, second, and third epitaxial stacks 20, 30, and 40 are independently controlled. The light emitting signal includes first, second, and third light emitting signals $S_R$, $S_G$, and $S_B$ respectively corresponding to the first, second, and third epitaxial stacks 20, 30, and 40. The first, second, and third light emitting signals $S_R$, $S_G$, and $S_B$ may be signals corresponding to the light emissions of red light, green light, and blue light, respectively.

In the illustrated exemplary embodiment, the common voltage is applied to the p-type semiconductor layers 25, 35, and 45 of the first, second, and third epitaxial stacks 20, 30, and 40, and the light emitting signal is applied to the n-type semiconductor layers 21, 31, and 41 of the first, second, and third epitaxial stacks 20, 30, and 40. However, the inventive concepts are not limited thereto. According to another exemplary embodiment, the common voltage may be applied to the n-type semiconductor layers 21, 31, and 41 of the first, second, and third epitaxial stacks 20, 30, and 40, and the light emitting signal may be applied to the p-type semiconductor layers 25, 35, and 45 of the first, second, and third epitaxial stacks 20, 30, and 40.

According to the illustrated exemplary embodiment, the first, second, and third epitaxial stacks 20, 30, and 40 are driven in response to the light emitting signal applied thereto. In particular, the first epitaxial stack 20 is driven in response to the first light emitting signal $S_R$, the second epitaxial stack 30 is driven in response to the second light emitting signal $S_G$, and the third epitaxial stack 40 is driven in response to the third light emitting signal $S_B$. In this case, the first, second and third light emitting signals $S_R$, $S_G$, and $S_B$ are independently applied to the first, second, and third epitaxial stacks 20, 30, and 40, and as such, the first, second, and third epitaxial stacks 20, 30, and 40 are independently driven. The light emitting stacked structure may provide light of various colors by a combination of the first, second, and third color lights emitted from the first, second, and third epitaxial stacks 20, 30, and 40 to the upward direction.

The light emitting stacked structure according to an exemplary embodiment may improve light extraction efficiency as compared to a structure that has the plural epitaxial stacks completely overlap with each other. For example, the amount of light emitted from the first, second, and third epitaxial stacks 20, 30, and 40 and traveling in the upper direction without passing through other epitaxial stacks may be increased, thereby increasing the light extraction efficiency.

In addition, when displaying the colors, the light emitting stacked structure according to an exemplary embodiment emits light having different color through vertically overlapping areas rather than horizontally spaced apart areas. More particularly, conventional light emitting elements that emit different color lights, e.g., red, green, and blue lights, are spaced apart from each other on a plane to implement a full color display. As such, an area occupied by the conventional light emitting elements is relatively large since the light emitting elements are horizontally spaced apart from each other. On the other hand, the light emitting elements according to an exemplary embodiment that emit the different color lights are stacked one over another in substantially the same area, and thus the full color display may be implemented through an area that is significantly smaller than that in the conventional art. Therefore, a high-resolution display device may be manufactured in a small area.

Further, even when a conventional light emitting device were to be manufactured in a stacked manner, such conventional light emitting device would be manufactured by individually forming a contact part in each light emitting element, e.g., by forming light emitting elements individually and separately, and connecting the light emitting elements to each other with a wiring, which would increase the structural complexity of the light emitting device, and thus, increasing manufacturing complexity of the light emitting device. However, the light emitting stacked structure according to an exemplary embodiment may be is manufactured by sequentially stacking plural epitaxial stacks on one substrate, forming the contact part in the epitaxial stacks through a minimal process, and connecting the line part to the epitaxial stacks. In addition, since one light emitting stacked structure is mounted rather than the plural conventional light emitting elements, the manufacturing method of the display device according to an exemplary embodiment may be significantly simplified.

The light emitting stacked structure according an exemplary embodiment may further include various components to provide the color lights with high purity and high efficiency. For example, the light emitting stacked structure may include a wavelength pass filter to prevent light having a relatively short wavelength from traveling towards the epitaxial stack emitting light having a relatively long wavelength.

Figure 3:
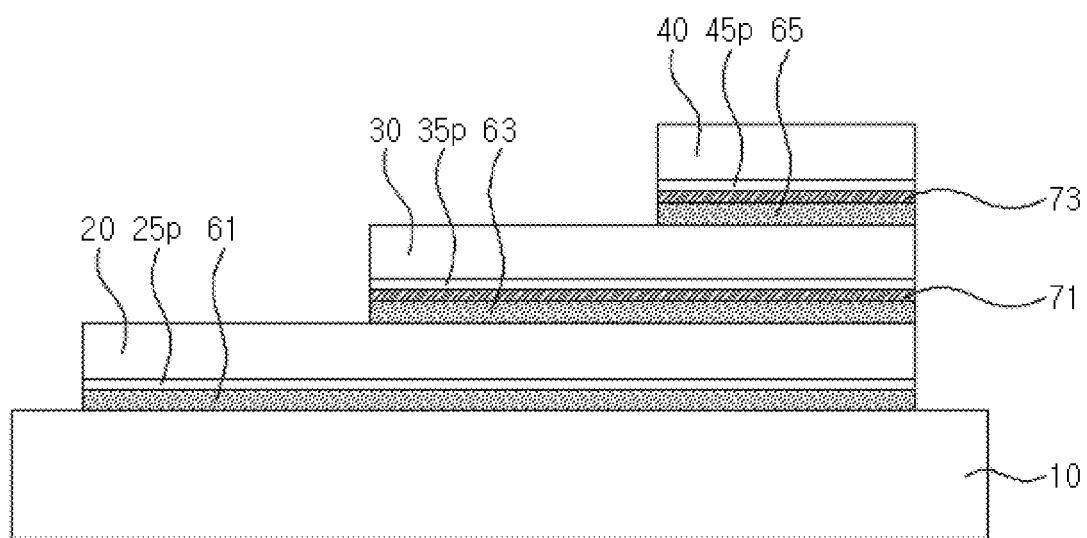
FIG. 3 is a cross-sectional view of a light emitting stacked structure according to an exemplary embodiment.

FIG. 3 is a cross-sectional of a light emitting stacked structure according to an exemplary embodiment. The light emitting stacked structure according to the illustrated exemplary embodiment includes substantially the same components described above, and thus, detailed descriptions thereof will be omitted to avoid redundancy.

Referring to FIG. 3, the light emitting stacked structure according an exemplary embodiment may include a first wavelength pass filter 71 disposed between the first epitaxial stack 20 and the second epitaxial stack 30.

The first wavelength pass filter 71 selectively transmits light having a predetermined wavelength. The first wavelength pass filter 71 may transmit the first color light emitted from the first epitaxial stack 20 and may block or reflect light other than the first color light. Accordingly, the first color light emitted from the first epitaxial stack 20 may travel in the upward direction, but the second and third color lights respectively emitted from the second and third epitaxial stacks 30 and 40 may not travel toward the first epitaxial stack 20 and may be reflected or blocked by the first wavelength pass filter 71.

The second and third color lights have the relatively shorter wavelength and the relatively higher energy than those of the first color light. When the second and third color lights are incident into the first epitaxial stack 20, an additional light emission may be induced in the first epitaxial stack 20. According to an exemplary embodiment, the second and third color lights may be prevented from being incident into the first epitaxial stack 20 by the first wavelength pass filter 71.

According to an exemplary embodiment, a second wavelength pass filter 73 may be disposed between the second epitaxial stack 30 and the third epitaxial stack 40. The second wavelength pass filter 73 may transmit the first and second color lights respectively emitted from the first and second epitaxial stacks 20 and 30, and may block or reflect light other than the first and second color lights. Accordingly, the first and second color lights respectively emitted from the first and second epitaxial stacks 20 and 30 may travel in the upward direction, but the third color light emitted from the third epitaxial stack 40 may not travel toward the first and second epitaxial stacks 20 and 30 and may be reflected or blocked by the second wavelength pass filter 73.

The third color light has a relatively shorter wavelength and a relatively higher energy than those of the first and second color lights. When the third color light is incident into the first and second epitaxial stacks 20 and 30, an additional light emission may be induced in the first and second epitaxial stacks 20 and 30. According to an exemplary embodiment, the third color light may be prevented from being incident into the first and second epitaxial stacks 20 and 30 by the second wavelength pass filter 73.

The first and second wavelength pass filters 71 and 73 may be formed in various ways. The first and second wavelength pass filters 71 and 73 may be formed by alternately stacking insulating layers having different refractive indices from each other. For example, silicon dioxide ($SiO_2$) and titanium dioxide ($TiO_2$) may be alternately stacked over each other, and a wavelength of light may be determined by adjusting the thickness and the number of stacked layers of the silicon dioxide ($SiO_2$) and the titanium dioxide ($TiO_2$). In some exemplary embodiments, $SiO_2$, $TiO_2$, $HfO_2$, $Nb_2O_5$, $ZrO_2$, and $Ta_2O_5$ may be used as insulating layers having different refractive indices.

The light emitting stacked structure according to an exemplary embodiment may further include various components to provide high efficiency uniform light. For example, various concave-convex portions may be formed on a light emitting surface. More particularly, a concave-convex portions may be formed on the n-type semiconductor layer of at least one of the first, second, and third epitaxial stacks 20, 30, and 40.

In an exemplary embodiment, a concave-convex portion of each epitaxial stack may be selectively formed. For example, the concave-convex portion may be disposed on the first epitaxial stack 20, the concave-convex portion may be disposed on the first and third epitaxial stacks 20 and 40, or the concave-convex portion may be disposed on the first, second, and third epitaxial stacks 20, 30, and 40. The concave-convex portion of each epitaxial stack may be disposed on the n-type semiconductor layers, respectively, which may correspond to the light emitting surfaces of the first, second, and third epitaxial stacks 20, 30, and 40.

The concave-convex portion may improve light emitting efficiency. The concavo-convex portion may have various shapes, such as a polygonal pyramid, a hemisphere, or a surface having a roughness, on which concavo-convex portions are randomly arranged. The concave-convex portion may be textured through various etching processes or may be formed using a patterned sapphire substrate.

The first, second, and third color lights from the first, second, and third epitaxial stacks 20, 30, and 40 may have a difference in intensity, and the intensity difference may cause a difference in visibility. According to an exemplary embodiment, the light emitting efficiency may be improved by the concave-convex portion selectively formed on the light emitting surfaces of the first, second, and third epitaxial stacks 20, 30, and 40, and thus, the difference in visibility between the first, second, and third color lights may be reduced. For example, the color light corresponding to the red and/or blue colors may have lower visibility than green color, and thus, the difference in visibility may be reduced by texturing the first epitaxial stack 20 and/or the third epitaxial stack 40. In particular, the red color light has a relatively smaller intensity because the red color light may be emitted from the lowermost portion of the light emitting stacked structure. In this case, when the concave-convex portion is formed on the first epitaxial stack 20, the light efficiency may be improved.

The light emitting stacked structure according to the exemplary embodiments may be used as a light emitting element capable of displaying various colors, and may be employed in a display device as a pixel.

Figure 4:
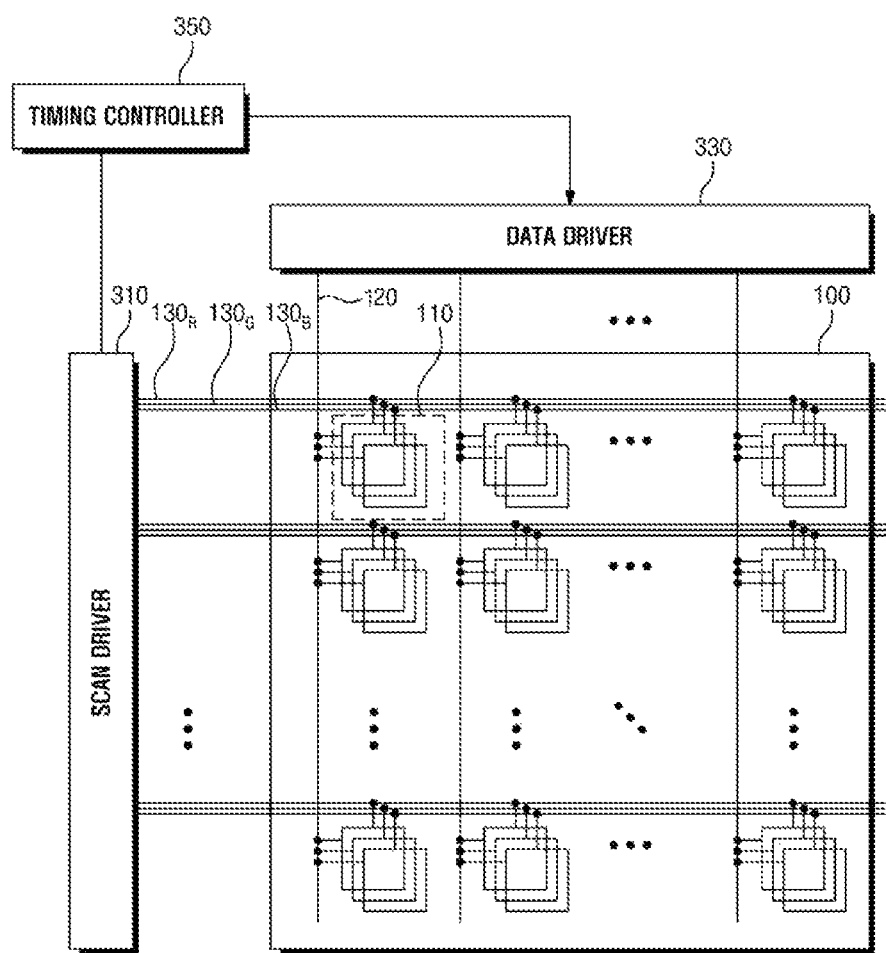
FIG. 4 is a block diagram of a display device according to an exemplary embodiment.

FIG. 4 is a block diagram of a display device according to an exemplary embodiment.

Referring to FIG. 4, the display device according to an exemplary embodiment may display arbitrary visual information, such as a text, a video, a photograph, and a 2- or 3-dimensional image.

The display device includes a plurality of pixels 110 that may display an image. Each pixel 110 may be a minimum unit displaying the image. Each pixel 110 may include the light emitting stacked structure according to an exemplary embodiment, and may emit white light and/or a color light.

In an exemplary embodiment, each pixel 110 includes a first pixel emitting the red color light, a second pixel emitting the green color light, and a third pixel emitting the blue color light. The first, second, and third pixels may respectively correspond to the first, second, and third epitaxial stacks of the light emitting stacked structure described above.

The pixels 110 may be arranged in a matrix form. As used herein, the pixels 110 being arranged "in the matrix form" may refer to the pixels 110 arranged exactly in line along rows or columns, as well as the pixels 110 arranged substantially along the rows or columns as a whole while the locations of the pixels 110 being changed, e.g., a zigzag form.

The display device 100 according to an exemplary embodiment includes a timing controller 350, a scan driver 310, a data driver 330, a line part, and the pixels. Each of the pixels is individually connected to the scan driver 310 and the data driver 330 through the line part.

The timing controller 350 receives various control signals and image data for driving the display device 100 from an external source (e.g., a system that transmits the image data). The timing controller 350 may rearrange the received image data and apply the rearranged image data to the data driver 330. In addition, the timing controller 350 may generate scan control signals and data control signals for driving the scan driver 310 and the data driver 330, and apply the generated scan control signals and the data control signals to the scan driver 310 and the data driver 330, respectively.

The scan driver 310 receives the scan control signals from the timing controller 350 and may generate scan signals in response to the scan control signals.

The data driver 330 receives the data control signals and the image data from the timing controller 350 and may generate data signals in response to the data control signals.

The line part includes a plurality of signal lines. For example, the line part includes scan lines $130_B$, $130_G$, and $130_B$ (hereinafter, collectively referred to as the scan lines 130) that connect the scan driver 310 to the pixels, and data lines 120 that connect the data driver 330 and the pixels. The scan lines 130 may be connected to the pixels, respectively, and the scan lines respectively connected to the pixels are shown as first, second and third scan lines $130_R$, $130_G$, and $130_B$.

The line part may further include lines that connect the timing controller 350 and the scan driver 310, the timing controller 350 and the data driver 330, or other components to each other to transmit corresponding signals.

The scan lines 130 apply the scan signals generated by the scan driver 310 to the pixels. The data signals generated by the data driver 330 are applied to the data lines 120.

The pixels are connected to the scan lines 130 and the data lines 120. The pixels selectively emit light in response to the data signals provided from the data lines 120 when the scan signals from the scan lines 130 are applied thereto. For example, each of the pixels emits light with a brightness corresponding to the data signal applied thereto during each frame period. When the data signals corresponding to a black brightness are applied to the pixels, the pixels may not emit the light during corresponding frame period, and thus displaying a black color.

In some exemplary embodiments, the pixels may be driven in a passive or active matrix manner. When the display device is driven in the active matrix manner, the display device 100 may be additionally supplied with first and second pixel power sources in addition to the scan signals and the data signals.

Figure 5:
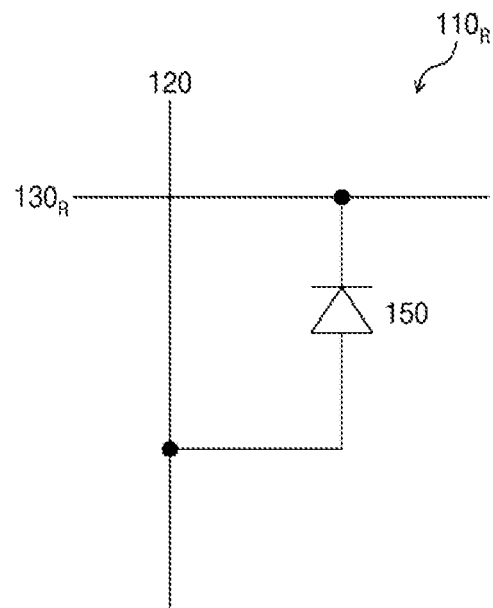
FIG. 5 is a circuit diagram of one pixel of a passive matrix type display device according to an exemplary embodiment.

FIG. 5 is a circuit diagram of one pixel of a passive matrix type display device. The pixel may be one of the pixels, e.g., the red pixel, the green pixel, and the blue pixel, and FIG. 5 shows the first pixel $110_R$ as an example. The second and third pixels may be driven in substantially the same manner as the first pixel, and thus, detailed descriptions thereof will be omitted.

Referring to FIG. 5, the first pixel $110_R$ includes a light emitting element 150 connected between the first scan line $130_R$ and the data line 120. The light emitting element 150 may correspond to the first epitaxial stack 20. When a voltage equal to or greater than a threshold voltage is applied to between the p-type semiconductor layer and the n-type semiconductor layer, the first epitaxial stack 20 emits light with the brightness corresponding to a level of the voltage applied thereto. In particular, the light emission of the first pixel $110_R$ may be controlled by controlling a voltage of the scan signal applied to the first scan line $130_R$ and/or a voltage of the data signal applied to the data line 120.

Figure 6:
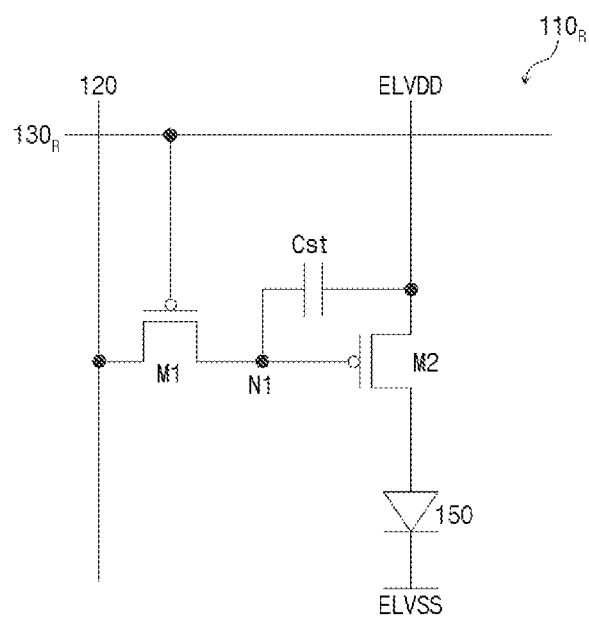
FIG. 6 is a circuit diagram of one pixel of an active matrix type display device according to an exemplary embodiment.

FIG. 6 is a circuit diagram of one pixel of an active matrix type display device according to an exemplary embodiment.

When the display device is the active matrix type display device, the first pixel $110_R$ may be further supplied with first and second pixel power sources ELVDD and ELVSS in addition to the scan signals and the data signals.

Referring to FIG. 6, the first pixel $110_R$ includes one or more light emitting elements 150 and a transistor part connected to the light emitting element 150.

The light emitting element 150 may correspond to the first epitaxial stack 20, the p-type semiconductor layer of the light emitting element 150 may be connected to the first pixel power source ELVDD via the transistor part, and the n-type semiconductor layer of the light emitting element 150 may be connected to the second pixel power source ELVSS. The first pixel power source ELVDD and the second pixel power source ELVSS may have different electric potentials from each other. For example, the second pixel power source ELVSS may have the electric potential lower than the electric potential of the first pixel power source ELVDD by at least the threshold voltage of the light emitting element. Each of the light emitting elements emits light with the brightness corresponding to a driving current controlled by the transistor part.

According to an exemplary embodiment, the transistor part includes first and second transistors M1 and M2 and a storage capacitor Cst. However, the inventive concepts are not limited to particular configuration of the transistor part, and the transistor part may have various modified.

The first transistor M1 (switching transistor) includes a source electrode connected to the data line 120, a drain electrode connected to a first node N1, and a gate electrode connected to the first scan line $130_R$. The first transistor M1 is turned on to electrically connect the data line 120 and the first node N1 when the scan signal having the voltage sufficient to turn on the first transistor M1 is provided through the first scan line $130_R$. In this case, the data signal of the corresponding frame is applied to the data line 120, and the data signal is applied to the first node N1. The storage capacitor Cst is charged with the data signal applied to the first node N1.

The second transistor M2 (driving transistor) includes a source electrode connected to the first pixel power source ELVDD, a drain electrode connected to the p-type semiconductor layer of the light emitting element 150, and a gate electrode connected to the first node N1. The second transistor M2 may control an amount of the driving current supplied to the light emitting element 150 in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1 and maintains the charged voltage until a data signal of a next frame is provided.

The transistor part in FIG. 6 includes two transistors, however, the inventive concepts are not limited to the number of transistors included in the transistor part, and the configuration of the transistor part may be changed in various ways. For example, the transistor part may include more than two transistors and more than one capacitor. In addition, configurations of the first and second transistors, the storage capacitor, and the lines are not shown in detail, however, the first and second transistors, the storage capacitor, and the lines may be provided in various ways within the scope of implementing the circuit according to an exemplary embodiment.

The structure of the pixel may be changed in various ways within the scope of the inventive concepts, and the display device including the pixels may be implemented in various structures and methods.

Figure 7:
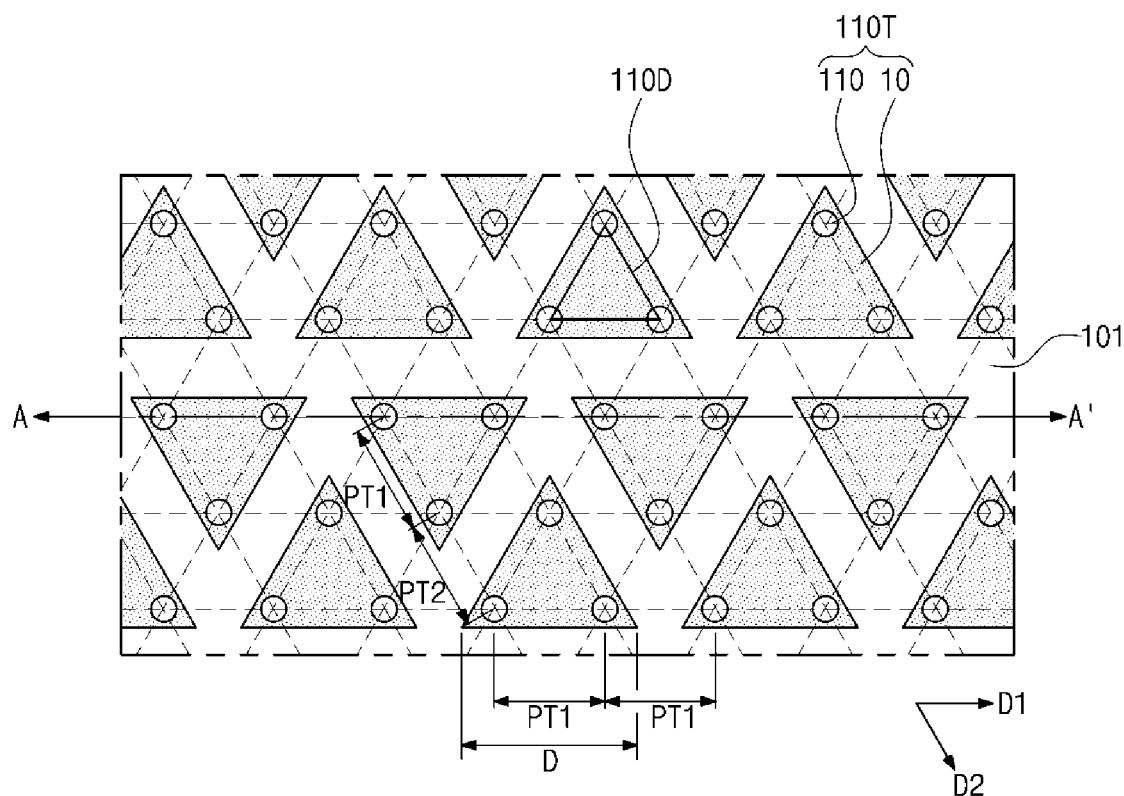
FIG. 7 is a plan view showing a portion of a display device according to an exemplary embodiment.
Figure 8A:
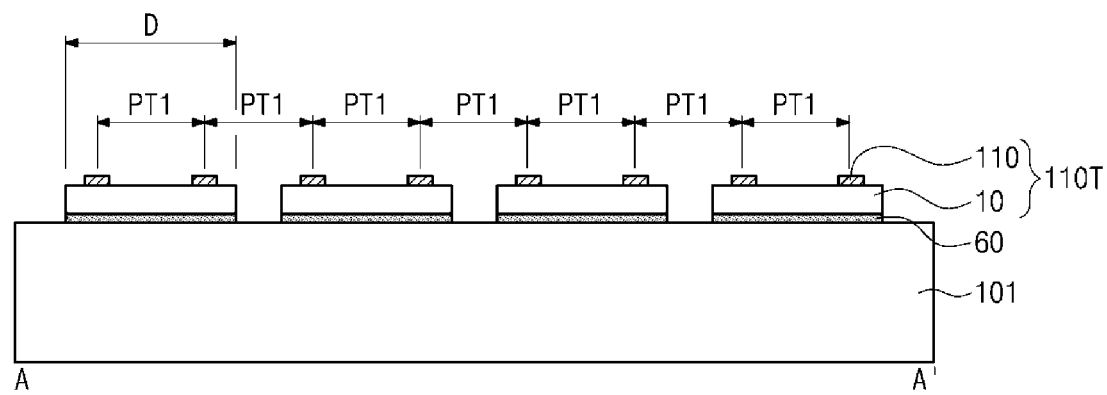
FIG. 8A is a cross-sectional view taken along line A-A' of FIG. 7 according to an exemplary embodiment.

FIG. 7 is a plan view of a portion of a display device according to an exemplary embodiment. FIG. 8A is a cross-sectional view taken along a line A-A' of FIG. 7 according to an exemplary embodiment.

Referring to FIGS. 7 and 8A, the display device according to an exemplary embodiment includes a base substrate 101 and a plurality of pixel tiles 110T disposed on the base substrate 101.

The base substrate 101 includes a line part and/or a driving device, which is electrically connected to the pixel tiles 110T disposed on its upper surface, and may include various materials. For example, the base substrate 101 may include a glass, quartz, silicon, organic polymer, or organic-inorganic composite material, and in some exemplary embodiments, the base substrate 101 may be a printed circuit board. The line part and/or the driving device disposed on the base substrate 101 may include a conductive material.

An adhesive layer 60 may be disposed between the base substrate 101 and the pixel tiles 110T. At least a portion of the adhesive layer 60 may have a conductivity, and the line part and/or the driving device of the base substrate 101 may be connected to a line part or an electrode of the pixel tiles 110T through the conductive portion of the adhesive layer 60. In an exemplary embodiment, a solder may be used as the adhesive layer having the conductivity, however, the inventive concepts are not limited thereto. For example, a portion of the adhesive layer may include a non-conductive material. The adhesive layer may include a transparent or non-transparent material.

Each pixel tile 110T includes a substrate 10 and a plurality of pixels 110 disposed on the substrate 10. The pixels 110 disposed on the same pixel tile 110T may be manufactured together through a common process, and the pixel tile 110T may correspond to a unit that is capable of being transferred or assembled as a single object during manufacture of the display device.

The pixels 110 of the pixel tiles 110T are connected to the line part and/or driving device of the base substrate 101, such that the light emission of the pixels 110 of the pixel tiles 110T may be controlled.

In an exemplary embodiment, the pixels 110 may have the light emitting stacked structure described above according to exemplary embodiments. Hereinafter, each light emitting stacked structure may be referred to as the "pixel" as each pixel includes the light emitting stacked structure.

The substrate 10 may include various materials. For example, the substrate 10 may include a body including a glass, silicon, quartz, organic polymer, or organic-inorganic composite material, and the line part disposed on the body and including a conductive material. The line part may be disposed on an upper surface, a lower surface, and/or an inner surface of a via defined through the body, and may include various materials, such as a metal, metal alloy, or conductive metal oxide. In an exemplary embodiment, the substrate 10 may be a silicon substrate, the body of the substrate 10 may include silicon, and wiring lines and pad electrodes may be disposed on the upper surface, the lower surface, and the inner surface of a via defined in the silicon body.

The substrate 10 may have various shapes. The shape of the pixel tile 110T may correspond to the shape of the substrate 10. In the illustrated exemplary embodiment, the substrate 10 and the pixel tile 110T corresponding to the substrate 10 have substantially a triangular shape. However, the shape of the substrate 10 and the pixel tile 110T are not limited thereto, and may be formed to have various other shapes. In some exemplary embodiments, the shape of the substrate 10 may be different from the shape of the pixel tile 110T. The substrate 10 may be provided in plural, and the substrates 10 may have substantially the same shape with each other.

The pixels 110, e.g., the light emitting stacked structures, may be disposed on each substrate 10. The pixels 110 may be arranged in various ways depending on the shape of the substrate 10, and may be arranged at furthest positions from a center of the substrate 10. In the illustrated exemplary embodiment, the substrate 10 has substantially a triangular shape, and the pixels 110 are arranged at positions corresponding to vertices of the triangular shape. However, the inventive concepts are not limited to particular positions of the pixels 110, and the pixels 110 may be arranged at the center of the substrate 10 or other positions.

The pixel tiles 110T are arranged on the base substrate 101 at substantially regular intervals. For example, the pixel tiles 110T may be arranged at substantially regular intervals in a predetermined direction, for example, in a first direction D1 across left and right sides of the base substrate 101 as shown in FIG. 7. In addition, the pixel tiles 110T may be arranged at substantially regular intervals in a direction crossing the first direction D1, for example, a second direction D2. In this case, the first direction D1 and the second direction D2 correspond to two sides of the triangular shape when the pixel tile 110T has the triangular shape. The pixel tiles 110T are arranged substantially regularly on the display device. In an exemplary embodiment, the pixel tiles 110T are arranged at an interval that arranges the pixels 110 disposed on the pixel tiles 110T to be disposed at a substantially regular interval. In particular, the pixel tiles 110T are arranged such that an interval between the pixels 110 arranged in a specific pixel tile 110T becomes substantially equal to those of adjacent pixel tiles 110T with respect to a predetermined direction, e.g., the first direction D1. In this manner, when two pixels 110 disposed along the first direction D1 and arranged in the same pixel tile 110T has an interval of a first pitch PT1, two neighboring pixels 110 disposed in different pixel tiles 110T may have an interval substantially equal to the first pitch PT1. In this case, a width D in the first direction D1 of the substrate 10 may be greater than the interval between the pixels 110 having the first pitch PT1, and a distance in the first direction D1 between two substrates 10 may be less than the first pitch PT1. Similarly, the neighboring pixels disposed in different pixel tiles 110T along the second direction D2 are spaced apart from each other at a second pitch PT2.

As described above, since the pixels 110 are arranged at substantially regular intervals in the display area of the display device, light emitting areas covered by the pixels 110 may be substantially the same as each other. For example, when a minimum area covered by the pixels repeatedly and adjacently arranged to each other is defined as a unit area 110D, the display device may include a plurality of pixel tiles 110T each including at least one unit area 110D therein.

Each pixel tile 110T may have an area greater than the unit area 110D. Accordingly, the display device according to an exemplary embodiment may provide the image with uniform quality over its entire area.

In an exemplary embodiment, when the pixel tiles 110T are arranged, the pixel tiles 110T may be arranged after being inverted upside down or left to right depending on their shape, or may be arranged after being rotated with respect to a center of each pixel tile 110T so that the pixel tiles 110T are uniformly arranged in a display area of the display device.

Figure 8B:
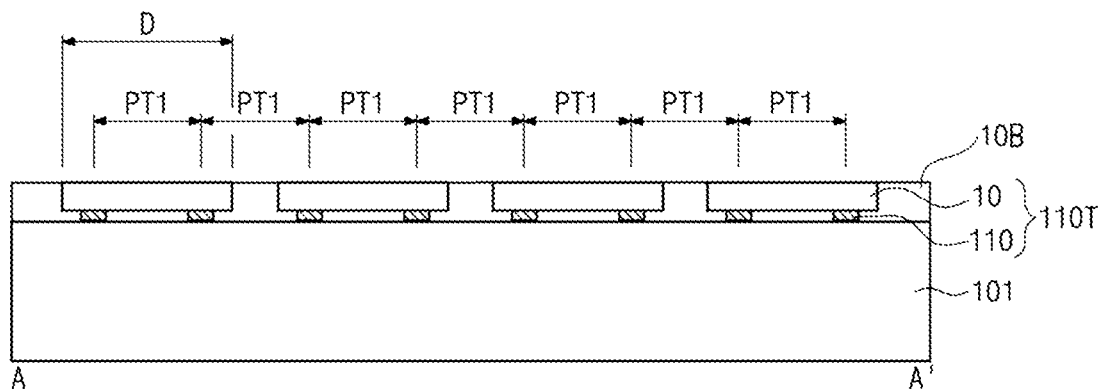
FIG. 8B is a cross-sectional view taken along line A-A' of FIG. 7 according to another exemplary embodiment.

FIG. 8B is a cross-sectional view taken along a line A-A' of FIG. 7 according to another exemplary embodiment.

Referring to FIGS. 7 and 8B, the display device according to an exemplary embodiment includes a base substrate 101 and a plurality of pixel tiles 110T disposed on the base substrate 101. Each pixel tile 110T includes a substrate 10 and a plurality of pixels 110 provided on the substrate 10. The pixels 110 are provided between the base substrate 101 and the substrate 10. In the illustrated exemplary embodiment, when the base substrate 101 includes circuits thereon, the pixels 110 may be provided as flip chip, which may then bonded on wirings of the circuits on the substrate 10.

In an exemplary embodiment, a black matrix 10B may be provided between the pixel tiles 110T adjacent to each other. As the black matrix 10B is provided between the pixel tiles 110T, attachment between the base substrate 101 and the pixel tiles 110T may be improved and color mixing from light passing to adjacent pixels 110 may be decreased. In some exemplary embodiments, the black matrix 10B of FIG. 8B may also be formed in the display device of FIG. 8A.

Referring back to FIG. 7, vertices of the triangular shape of the pixel tiles 110T are arranged between vertices of the triangular shape of adjacent pixel tiles 110T. When the black matrix is provided between the pixel tiles 110T, a portion of the black matrix corresponding to each vertices of the triangular shape may become weak, which may cause crack thereto. In this case, light from the pixel tiles 110T may be leaked at the cracked portion, and the leaked light may be reflected or scattered by electrodes formed on the pixel tiles 110T, which may decrease contrast of the display device. However, the light reflection or scattering may be minimized by forming the vertices of the triangular shape of the pixel tiles 110T between vertices of the triangular shape of adjacent pixel tiles 110T, even when the crack occurs.

The display device shown in FIGS. 7 and 8A may be manufactured by forming the pixel tiles 110T, cutting the pixel tiles 110T, and transferring each pixel tile 110T.

Figure 9:
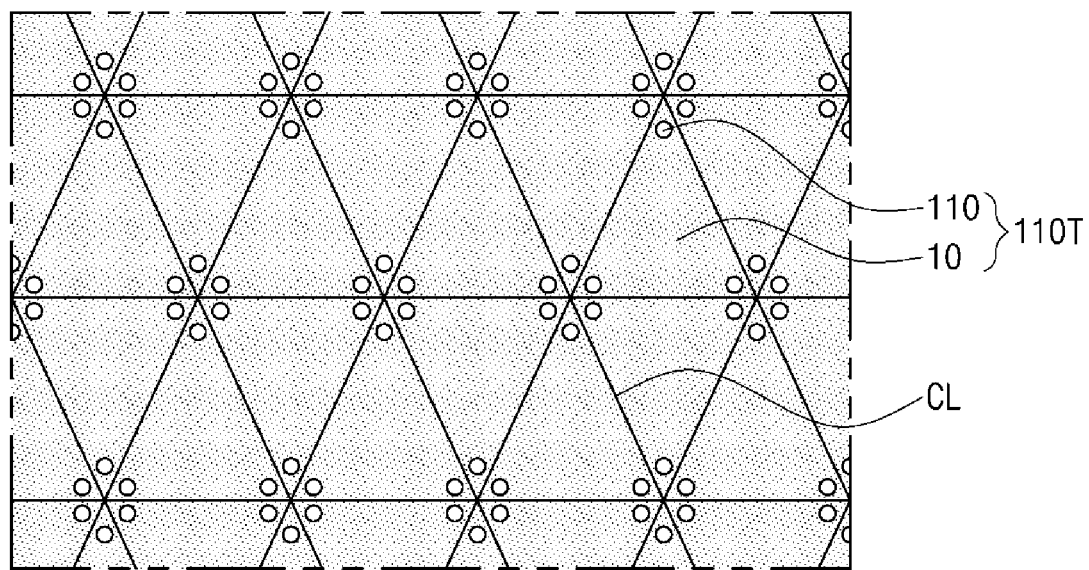
FIG. 9 is a plan view of a portion of a display device according to an exemplary embodiment.

FIG. 9 is a plan view showing one of manufacturing operations for the display device shown in FIGS. 7, 8A, and 8B.

Referring to FIGS. 7, 8A, and 9, the pixels 110 are formed on the substrate 10. An imaginary cutting line CL is defined on the substrate 10, and the shape and size of each pixel tile 110T are determined by the cutting line CL. In an exemplary embodiment, the pixels 110 are formed in each pixel tile 110T, and the positions at which the pixels 110 are formed may be determined by taking into account the arrangement of the pixels 110 in the display device. When the pixels 110 are formed on the substrate 10, the pixel tiles 110T are cut along the cutting line CL to be separated from each other, and the separated pixel tiles 110T are transferred onto the base substrate 101 and arranged as shown in FIGS. 7 and 8A and 8B, to provide a display device.

According to an exemplary embodiment, since the pixel tiles 110T are individually transferred onto the base substrate 101, the pixels 110 disposed on each pixel tile 110T may be substantially simultaneously transferred whenever each pixel tile 110T is transferred.

In general, a plurality of pixels are each transferred during manufacture of a display device, and thus, the number of pixel transfer may become very large. However, according to the exemplary embodiments, the number of pixel transfer may be significantly reduced by the number of the pixels disposed on each substrate. For example, when three pixels are disposed on the substrate 10 as shown in FIG. 9, the number of transfer times may be reduced by about ⅓ of that in the art.

In addition, the pixels for each color, e.g., red, green, and blue pixels, are separately formed and transferred to the base substrate in a conventional display device. However, according to the exemplary embodiments, since one light emitting stacked structure in which the red, green, and blue pixels overlap with each other is used as the pixel, the number of transfer times for transferring the pixels is further reduced by about ⅓ of that in the art.

Further, when the conventional pixels are transferred one by one, defects may occur, such as the pixels being out of predetermined positions of a lower adhesive layer disposed thereunder, or the pixels being tilted during attachment onto the lower adhesive layer. However, according to the exemplary embodiments, since the pixels disposed at fixed positions of each pixel tile are transferred onto the base substrate by the unit of pixel tile, the above described defects may be significantly reduced.

In addition, since the pixel tiles according to exemplary embodiments are substantially simultaneously formed in a concentrated manner in a small area on the substrate, and then arranged in a relatively large area at regular intervals, the display device may be easily manufactured. As such, arrangement of the pixels and the manufacturing method thereof may become simplified as compared to when the pixels are arranged in the large area at wide intervals from the beginning, thereby improving productivity during manufacture of a display device.

In each pixel tile, the pixel and the line part may be provided in various shapes, which will be described in more detail below.

Figure 10:
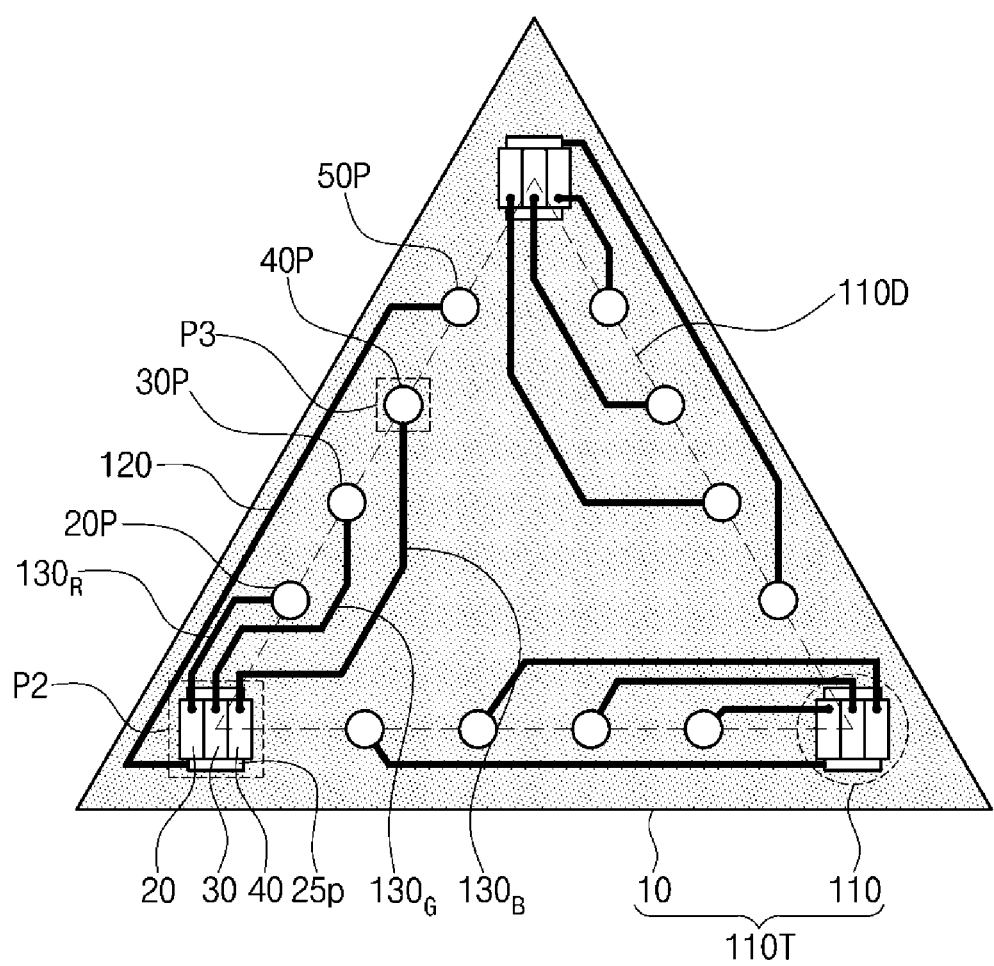
FIG. 10 is a plan view of one of pixel tiles of FIG. 7 according to an exemplary embodiment.

FIG. 10 is a plan view of one of the pixel tiles of FIGS. 7 and 8A and 8B.

Referring to FIG. 10, three pixels 110, e.g., the light emitting stacked structures, are disposed on the substrate 10. The light emitting stacked structures 110 are disposed on the substrate 10 at positions adjacent to vertices of the triangular shape. In the illustrated exemplary embodiment, a triangular portion defined by a dotted line connecting the light emitting stacked structures 110 corresponds to the unit area 110D.

A plurality of pad parts for electrical connection with the base substrate 101 of the display device is disposed on the substrate 10. The pad parts may apply the light emitting signals and the common voltage to each light emitting stacked structure 110, and may be provided to correspond to the number of the light emitting stacked structures 110. In the illustrated exemplary embodiment, since the three light emitting stacked structures 110 are provided, three pad parts are provided. More particularly, first, second, and third pads 20P, 30P, and 40P for applying the light emitting signals and a common pad 50P for applying the common voltage are provided for each of the light emitting stacked structures 110. The first, second, and third pads 20P, 30P, and 40P are respectively connected to first, second, and third scan lines $130_R$, $130_G$, and $130_B$, and the common pad 50P is connected to the data line 120. In an exemplary embodiment, the pads are provided in the form of penetrating electrode that penetrates through the upper and lower surfaces of the substrate 10.

Each of the pads of the pad part connected to each of the light emitting stacked structures 110 may be disposed at various positions on the substrate 10. For example, each of the pads may be disposed in the unit area 110D of the pixel tile 110T, and may be disposed between the unit area 110D and an edge of the substrate 10. In the illustrated exemplary embodiment, each of the pads is disposed at a boundary of the unit area 110D, however, the inventive concepts are not limited to particular positions of the pads.

In an exemplary embodiment, at least some of the pads may be disposed in the unit area 110D and the edge of the substrate 10. In this case, the pads may be disposed in a rotationally symmetrical form as far as possible with respect to a center of the pixel tile 110T. In other exemplary embodiments, pads disposed at outermost positions from the center of the substrate 10 may be placed in the rotationally symmetrical positions as far as possible. Accordingly, when the pixel tile 110T is attached onto the base substrate 101, the pixel tile 110T is prevented from being tilted due to a step difference between the pads.

The light emitting stacked structure and the pads shown in FIG. 10 may be driven in a passive matrix type or an active matrix type. Hereinafter, the light emitting stacked structure and the pads will be described as being driven in a passive matrix type pixel according to an exemplary embodiment.

Figure 11:
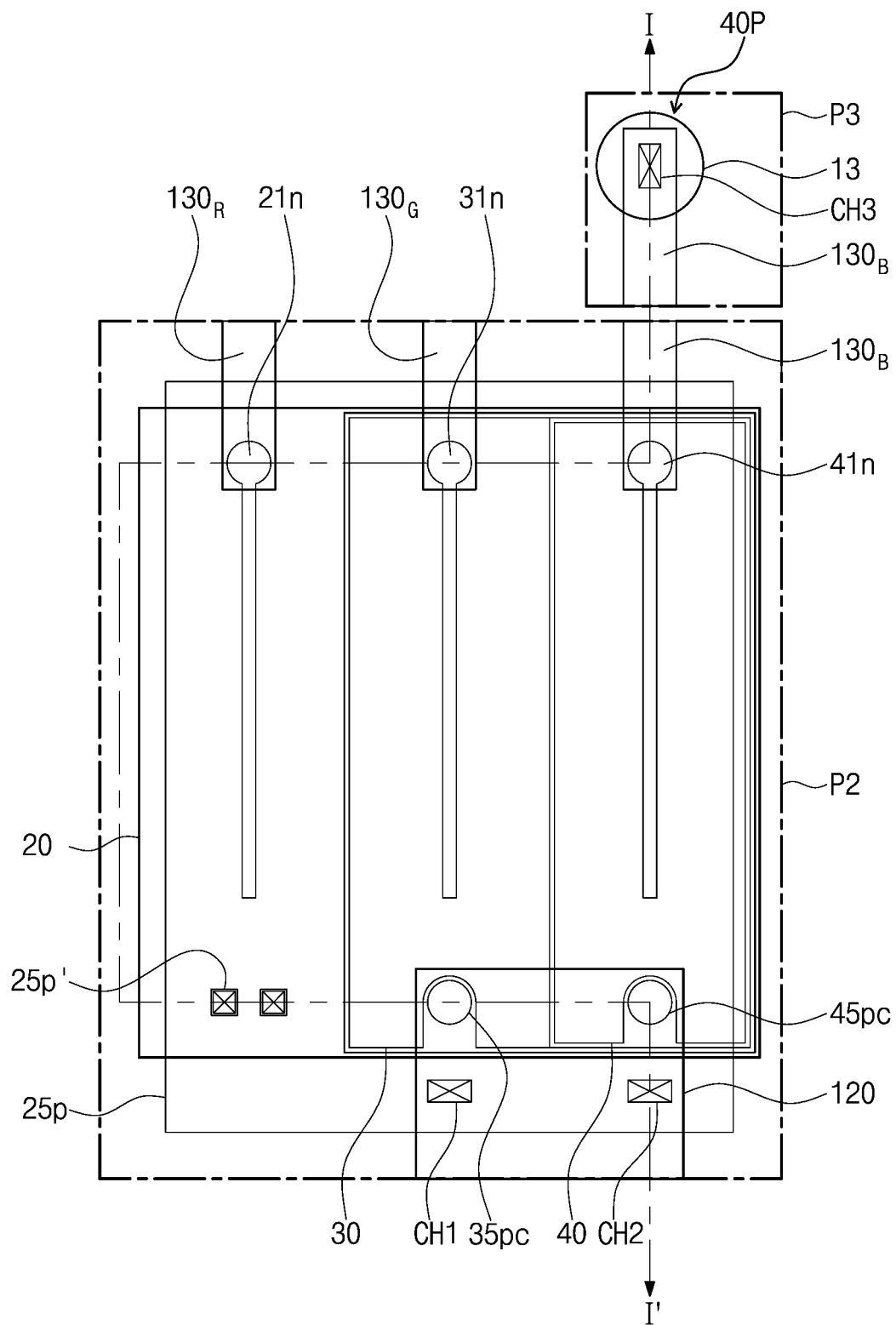
FIG. 11 is a plan view of portions P2 and P3 of FIG. 10 according to an exemplary embodiment.
Figure 12:
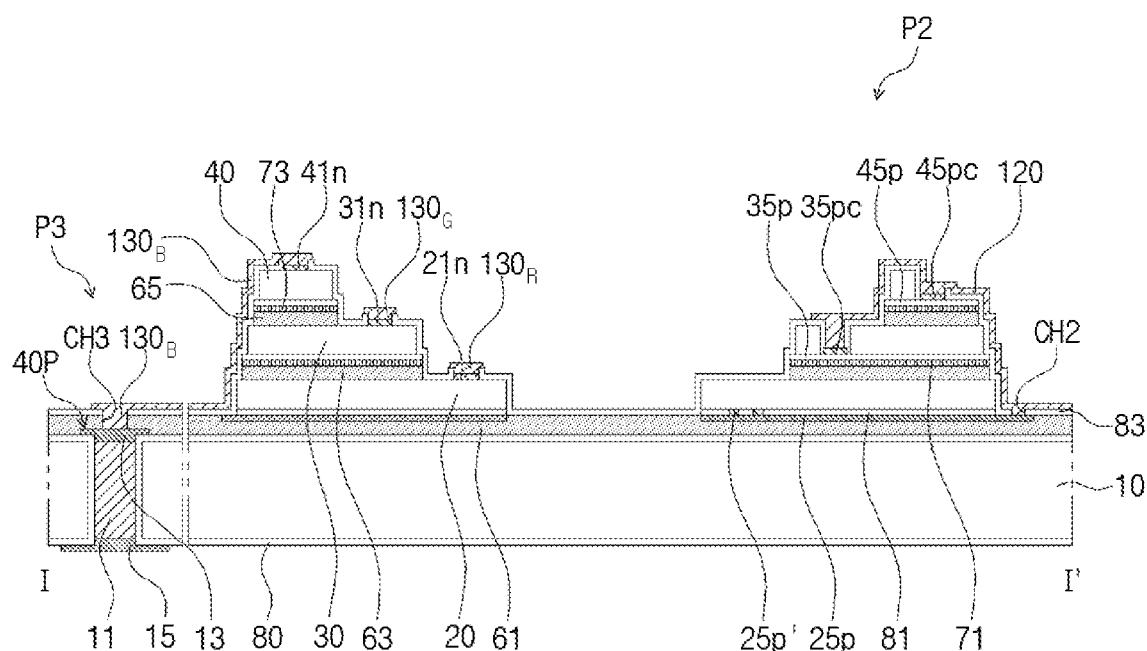
FIG. 12 is a cross-sectional view taken along line I-I' of FIG. 11.

FIG. 11 is an enlarged view of portions P2 and P3 of FIG. 10 according to an exemplary embodiment, and FIG. 12 is a cross-sectional view taken along line I-I' of FIG. 11.

Hereinafter, an arrangement of the light emitting stacked structure in a plan view will be mainly described with reference to FIGS. 10 and 11, and the arrangement of the light emitting stacked structure in a cross-sectional view will be mainly described with reference to FIGS. 10 and 12.

Referring to FIGS. 10, 11, and 12, the light emitting stacked structure according to an exemplary embodiment includes the substrate 10 and a plurality of epitaxial stacks stacked on the substrate 10 in a plan view.

In an exemplary embodiment, the substrate 10 may include various materials, e.g., silicon.

The pad part is disposed on the substrate 10 and includes the first, second, and third pads 20P, 30P, and 40P, and the common pad 50P. Since contacts between the line part including the first, second, and third scan lines $130_R$, $130_G$, and $130_B$ and the data line 120, and the pad part including the first, second, and third pads 20P, 30P, and 40P and the common pad 50P are substantially the same as each other, only the area P3 corresponding to the contact between the third scan line 130B and the third pad 40P is shown in FIGS. 11 and 12.

The third pad 40P disposed on the substrate 10 may include a penetrating electrode 11 penetrating through the upper and lower surfaces of the substrate 10, an upper pad electrode 13 disposed on the penetrating electrode 11, and a lower pad electrode 15 disposed under the penetrating electrode 11. An insulating layer 80 is disposed on the upper and lower surfaces of the substrate 10, and between the third pad 40P and the substrate 10.

The epitaxial stacks (or the light emitting stacked structure) include first, second, and third epitaxial stacks 20, 30, and 40.

The first epitaxial stack 20 has the largest area. The second epitaxial stack 30 has an area smaller than that of the first epitaxial stack 20, and is disposed on a portion of the first epitaxial stack 20. The third epitaxial stack 40 has an area smaller than that of the second epitaxial stack 30, and is disposed on a portion of the second epitaxial stack 30. In an exemplary embodiment, the first, second, and third epitaxial stacks 20, 30, and 40 are arranged such that upper surfaces of the first, second, and third epitaxial stacks 20, 30, and 40 are sequentially exposed.

A contact part is disposed in the pixel to connect the line part to the first, second, and third epitaxial stacks 20, 30, and 40. In an exemplary embodiment, the stacked structure of the pixel may be changed depending on the type of polarity semiconductor layers of the first, second, and third epitaxial stacks 20, 30, and 40 the common voltage is applied to.

Hereinafter, the common voltage will be described as being applied to the p-type semiconductor layer of the first, second, and third epitaxial stacks 20, 30, and 40 according to an exemplary embodiment.

The first, second, and third light emitting signal lines that respectively apply the light emitting signals to the first, second, and third epitaxial stacks 20, 30, and 40, and the common line that applies the common voltage to each of the first, second, and third epitaxial stacks 20, 30, and 40 are connected to the first, second, and third epitaxial stacks 20, 30, and 40. Hereinafter, since the first, second, and third light emitting signal lines respectively correspond to the first, second, and third scan lines $130_R$, $130_G$, and $130_B$ and the common line corresponds to the data line 120, the first, second, and third scan lines $130_R$, $130_G$, and $130_B$ and the data line 120 will be described as being connected to the first, second, and third epitaxial stacks 20, 30, and 40.

In an exemplary embodiment, the first, second, and third scan lines $130_R$, $130_G$, and $130_B$ and the data line 120 may extend in a direction toward corresponding pads on the substrate 10, and may be connected to the corresponding pads. However, the inventive concepts are not limited to particular directions in which the first, second, and third scan lines $130_R$, $130_G$, and $130_B$ and the data line 120 extend, and the extending directions may be changed in various ways depending on the arrangement of the pixels and the pads.

An ohmic electrode 25p' is disposed in the light emitting area, in which the first p-type contact electrode layer 25p is disposed, for the ohmic contact between the first p-type contact electrode layer 25p and the first epitaxial stack 20. The ohmic electrode 25p' may have various shapes and may be provided in plural. In an exemplary embodiment, the ohmic electrode 25p' is disposed in the lower surface of the first epitaxial stack 20, however, the inventive concepts are not limited thereto. The ohmic electrode 25p' may include various materials for ohmic contact. For example, the ohmic electrode 25p' corresponding to a p-type ohmic electrode 25p' may include an Au—Zn alloy or an Au—Be alloy. In this case, since the material for the ohmic electrode 25p' has a reflectivity lower than that of Ag, Al, and Au, an additional reflection electrode may be further disposed. As the material for the additional reflection electrode, Ag or Au may be used, and a layer including Ti, Ni, Cr, or Ta may be disposed as an adhesive layer for adhesion to adjacent components. In this case, the adhesive layer may be deposited thinly on upper and lower surfaces of the reflection electrode including Ag or Au.

The first n-type contact electrode 21n is disposed on the first epitaxial stack 20. The first scan line $130_B$ is connected to the first n-type contact electrode 21n. The second n-type contact electrode 31n is disposed on the second epitaxial stack 30. The second scan line $130_G$ is connected to the second n-type contact electrode 31n. The third n-type contact electrode 41n is disposed on the third epitaxial stack 40. The third scan line $130_B$ is connected to the third n-type contact electrode 41n.

A portion of one side of the second epitaxial stack 30 is removed to form a second p-type contact electrode 35pc. The second p-type contact electrode 35pc is connected to the data line 120. A third p-type contact electrode 45pc is connected to the data line 120. The data line 120 is connected to the first p-type contact electrode layer 25p through first and second contact holes CH1 and CH2. Accordingly, the first, second, and third p-type contact electrode layers 25p, 35p, and 45p are electrically connected to the data line 120, and the common voltage applied thereto through the data line 120.

In an exemplary embodiment, the first, second, and third n-type contact electrodes 21n, 31n, and 41n have a relatively wide area to be easily connected to the first, second, and third scan lines 130$_R$, 130$_G$, and 130$_B$, respectively. The first, second, and third n-type contact electrodes 21n, 31n, and 41n may be formed to have various shapes, and the first, second, and third n-type contact electrodes 21n, 31n, and 41n have substantially a circular shape (see FIG. 14A). An extension part extending in one direction from the first, second, and third n-type contact electrode 21n, 31n, and 41n may be provided together with the first, second, and third n-type contact electrodes 21n, 31n, and 41n. The extension part may supply a uniform current to the n-type semiconductor layer of the first epitaxial stack 20, and may extend substantially in one direction from the first, second, and third n-type contact electrodes 21n, 31n, and 41n. The extension part may be formed to have various shapes, and in the illustrated exemplary embodiment, the extension part has an elongated shape like a bar.

The first, second, and third scan lines 130$_R$, 130$_G$, and 130$_B$ are connected to the first, second, and third pads 20P, 30P, and 40P, and the data line 120 is connected to the common pad 50P. In particular, one end of the first scan line 130$_R$ is connected to the first n-type contact electrode 21n, and the other end of the first scan line 130$_R$ is connected to the first pad 20P. One end of the second scan line 130$_G$ is connected to the second n-type contact electrode 31n, and the other end of the second scan line 130$_G$ is connected to the second pad 30P. One end of the third scan line 130$_B$ is connected to the third n-type contact electrode 41n, and the other end of the third scan line 130$_B$ is connected to the third pad 40P. One end of the data line 120 is connected to the first, second, and third p-type contact electrode layers 25p, 35p, and 45p, and the other end of the data line 120 is connected to the common pad 50P.

The adhesive layer, the p-type contact electrode layer, and the wavelength pass filter may be disposed between the substrate 10 and the first epitaxial stack 20, between the first epitaxial stack 20 and the second epitaxial stack 30, and between the second epitaxial stack 30 and the third epitaxial stack 40. Hereinafter, the pixel will be described according to the stacking order according to an exemplary embodiment.

According to an exemplary embodiment, the substrate 10 is provided, and the first epitaxial stack 20 is disposed on the substrate 10 with a first adhesive layer 61 interposed therebetween.

The first epitaxial stack 20 includes the p-type semiconductor layer, the active layer, and the n-type semiconductor layer, which are sequentially stacked in the upward direction from the lower portion.

A first insulating layer 81 is disposed on a lower surface of the first epitaxial stack 20 that faces the substrate 10. The first insulating layer 81 is provided with at least one contact hole defined therethrough. The ohmic electrode 25p' is disposed in the contact hole and makes contact with the p-type semiconductor layer of the first epitaxial stack 20. The ohmic electrode 25p' may include various materials.

The ohmic electrode 25p' makes contact with the first p-type contact electrode layer 25p. The first p-type contact electrode layer 25p is disposed between the first insulating layer 81 and the first adhesive layer 61.

The first p-type contact electrode layer 25p may overlap with the first epitaxial stack 20, in particular, the light emitting area of the first epitaxial stack 20, and may be provided to cover most or all of the light emitting area in a plan view. The first p-type contact electrode layer 25p may include a reflective material to reflect light emitted from the first epitaxial stack 20. In addition, the first insulating layer 81 may reflectivity such that the reflection of light from the first epitaxial stack 20 is easily performed. For example, the first insulating layer 81 may have an omni-directional reflector (ODR) structure.

Further, the first p-type contact electrode layer 25p may include metal having high reflectivity to light emitted from the first epitaxial stack 20 so that the reflectivity with respect to the light emitted from the first epitaxial stack 20 is maximized. For example, when the first epitaxial stack 20 emits red light, the first p-type contact electrode layer 25p may include metal, such as Au, Al, or Ag, which has high reflectivity to red light. In the case of Au, the reflectivity with respect to the lights, e.g., the green light and the blue light, emitted from the second and third epitaxial stacks 30 and 40 is not high, and thus, a color mixture caused by lights emitted from the second and third epitaxial stacks 30 and 40 may be prevented.

The first n-type contact electrode 21n is disposed on the upper surface of the first epitaxial stack 20. The first n-type contact electrode 21n may include a conductive material. In an exemplary embodiment, the first n-type contact electrode 21n may include various metal materials and alloys thereof, for example, an Au—Te alloy or an Au—Ge alloy.

The second adhesive layer 63 is disposed on the first epitaxial stack 20, and the first wavelength pass filter 71, the second p-type contact electrode layer 35p, and the second epitaxial stack 30 are sequentially disposed on the second adhesive layer 63.

The first wavelength pass filter 71 covers a portion of the light emitting area of the first epitaxial stack 20, and is disposed on a portion of the upper surface of the first epitaxial stack 20 to overlap with the area in which the second epitaxial stack 30 is disposed.

The second epitaxial stack 30 includes the p-type semiconductor layer, the active layer, and the n-type semiconductor layer, which are sequentially stacked in the upward direction from the lower portion.

The second epitaxial stack 30 is partially removed to expose a portion of the second p-type contact electrode layer 35p. The second p-type contact electrode 35pc is disposed on the second p-type contact electrode layer 35p in the area from which the portion of the second epitaxial stack 30 is removed. The second n-type contact electrode 31n is disposed on the second epitaxial stack 30.

The third adhesive layer 65 is disposed on the second epitaxial stack 30, and the second wavelength pass filter 73, the third p-type contact electrode layer 45p, and the third epitaxial stack 40 are sequentially disposed on the third adhesive layer 65.

The second wavelength pass filter 73 covers a portion of the light emitting area of the second epitaxial stack 30, and is disposed on a portion of the upper surface of the second epitaxial stack 30 to overlap with the area in which the third epitaxial stack 40 is disposed.

The third epitaxial stack 40 includes the p-type semiconductor layer, the active layer, and the n-type semiconductor layer, which are sequentially stacked in the upward direction from the lower portion.

The third epitaxial stack 40 is partially removed to expose a portion of the third p-type contact electrode layer 45p. The third p-type contact electrode 45pc is disposed on the third p-type contact electrode layer 45p in the area from which the portion of the third epitaxial stack 40 is removed. The third n-type contact electrode 41n is disposed on the third epitaxial stack 40.

A second insulating layer 83 is disposed on the substrate 10 on which the third epitaxial stack 40 is formed. The second insulating layer 83 may include various organic/inorganic insulating materials, without being limited thereto. For example, the second insulating layer 83 may include the inorganic insulating material including silicon nitride or silicon oxide or the organic insulating material including polyimide.

The second insulating layer 83 is provided with contact holes defined therethrough to expose the upper surfaces of the first p-type contact electrode layer 25p, the second and third p-type contact electrodes 35pc and 45pc, the first, second, and third n-type contact electrodes 21n, 31n, and 41n, the first, second, and third pads 20P, 30P, and 40P, and the common pad 50P. The first, second, and third scan lines 130$_R$, 130$_G$, and 130$_B$ are respectively connected to the first, second, and third n-type contact electrodes 21n, 31n, and 41n. The first, second, and third scan lines 130$_R$, 130$_G$, and 130$_B$ extend to the area, in which the first, second, and third pads 20P, 30P, and 40P are formed, and are connected to first, second, and third pads 20P, 30P, and 40P through the contact holes (e.g., third contact hole) defined above the first, second, and third pads 20P, 30P, and 40P. The data line 120 is connected to the first p-type contact electrode layer 25p, and the second and third p-type contact electrodes 35pc and 45pc through the first and second contact holes CH1 and CH2. The data line 120 extends to the area, in which the common pad 50P is formed, and is connected to the common pad 50P through the contact hole defined above the common pad 50P. In an exemplary embodiment, the first, second, and third scan lines 130$_R$, 130$_G$, and 130$_B$ and the data line 120 may be disposed on the second insulating layer 83, and may be connected to the contact holes in the area, in which the first, second, and third pads 20p, 30p, 40p are formed, where a portion of the second insulating layer 83 is removed to expose the upper pad electrode 13.

In some exemplary embodiments, a concave-convex portion may be selectively formed on the upper surfaces of the first, second, and third epitaxial stacks 20, 30, and 40. The concave-convex portion may be disposed only in an area corresponding to the light emitting area or may be disposed on the entire upper surface of each semiconductor layer.

In some exemplary embodiments, a non-light transmitting layer may be further disposed on a side portion of the second insulating layer 83 corresponding to the side surface of the light emitting stacked structure. The non-light transmitting layer may function as a light blocking layer to prevent light from the first, second, and third epitaxial stacks 20, 30, and 40 from exiting through the side surface of the light emitting stacked structure. To this end, the non-light transmitting layer may include a material that absorbs or reflects the light.

The non-light transmitting layer may have a single or multi-layer metal. For example, the non-light transmitting layer may include various materials including metal of Al, Ti, Cr, Ni, Au, Ag, Sn, W, and Cu, or an alloy thereof.

In an exemplary embodiment, the non-light transmitting layer may be disposed on the side surface of the second insulating layer 83 using the metal or the metal alloy as a separate layer.

In an exemplary embodiment, the non-light transmitting layer may be provided by extending at least one of the first, second, and third scan lines 130$_R$, 130$_G$, and 130$_B$ and the data line 120 along the side surface of the light emitting stacked structure. In this case, the non-light transmitting layer extending from at least one of the first, second, and third scan lines 130$_R$, 130$_G$, and 130$_B$ and the data line 120 may be insulated from other conductive components.

Further, the non-light transmitting layer that is formed in the same process, uses the same material, and is disposed on the same layer as at least one of the first, second, and third scan lines 130$_R$, 130$_G$, and 130$_B$ and the data line 120 may be provided separately from the first, second, and third scan lines 130$_R$, 130$_G$, and 130$_B$ and the data line 120.

As another example, when the non-light transmitting layer is not provided separately, the second insulating layer 83 may function as the non-light transmitting layer. In this case, the second insulating layer 83 may not be disposed in an area corresponding to an upper portion (e.g., the front surface direction) of the first, second, and third epitaxial stacks 20, 30, and 40, such that lights emitted from the first, second, and third epitaxial stacks 20, 30, and 40 may travel in the front surface direction.

The non-light transmitting layer is not particularly limited as long as the non-light transmitting layer absorbs or reflects the light to block the transmission of the light. In some exemplary embodiments, the non-light transmitting layer may be a distributed Bragg reflector (DBR) dielectric mirror, a metal reflection layer formed on an insulating layer, or a black-colored organic polymer layer. When the metal reflection layer is used as the non-light transmitting layer, the metal reflection layer may be in a floating state, in which the metal reflection layer is electrically insulated from components of other pixels.

Due to the non-light transmitting layer disposed on the side surface of the pixel, light exiting from a specific pixel may be prevented from exerting an influence to an adjacent pixel or from mixing with light exiting from the adjacent pixel.

The pixel having the above-described structure may be manufactured by sequentially stacking the first, second, and third epitaxial stacks 20, 30, and 40 on the substrate 10. Hereinafter, a process of preparing the substrate 10 will be described, and then processes for forming the light emitting stacked structure on the substrate 10 will be described in detail.

FIGS. 13A to 13E are cross-sectional views illustrating a method of manufacturing a substrate according to an exemplary embodiment. FIGS. 14A, 15A, 16A, 17A, 18A, 19A, 20A, 21A, 22A, 23A, 24A, and 25A are plan views illustrating a method for stacking first to third epitaxial stacks on a substrate to form a pixel. FIGS. 14B, 15B, 16B, 17B, 18B, 19B, 20B, 21B, 22B, 23B, 24B, and 25B are cross-sectional views taken along line I-I' of FIGS. 14A, 15A, 16A, 17A, 18A, 19A, 20A, 21A, 22A, 23A, 24A, and 25A, respectively.

Figure 13A:
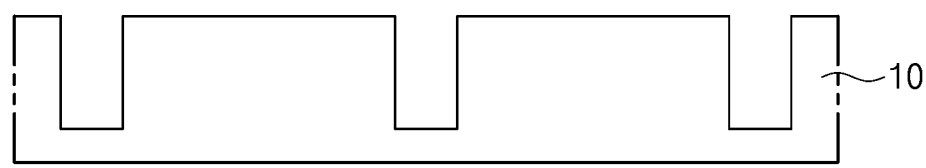
FIGS. 13A, 13B, 13C, 13D, and 13E are cross-sectional views illustrating a method of manufacturing a substrate according to an exemplary embodiment.

Referring to FIG. 13A, the substrate 10 is prepared and etched to form a trench therein. The substrate 10 may include silicon, and the trench may be formed by a deep silicon etch method or the like.

Figure 13B:
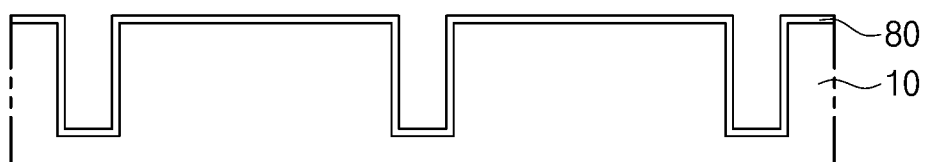

Referring to FIG. 13B, the insulating layer 80 is formed on the substrate 10 using a heat treatment process or a plasma-enhanced chemical vapor deposition (PECVD) process. The insulating layer 80 may be, but not limited to, a silicon oxide layer.

Figure 13C:
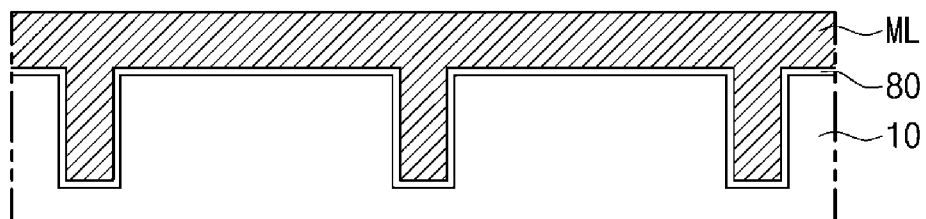

Referring to FIG. 13C, a metal layer ML is formed on the substrate 10. The metal layer ML may be formed by depositing a seed metal on the substrate 10, on which the insulating layer 80 is formed, using a sputter and by plating the seed metal. As the seed metal, Cr and Cu, Ti and Cu, or Sn and Cu may be used.

Figure 13D:
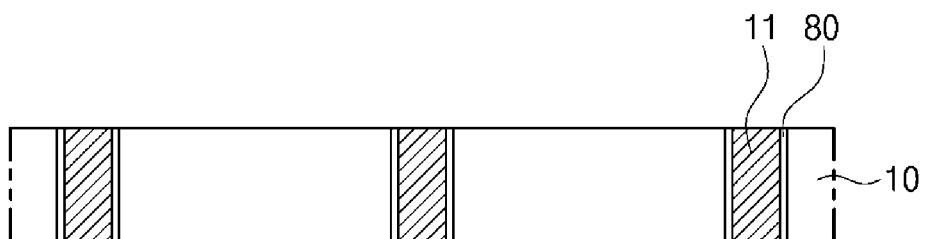

Referring to FIG. 13D, the upper and lower surfaces of the substrate 10 is polished to form the penetrating electrode 11. The polishing process may be performed by a chemical mechanical polishing (CMP) process or the like. Accordingly, the penetrating electrode 11 that penetrates through both surfaces of the substrate 10 is formed, and the insulating layer 80 is interposed between the substrate 10 and the penetrating electrode 11.

Figure 13E:
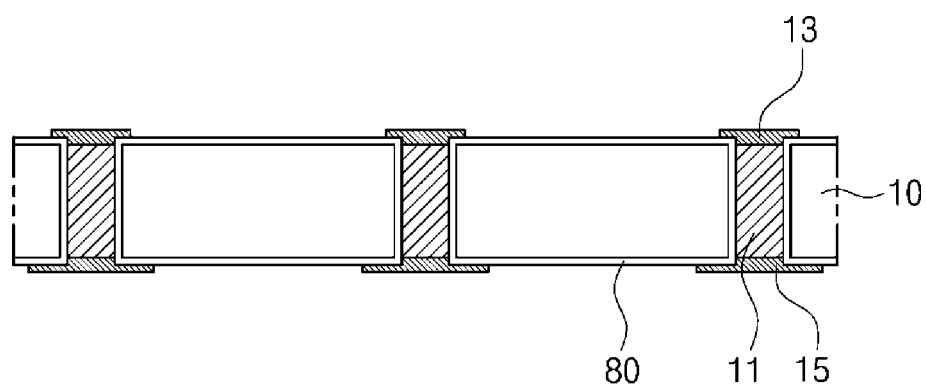

Referring to FIG. 13E, insulating layers 80 are formed on the upper and lower surfaces of the substrate 10, respectively, and the insulating layers 80 are patterned to define openings. The upper pad electrode 13 and the lower pad electrode 15 may be formed in the openings of the insulating layers 80.

In an exemplary embodiment, the upper pad electrode 13 and the lower pad electrode 15 may have substantially the same area in a plan view. However, the inventive concepts are not limited thereto. For example, the area of the lower pad electrode 15 may be greater than the area of the upper pad electrode 13. When the lower pad electrode 15 has the relatively large area, a possibility of the pixel tile being tilted may be reduced during manufacturing of a display device, and a contact stability between the pixel tile and base substrate may be improved.

The upper pad electrode 13 and the lower pad electrode 15 may be formed of various metals and metallic alloys, and may have a single or multi-layer structure. The upper pad electrode 13 and the lower pad electrode 15 may include an adhesive metal layer including metals, such as Cr, Ti, or Ni, for adhesion to the penetrating electrode, and a barrier layer including TiN, TiW, Ti, or Ni may be provided. In addition, an Au thin layer may be further disposed at an outermost position of the upper pad electrode 13 and the lower pad electrode 15 to prevent oxidation.

Figure 14A:
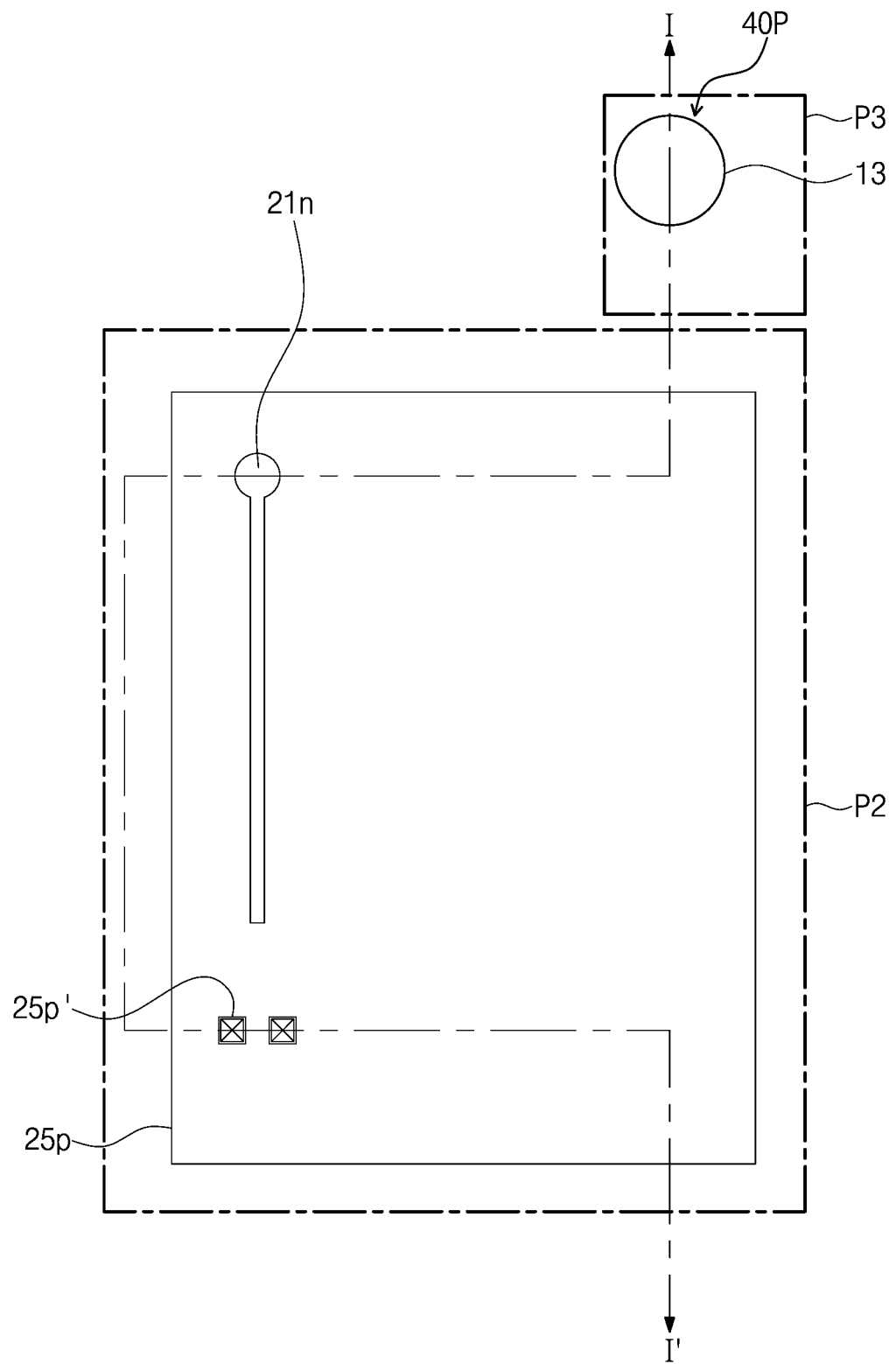
FIGS. 14A, 15A, 16A, 17A, 18A, 19A, 20A, 21A, 22A, 23A, 24A, and 25A are plan views illustrating a method of stacking first to third epitaxial stacks on a substrate to form a pixel according to an exemplary embodiment.
Figure 14B:
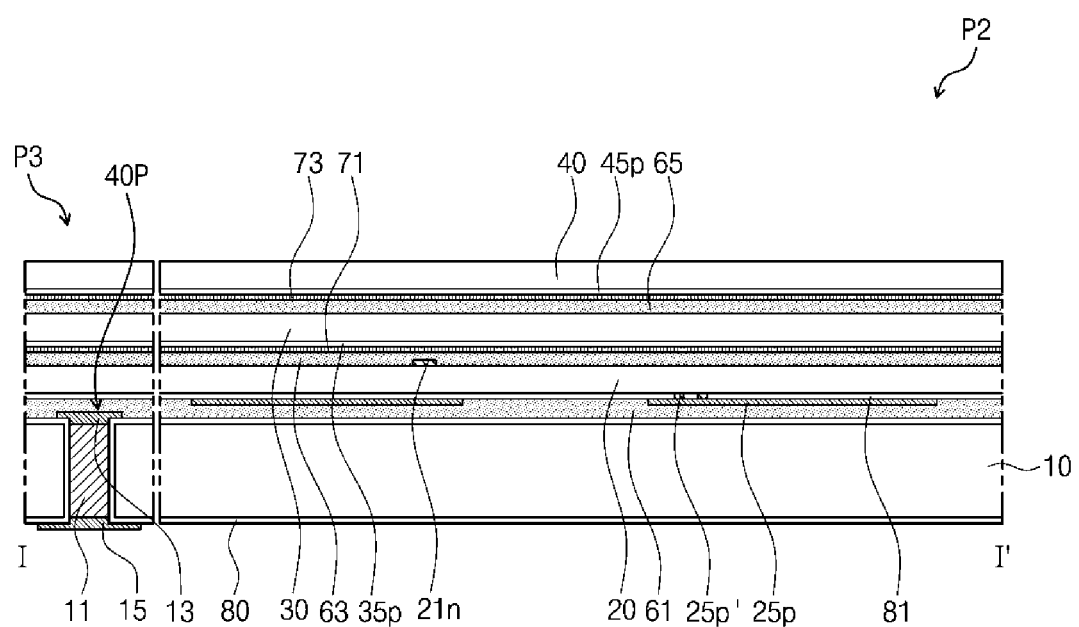
FIGS. 14B, 15B, 16B, 17B, 18B, 19B, 20B, 21B, 22B, 23B, 24B, and 25B are cross-sectional views taken along line I-I' of FIGS. 14A, 15A, 16A, 17A, 18A, 19A, 20A, 21A, 22A, 23A, 24A, and 25A, respectively.

Referring to FIGS. 14A and 14B, the first, second, and third epitaxial stacks 20, 30, and 40 are sequentially formed on the substrate 10.

The first epitaxial stack 20 and the ohmic electrode 25p' are formed on a first temporary substrate. The first temporary substrate may be a semiconductor substrate, e.g., a gallium arsenide (GaAs) substrate capable of growing the first epitaxial stack 20 thereon. The first epitaxial stack 20 is manufactured by forming the n-type semiconductor layer, the active layer, and the p-type semiconductor layer on the first temporary substrate. The first insulating layer 81 is formed on the first temporary substrate, and the ohmic electrode 25p' is formed in a contact hole formed in the first insulating layer 81.

The ohmic electrode 25p' may be formed by forming the first insulating layer 81 on the first temporary substrate, coating a photoresist, patterning the photoresist, depositing a material for the ohmic electrode 25p' on the patterned photoresist, and lifting off the photoresist pattern. However, the inventive concepts are not limited to a particular method of forming the ohmic electrode 25p'. In another exemplary embodiment, the ohmic electrode 25p' may be formed by forming the first insulating layer 81, patterning the first insulating layer 81 using a photolithography process, forming a layer for the ohmic electrode 25p' using the material for the ohmic electrode 25p', and patterning the layer for the ohmic electrode 25p' using a photolithography process.

The first p-type contact electrode layer 25p, e.g., the data line 120, is formed on the first temporary substrate on which the ohmic electrode 25p' is formed. The first p-type contact electrode layer 25p may include a reflective material. The first p-type contact electrode layer 25p may be formed by depositing metal on the first temporary substrate, and patterning the deposited metal through a photolithography process.

The first epitaxial stack 20 formed on the first temporary substrate is inverted upside down, and attached to the substrate 10 with the first adhesive layer 61 interposed therebetween.

The first temporary substrate is removed after the first epitaxial stack 20 is attached to the substrate 10. The first temporary substrate may be removed by various methods, such as a wet etch process, a dry etch process, a physical removal process, or a laser lift-off process.

After the first temporary substrate is removed, the first n-type contact electrode 21n is formed on the first epitaxial stack 20. The first n-type contact electrode 21n may be formed by forming a conductive material layer and patterning the conductive material layer using a photolithography process, for example.

In some exemplary embodiments, the concave-convex portion may be formed on the upper surface (e.g., n-type semiconductor layer) of the first epitaxial stack 20 after the first temporary substrate is removed. The concave-convex portion may be textured through various etching processes, such as a dry etch process using a microphotography, a wet etch process using crystal properties, a texturing process using a physical method such as a sandblast, an ion beam etch process, or a texturing process using an etching rate difference of block copolymer.

The second epitaxial stack 30, the second p-type contact electrode layer 35p, and the first wavelength pass filter 71 are formed on a second temporary substrate.

The second temporary substrate may be a sapphire substrate. The second epitaxial stack 30 may be manufactured by forming the n-type semiconductor layer, the active layer, and the p-type semiconductor layer on the second temporary substrate.

The second epitaxial stack 30 formed on the second temporary substrate is inverted upside down, and attached to the first epitaxial stack 20 with the second adhesive layer 63 interposed therebetween. The second temporary substrate is removed after the second epitaxial stack 30 is attached to the first epitaxial stack 20. The second temporary substrate may be removed by various methods, such as a wet etch process, a dry etch process, a physical removal process, or a laser lift-off process. In some exemplary embodiments, the concave-convex portion may be formed on the upper surface (e.g., n-type semiconductor layer) of the second epitaxial stack 30 after the second temporary substrate is removed. The concave-convex portion may be textured through various etch processes or may be formed using the patterned sapphire substrate as the second temporary substrate.

The third epitaxial stack 40, the third p-type contact electrode layer 45p, and the second wavelength pass filter 73 are formed on a third temporary substrate.

The third temporary substrate may be a sapphire substrate. The third epitaxial stack 40 may be manufactured by forming the n-type semiconductor layer, the active layer, and the p-type semiconductor layer on the third temporary substrate.

The third epitaxial stack 40 formed on the third temporary substrate is inverted upside down, and attached to the second epitaxial stack 30 with the third adhesive layer 65 interposed therebetween. The third temporary substrate is removed after the third epitaxial stack 40 is attached to the second epitaxial stack 30. The third temporary substrate may be removed by various methods, such as a wet etch process, a dry etch process, a physical removal process, or a laser lift-off process. In some exemplary embodiments, the concave-convex portion may be formed on the upper surface (e.g., n-type semiconductor layer) of the third epitaxial stack 40 after the third temporary substrate is removed. The concave-convex portion may be textured through various etch processes or may be formed using the patterned sapphire substrate as the third temporary substrate.

Figure 15A:
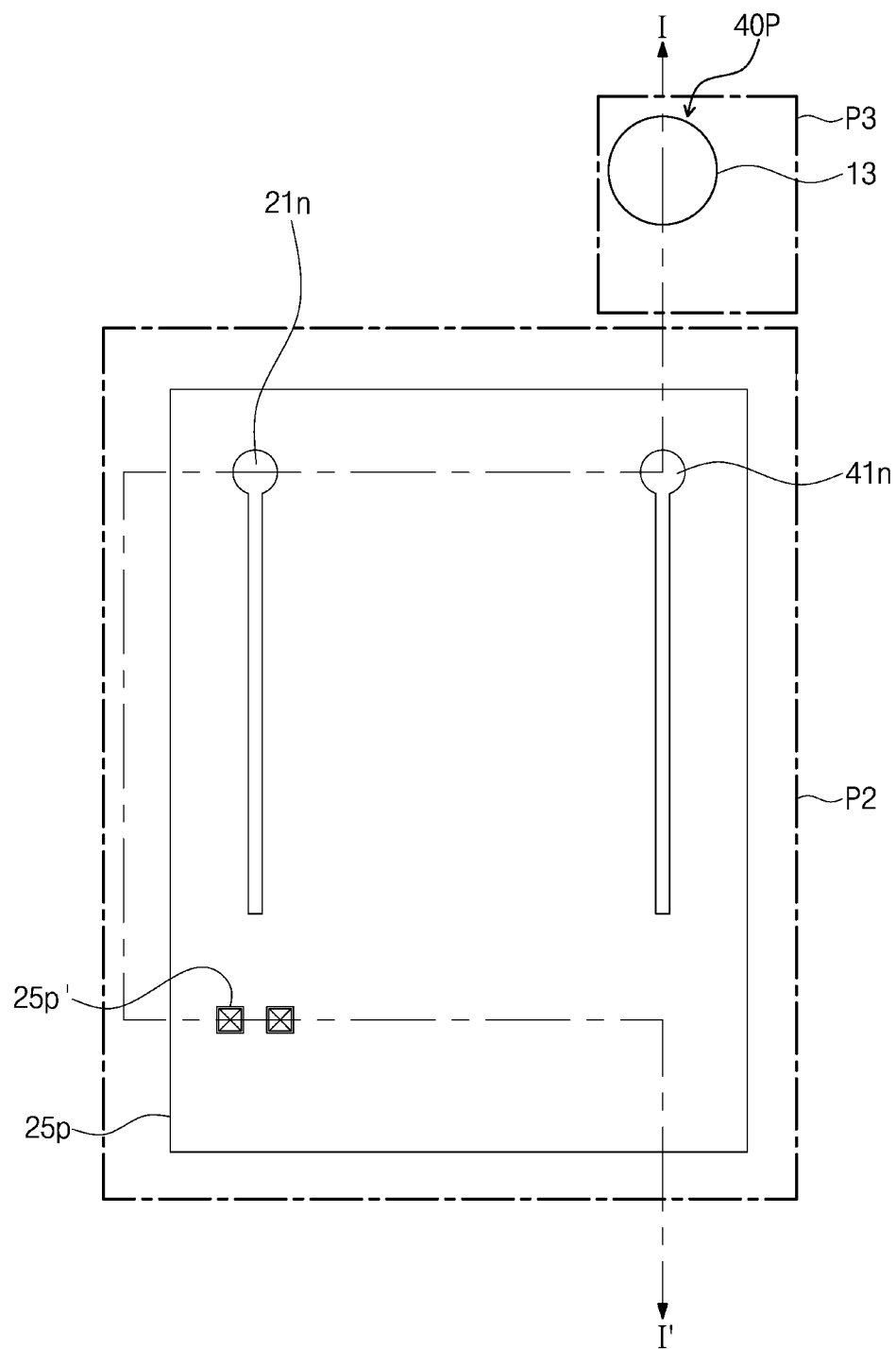
Figure 15B:
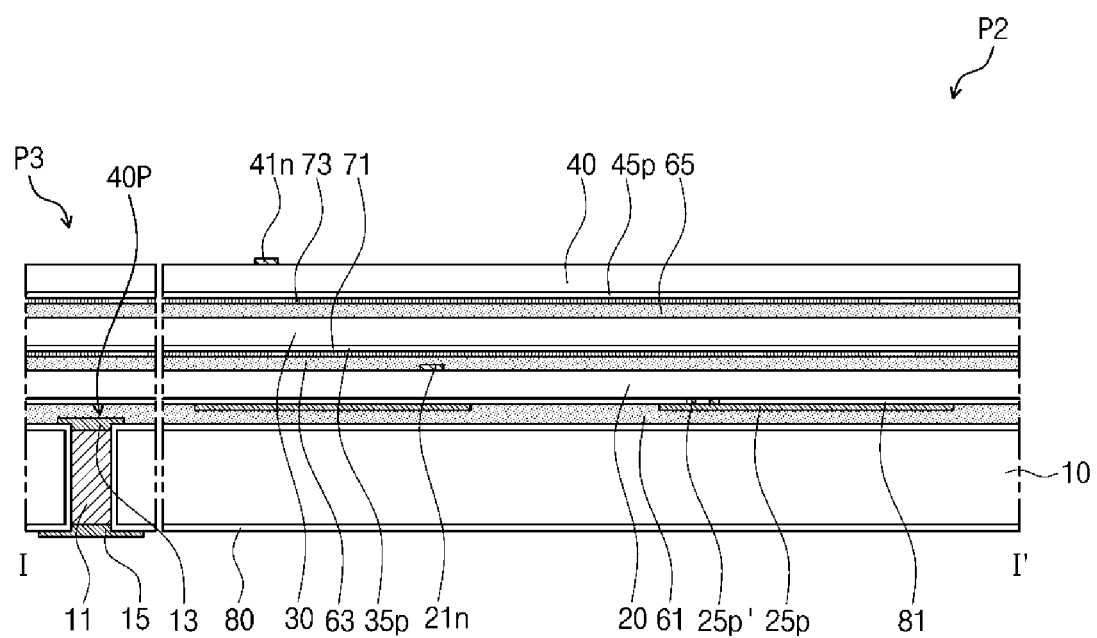

Referring to FIGS. 15A and 15B, the third n-type contact electrode 41n is formed on the upper surface of the third epitaxial stack 40. The third n-type contact electrode 41n may be formed by forming a conductive material layer on the upper surface of the third epitaxial stack 40, and patterning the conductive material layer using a photolithography process, for example.

Figure 16A:
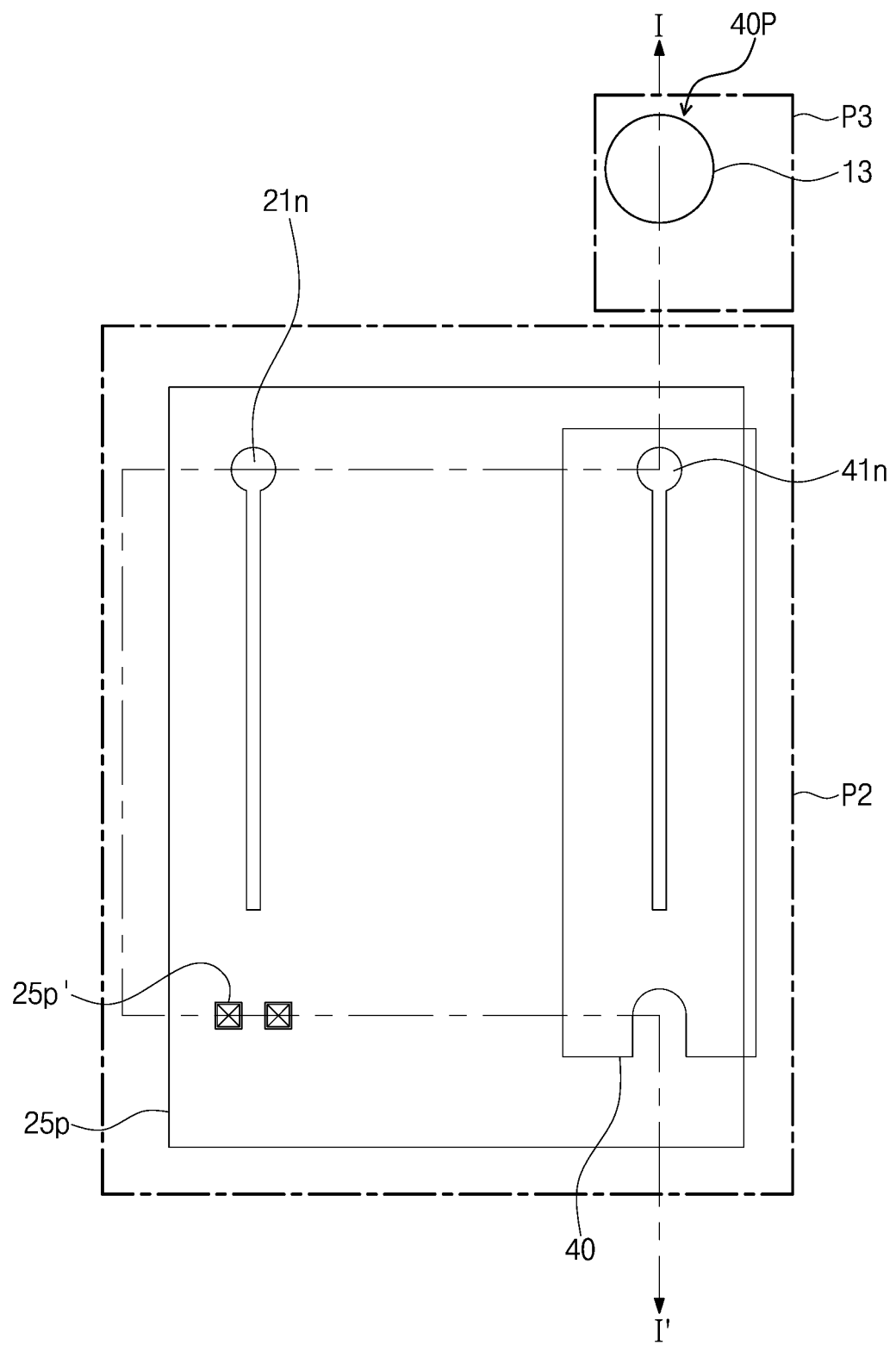
Figure 16B:
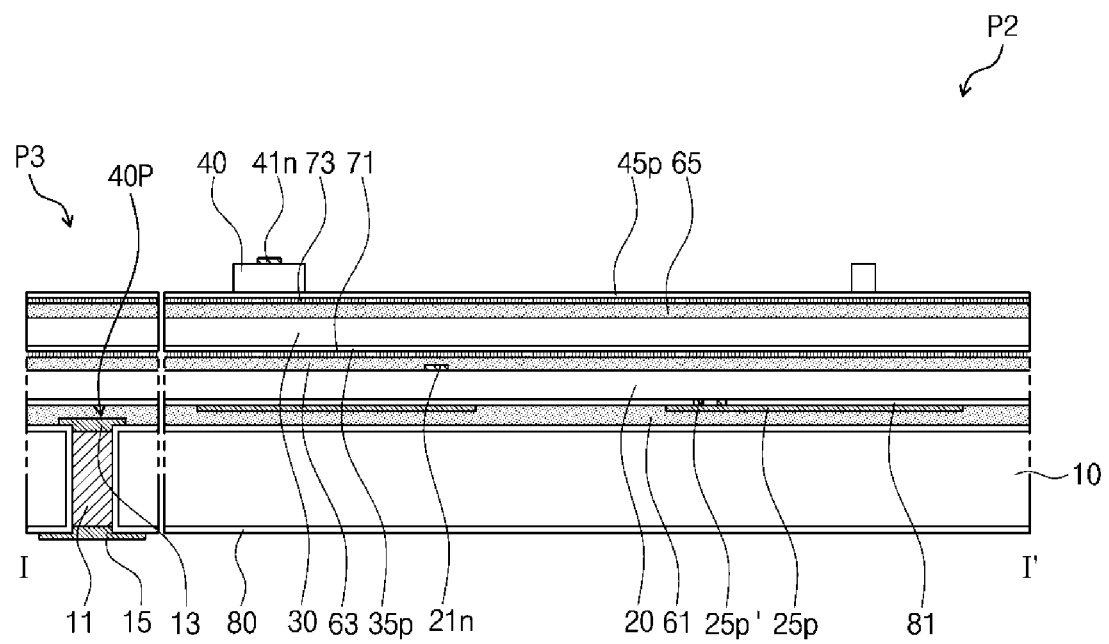

Referring to FIGS. 16A and 16B, the third epitaxial stack 40 is patterned. A portion of the third epitaxial stack 40 is removed from an area corresponding to the pixel, except for a predetermined area of the pixel, so that the third epitaxial stack 40 has the area smaller than the first and second epitaxial stacks 20 and 30. In addition, a portion of the third epitaxial stack 40 is also removed from an area in which the third p-type contact electrode 45pc is to be formed. The third epitaxial stack 40 may be removed by various methods, such as the wet etch process or the dry etch process, using the photolithography process, and in this case, the third p-type contact electrode layer 45p may function as an etch stopper.

Figure 17A:
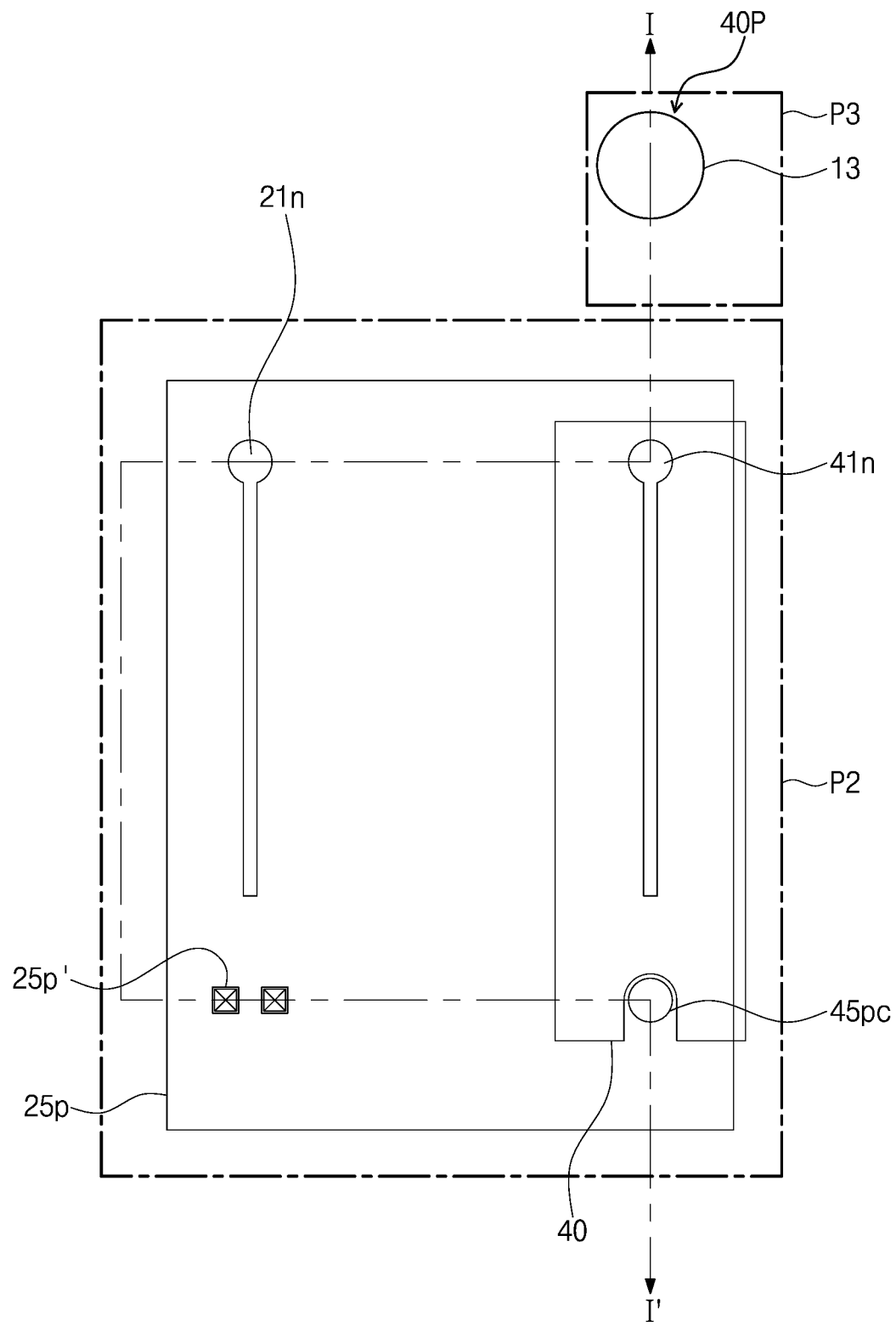
Figure 17B:
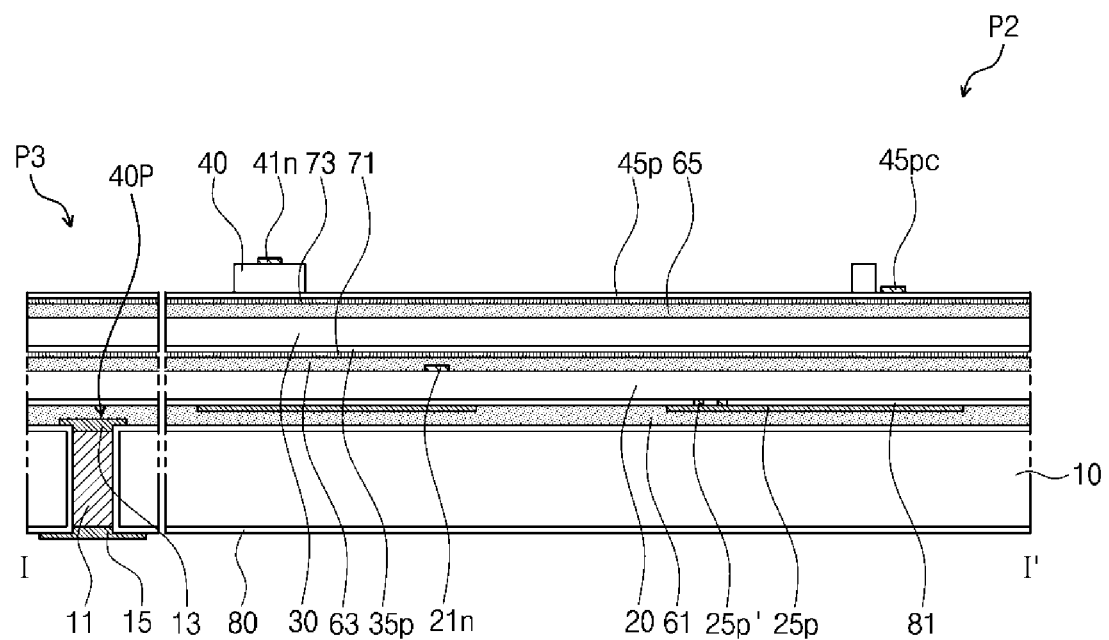

Referring to FIGS. 17A and 17B, the third p-type contact electrode 45pc is formed on the third p-type contact electrode layer 45p exposed from removing the third epitaxial stack 40. The third p-type contact electrode 45pc may be formed by forming a conductive material layer on the upper surface of the substrate 10, on which the third p-type contact electrode layer 45p is formed, and patterning the conductive material layer using a photolithography process, for example.

Figure 18A:
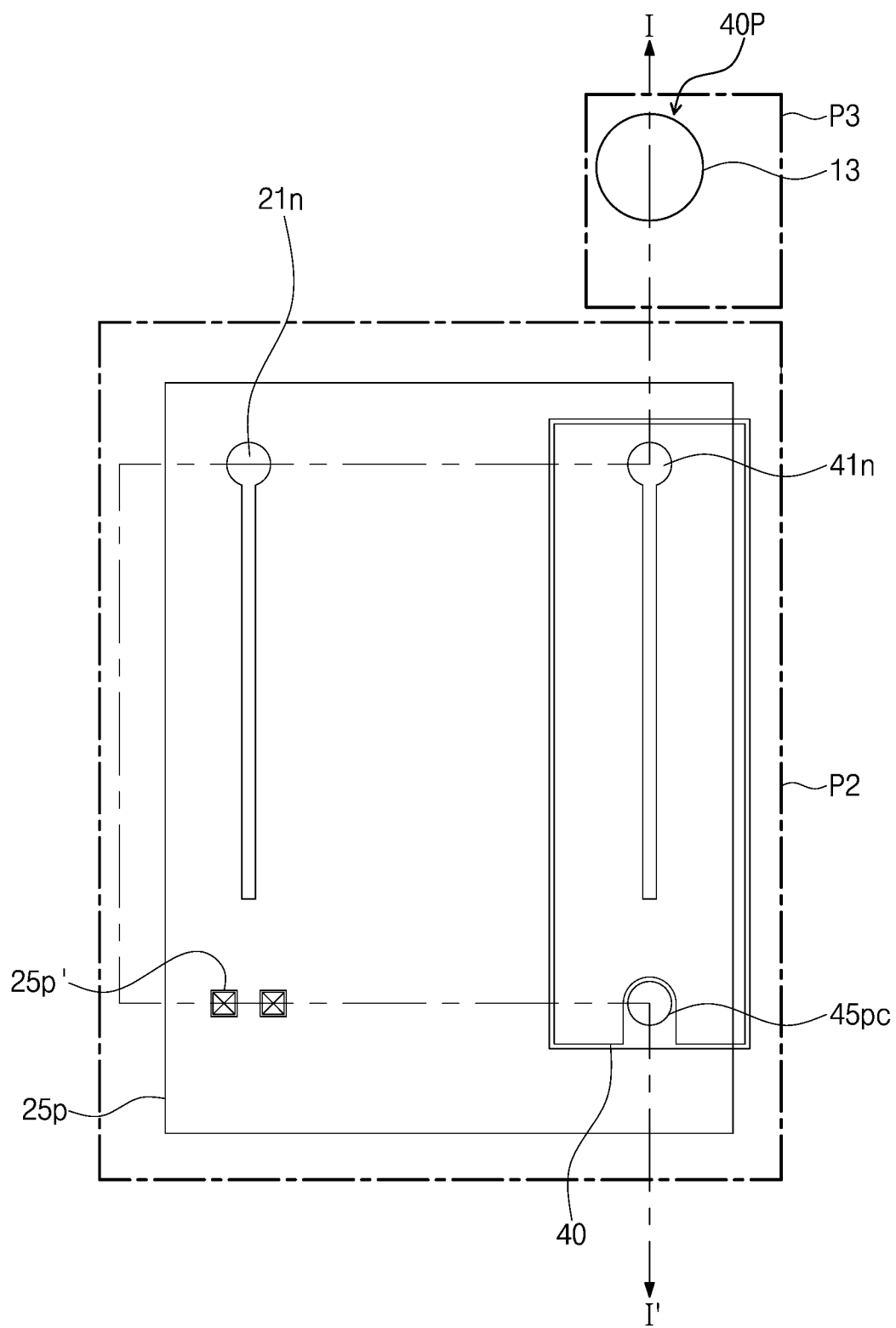
Figure 18B:
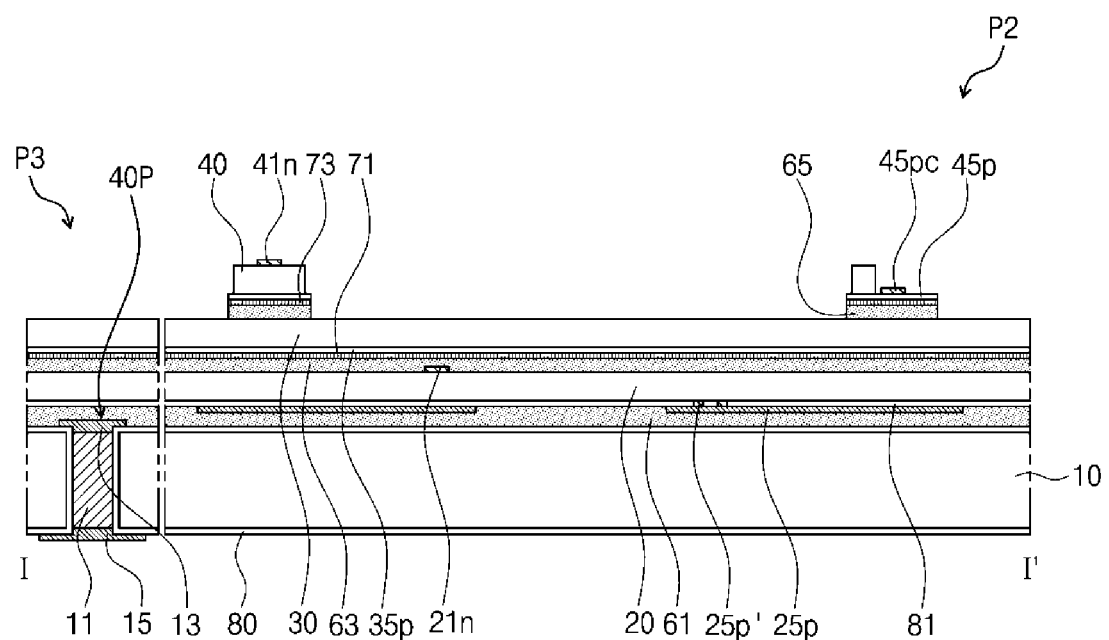

Referring to FIGS. 18A and 18B, the third p-type contact electrode layer 45p, the second wavelength pass filter 73, and the third adhesive layer 65 are removed from an area except for the area where the third epitaxial stack 40 is formed. Accordingly, the upper surface of the second epitaxial stack 30 is exposed.

The third p-type contact electrode layer 45p, the second wavelength pass filter 73, and the third adhesive layer 65 may be removed by various methods, such as the wet etch process or the dry etch process, using the photolithography process, for example.

Figure 19A:
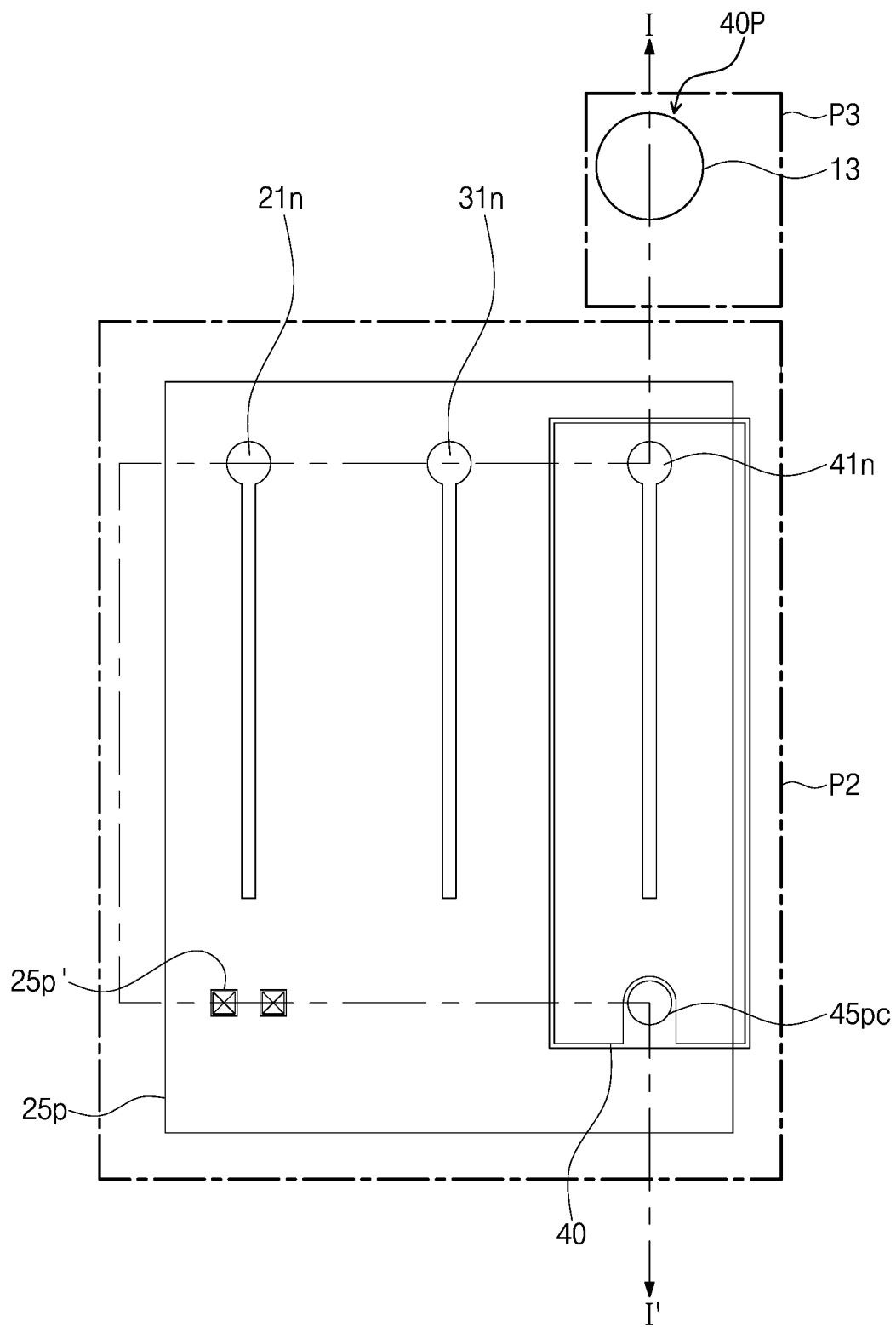
Figure 19B:
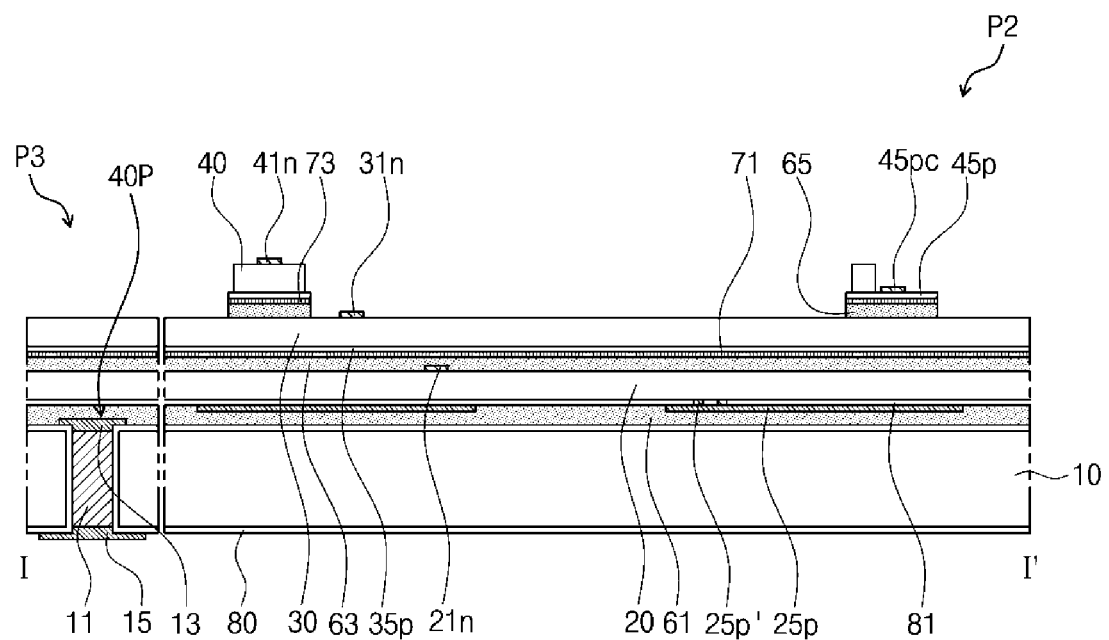

Referring to FIGS. 19A and 19B, the second n-type contact electrode 31n is formed on the exposed upper surface of the second epitaxial stack 30. The second n-type contact electrode 31n may be formed by forming a conductive material layer on the upper surface of the second epitaxial stack 30, and patterning the conductive material layer using a photolithography process, for example.

Figure 20A:
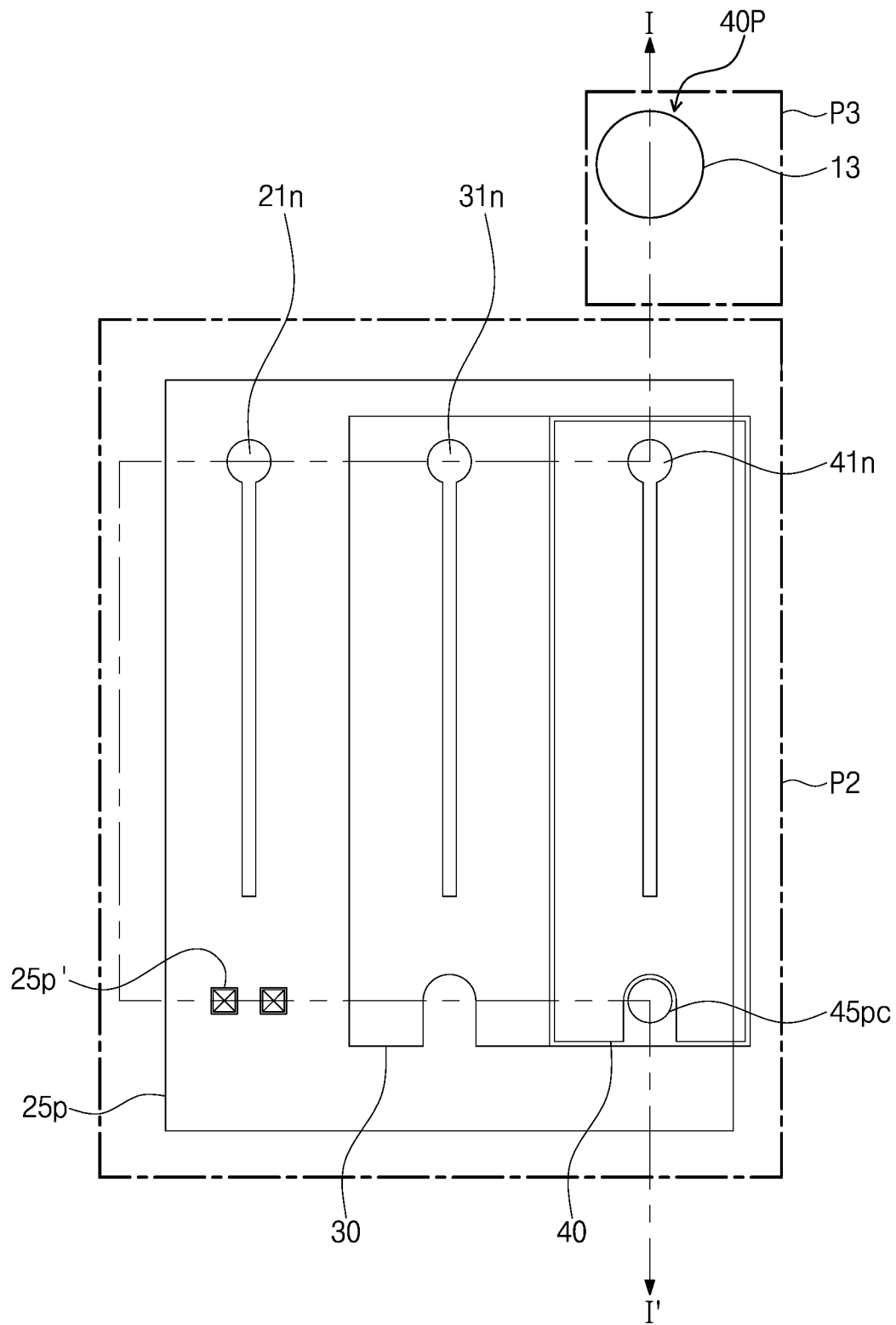
Figure 20B:
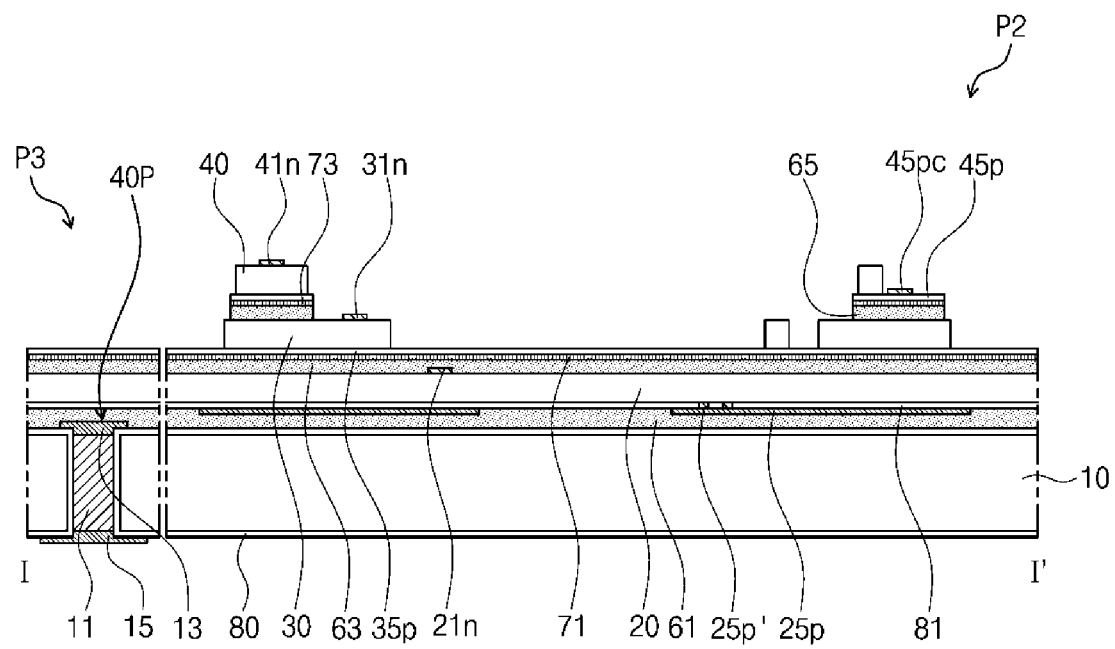

Referring to FIGS. 20A and 20B, the second epitaxial stack 30 is patterned. A portion of the second epitaxial stack 30 is removed from an area corresponding to the pixel, except for a predetermined area of the pixel, so that the second epitaxial stack 30 has the area smaller than the first epitaxial stack 20. In addition, the second epitaxial stack 30 is also removed from an area in which the second p-type contact electrode 35pc is to be formed later. The second epitaxial stack 30 may be removed by various methods, such as the wet etch process or the dry etch process, using the photolithography process, and in this case, the second p-type contact electrode layer 35p may function as an etch stopper.

Figure 21A:
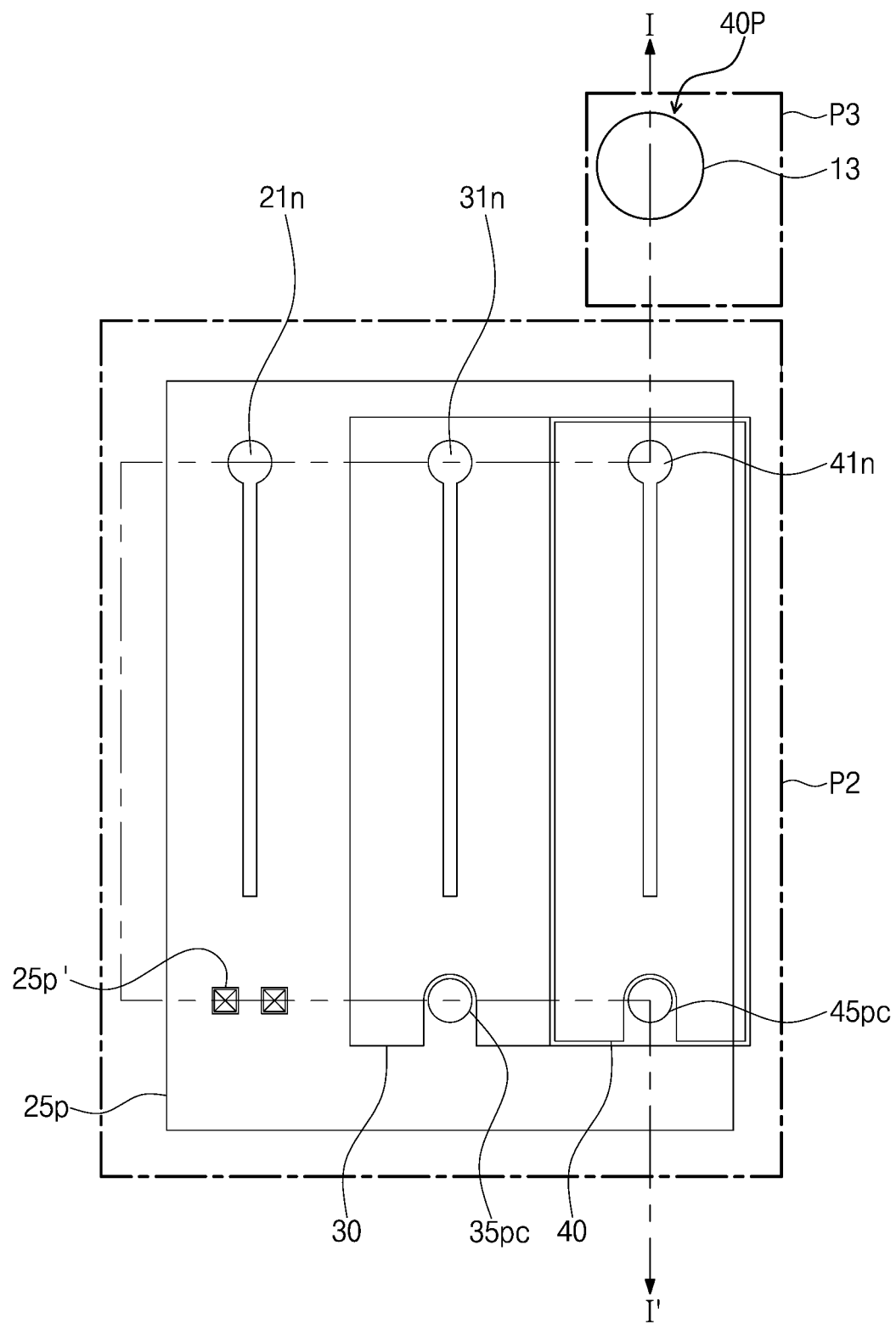
Figure 21B:
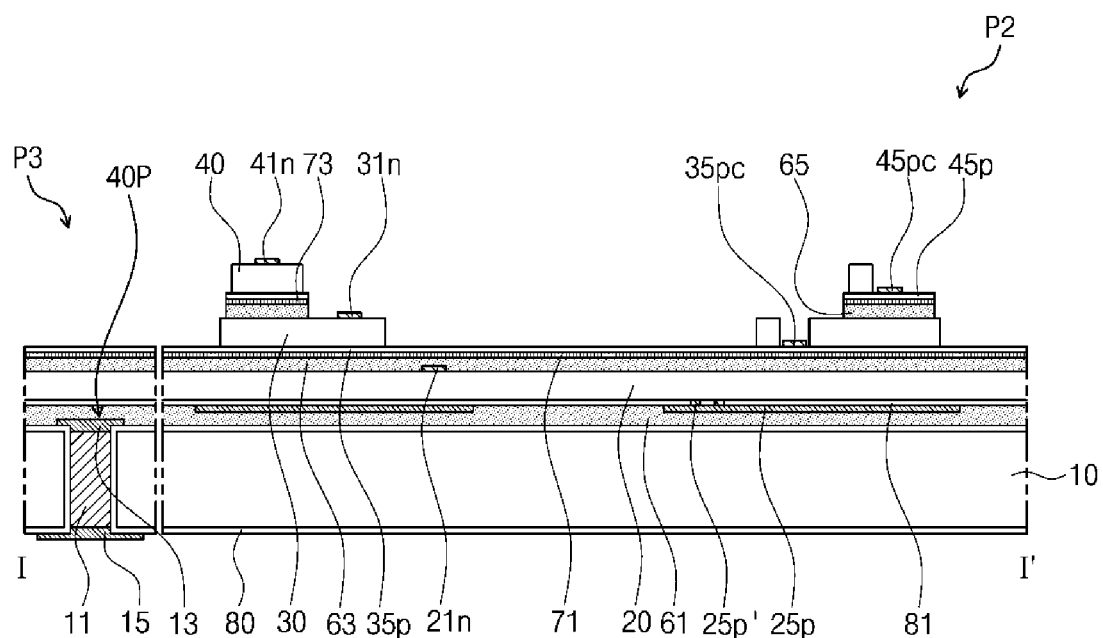

Referring to FIGS. 21A and 21B, the second p-type contact electrode 35pc is formed on the second p-type contact electrode layer 35p exposed by removing the second epitaxial stack 30. The second p-type contact electrode 35pc may be formed by forming a conductive material layer on the upper surface of the substrate 10 on which the second p-type contact electrode layer 35p is formed, and patterning the conductive material layer using a photolithography process, for example.

In the illustrated exemplary embodiment, the third n-type contact electrode 41n, the third p-type contact electrode 45pc, the second n-type contact electrode 31n, and the second p-type contact electrode 35pc may be respectively formed through a separate mask processes as described above, however the inventive concepts are not limited thereto. In particular, the third n-type contact electrode 41n is described as being formed before the third epitaxial stack 40 is patterned, the third p-type contact electrode 45pc is described as being formed after the third epitaxial stack 40 is patterned, the second n-type contact electrode 31n is described as being formed before the second epitaxial stack 30 is patterned, and the second p-type contact electrode 35pc is described as being formed after the second epitaxial stack 30 is patterned.

In some exemplary embodiments, however, the third n-type contact electrode 41n, the third p-type contact electrode 45pc, the second n-type contact electrode 31n, and the second p-type contact electrode 35pc may be substantially simultaneously formed through a single mask process after the third epitaxial stack 40 and the second epitaxial stack 30 are sequentially patterned. When the third n-type contact electrode 41n and the second n-type contact electrode 31n are formed of different materials from the third p-type contact electrode 45pc and the second p-type contact electrode 35pc, two types of contact electrodes may be formed using different masks from each other. More particularly, after the third epitaxial stack 40 and the second epitaxial stack 30 are sequentially patterned, the third n-type contact electrode 41n and the second n-type contact electrode 31n may be substantially simultaneously formed through a single mask process, and the third p-type contact electrode 45pc and the second p-type contact electrode 35pc may be substantially simultaneously formed through another single mask process.

Figure 22A:
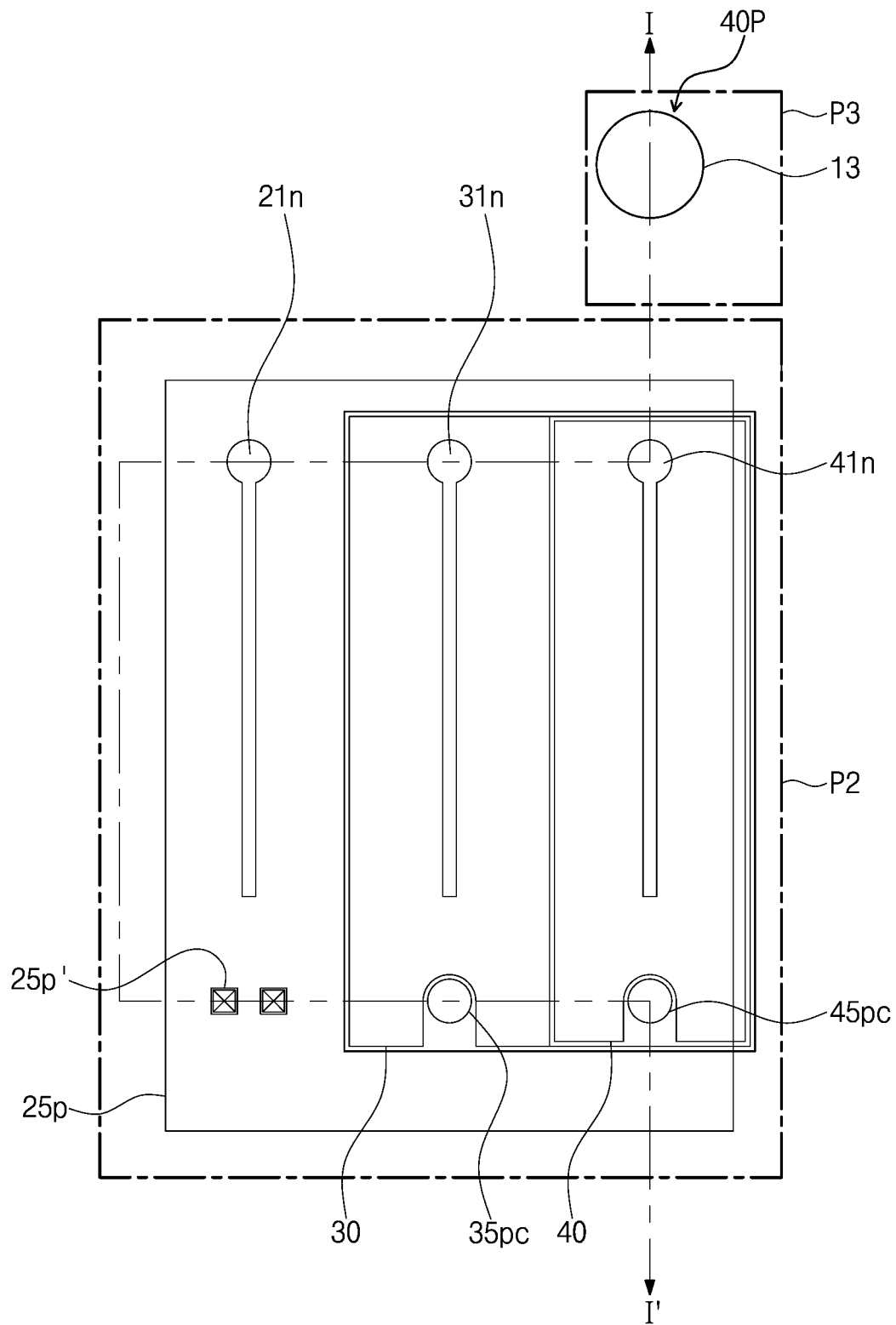
Figure 22B:
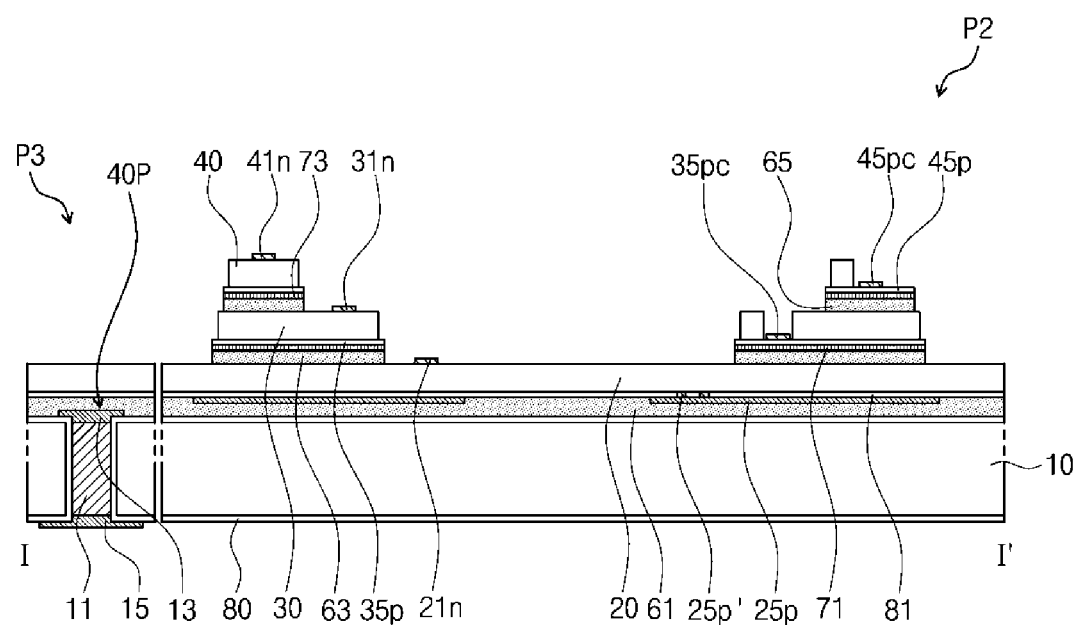

Referring to FIGS. 22A and 22B, the second p-type contact electrode layer 35p, the first wavelength pass filter 71, and the second adhesive layer 63 are removed from areas, except for the area in which the second epitaxial stack 30 is disposed. Accordingly, the upper surface of the first epitaxial stack 20 is exposed. The second p-type contact electrode layer 35p, the first wavelength pass filter 71, and the second adhesive layer 63 may be removed by various methods, such as the wet etch process or the dry etch process, using the photolithography process, for example. Through the etch process, the first n-type contact electrode 21n disposed on the upper surface of the first epitaxial stack 20 is exposed.

Figure 23A:
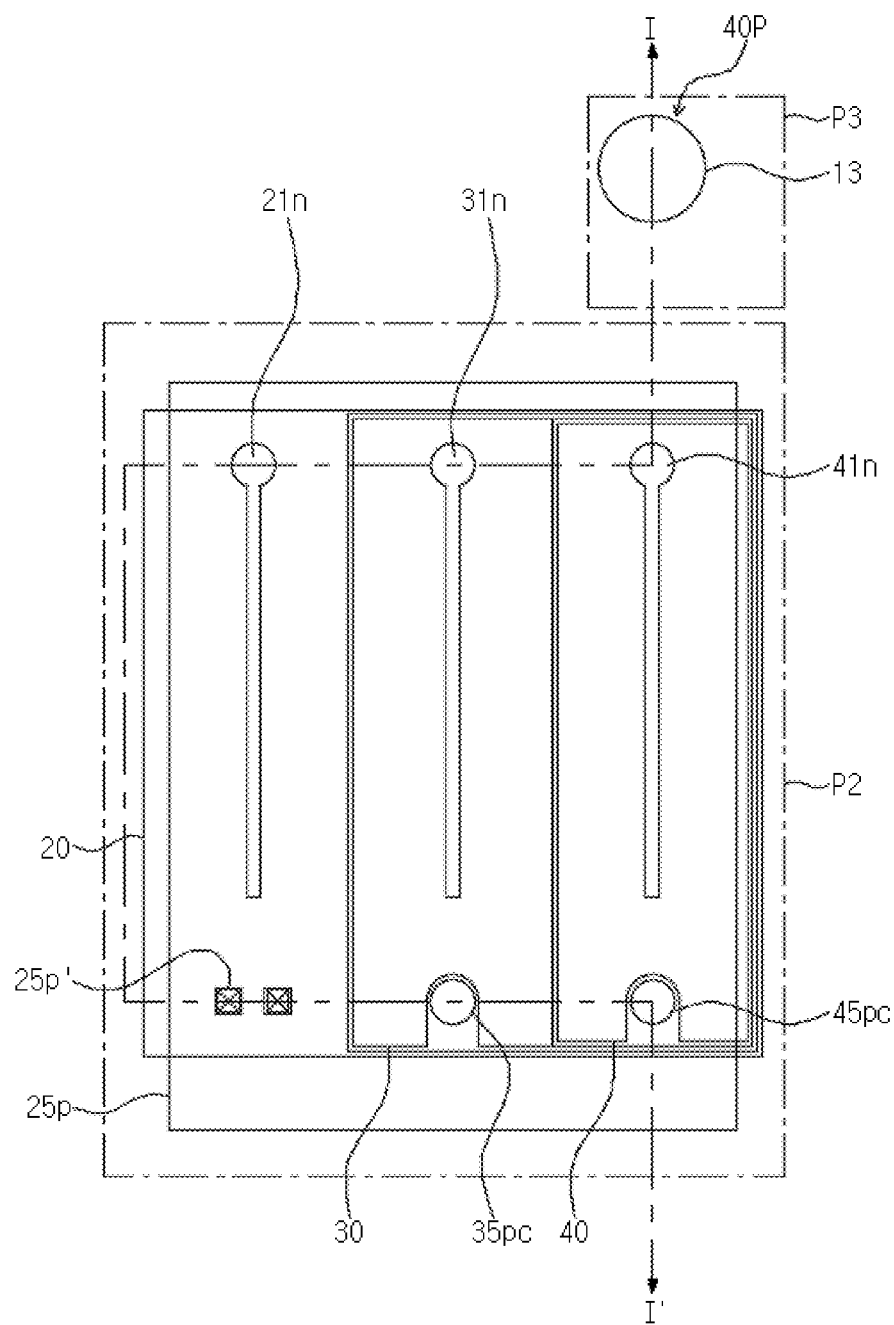
Figure 23B:
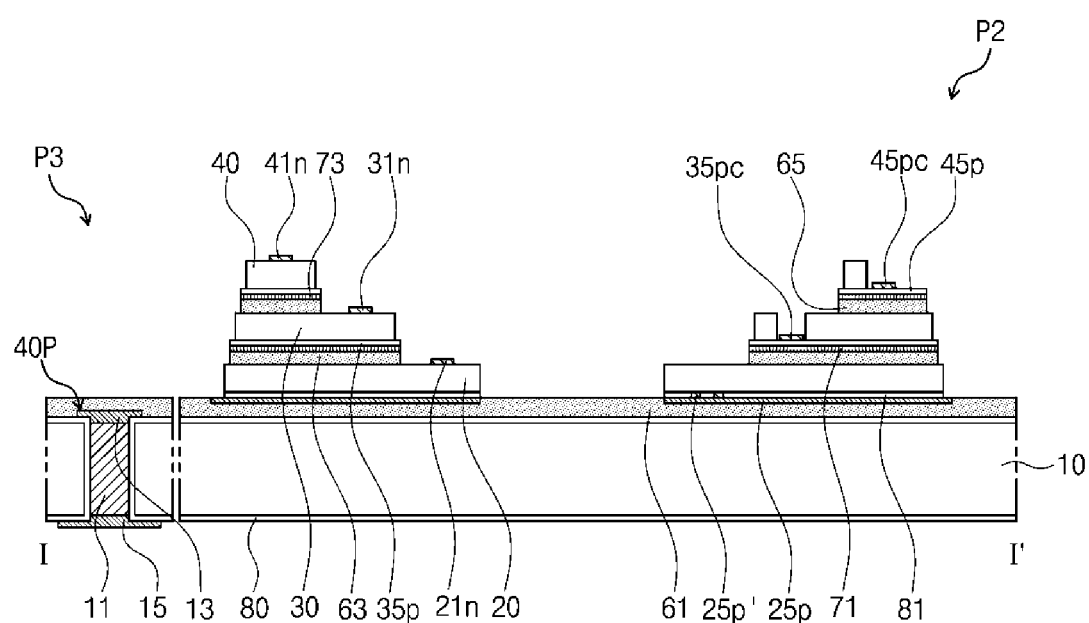

Referring to FIGS. 23A and 23B, the first epitaxial stack 20 is patterned. The first epitaxial stack 20 has the largest area since the first epitaxial stack 20 is also formed in the areas where the second and third epitaxial stacks 30 and 40 are disposed. The first epitaxial stack 20 may be removed by various methods, such as the wet etch process or the dry etch process, using the photolithography process, for example.

In this case, the first insulating layer 81 may be substantially simultaneously or additionally removed, and the upper surface of the first p-type contact electrode layer 25p, e.g., the data line, is exposed in a portion of the area where the first epitaxial stack 20 is removed.

Figure 24A:
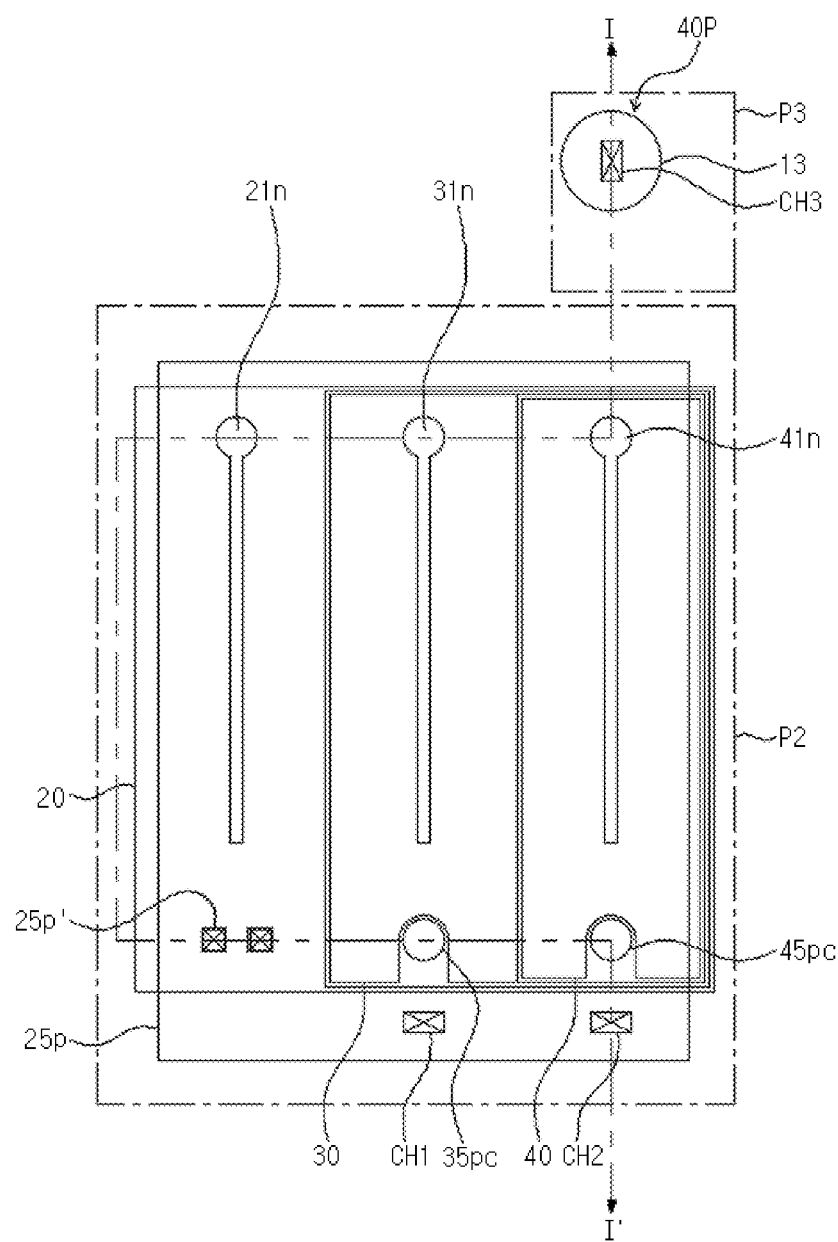
Figure 24B:
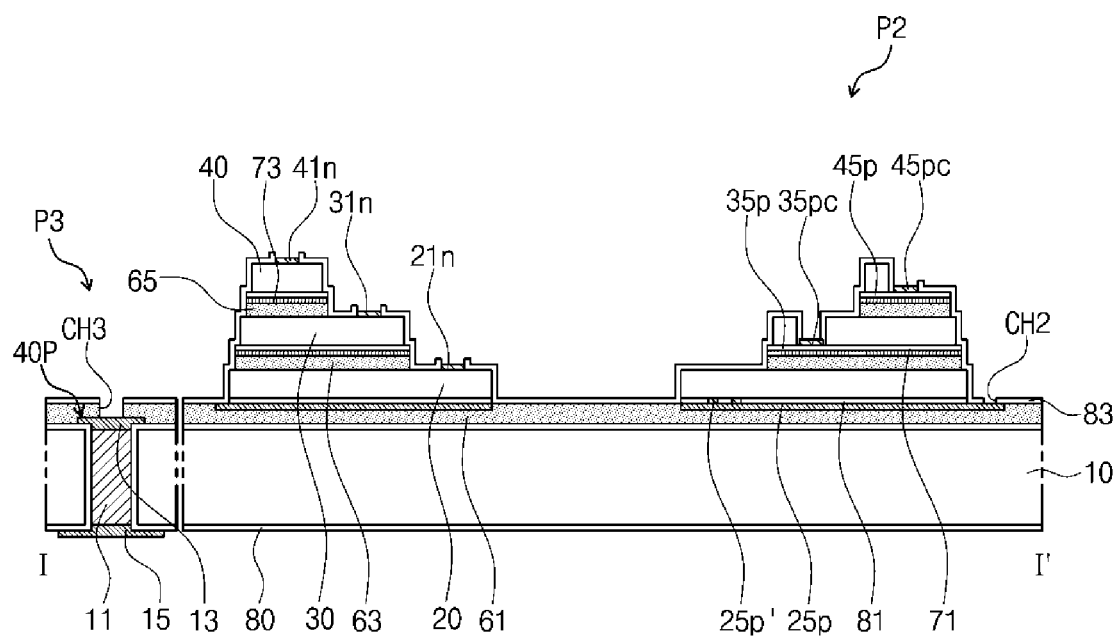

Referring to FIGS. 24A and 24B, the second insulating layer 83, through which the contact holes including first, second, and third contact holes CH1, CH2, and CH3 are defined, is formed on the patterned first, second, and third epitaxial stacks 20, 30, and 40.

The first p-type contact electrode layer 25p is exposed through the first and second contact holes CH1 and CH2, and the upper pad electrode 13 of the third pad 40P is exposed through the third contact hole CH3. The upper surfaces of the second and third p-type contact electrodes 35pc and 45pc, the first, second, and third n-type contact electrodes 21n, 31n, and 41n, the first pad 20P, the second pad 30P, and the common pad 50P are exposed through other contact holes. The second insulating layer 83 through which the contact holes are defined may be formed by a photolithography process, for example.

Figure 25A:
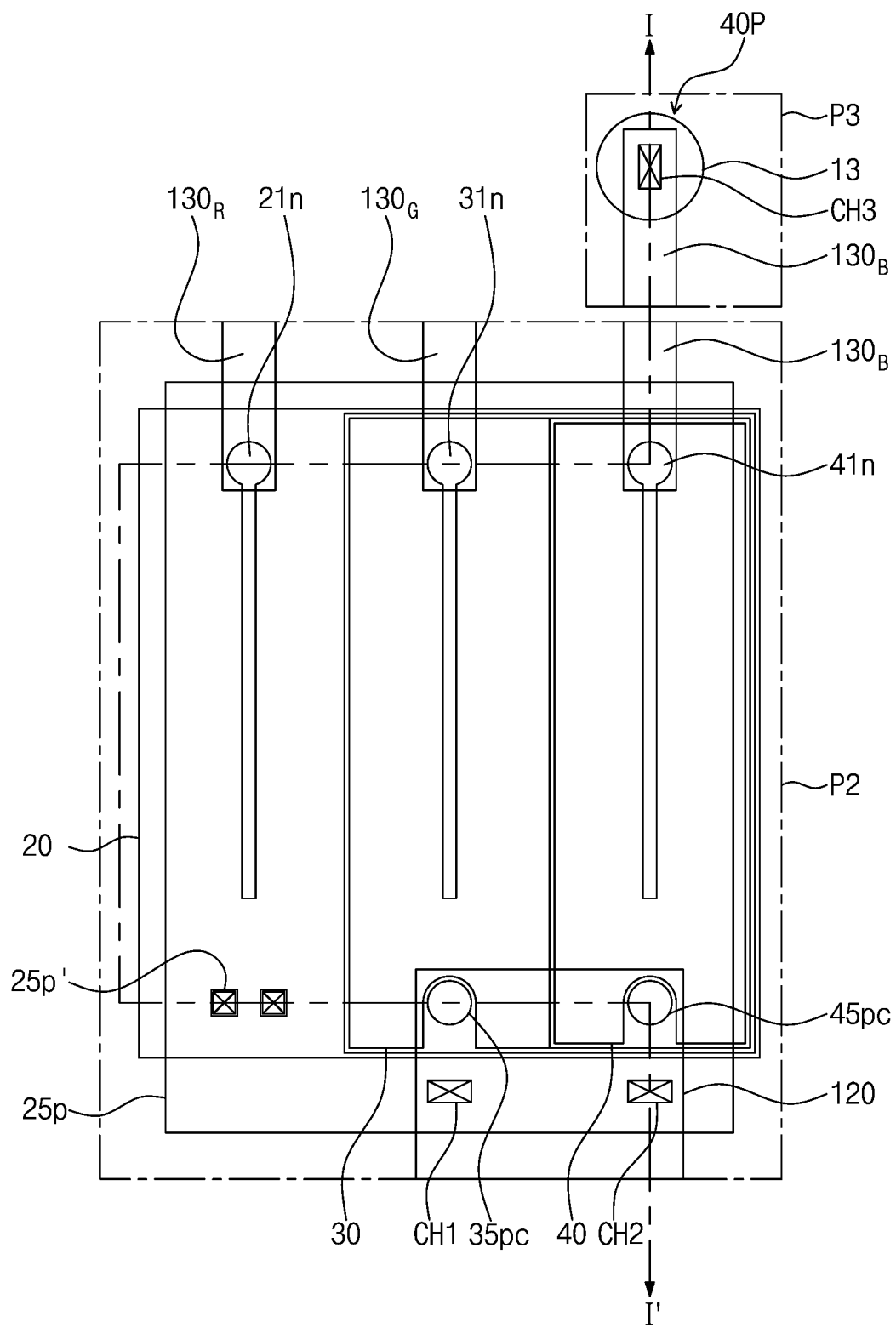
Figure 25B:
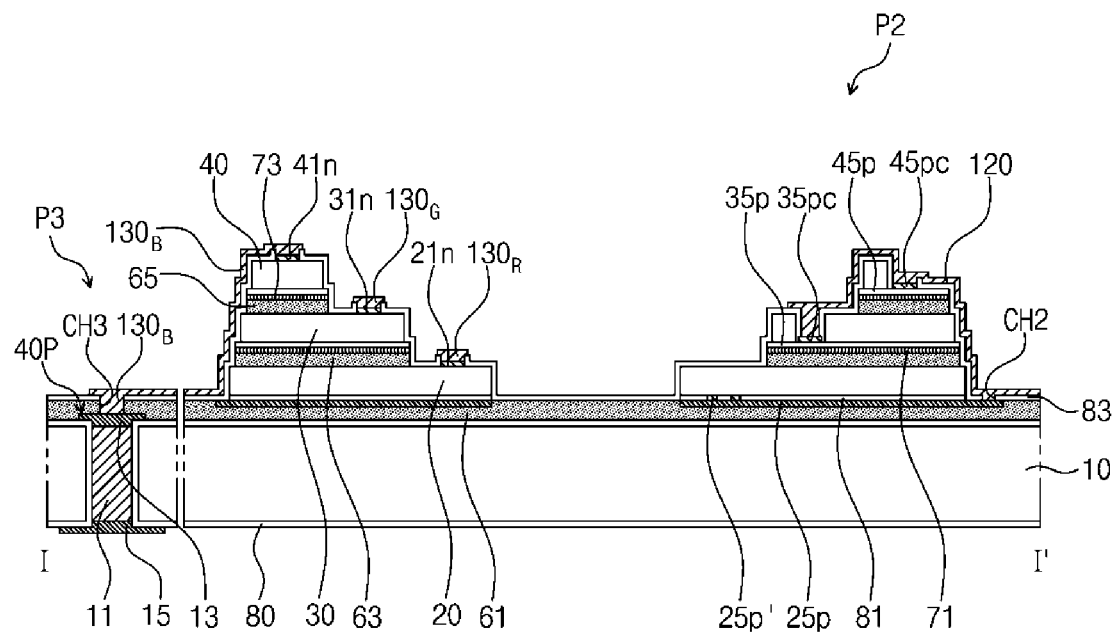

Referring to FIGS. 25A and 25B, the first, second, and third scan lines $130_R$, $130_G$, and $130_B$ and the data line 120 are formed on the second insulating layer 83. The first scan line $130_R$ is connected to the first n-type contact electrode 21n through the contact hole defined to correspond to the first n-type contact electrode 21n, and is connected to the upper pad electrode of the first pad 20P through the contact hole defined to correspond to the first pad 20P. The second scan line $130_G$ is connected to the second n-type contact electrode 31n through the contact hole defined to correspond to the second n-type contact electrode 31n, and is connected to the upper pad electrode of the second pad 30P through the contact hole defined to correspond to the second pad 30P. The third scan line $130_B$ is connected to the third n-type contact electrode 41n through the contact hole defined to correspond to the third n-type contact electrode 41n, and is connected to the upper pad electrode 13 of the third pad 40P through the contact hole defined to correspond to the third pad 40P.

The data line 120 is connected to the second and third p-type contact electrodes 35pc and 45pc through the contact holes defined to correspond to the second and third p-type contact electrodes 35pc and 45pc, and connected to the first p-type contact electrode layer 25p through the first and second contact holes CH1 and CH2 defined above the first p-type contact electrode layer 25p. The data line 120 is connected to the upper pad electrode of the common pad 50P through the contact hole defined above the common pad 50P.

According to the exemplary embodiments, the forming sequence of the first, second, and third scan lines $130_R$, $130_G$, and $130_B$ and the data line 120 are not particularly limited, and may be formed in various ways different from the above-described steps. More particularly, the first, second, and third scan lines $130_R$, $130_G$, and $130_B$ and the data line 120 are described as being formed on the second insulating layer 83 through the same process, however they may be formed in a different order. For example, the third scan line $130_B$ may be formed after the first and second scan lines $130_R$ and $130_G$ are formed through the same process, and an additional insulating layer is formed. As another example, the second scan line $130_G$ may be formed after the first and third scan lines $130_R$ and $130_B$ are formed through the same process, and the additional insulating layer is formed. In addition, the data line 120 may be formed together with any of steps of forming the first, second, and third scan lines $130_R$, $130_G$, and $130_B$.

Further, in some exemplary embodiments, the position of the contact part of each of the epitaxial stacks 20, 30, and 40 may be varied, and thus, the positions of the first, second, and third scan lines $130_R$, $130_G$, and $130_B$ and the data line 120 may also be changed.

In some exemplary embodiments, a non-light transmitting layer may be further disposed on the second insulating layer 83 in the area corresponding to the side surface of the pixel. The non-light transmitting layer may be formed by the distributed Bragg reflector (DBR) dielectric mirror, the metal reflection layer formed on the insulating layer, or the black organic polymer layer. When the metal reflection layer is used as the non-light transmitting layer, the metal reflection layer may be in the floating state and is electrically insulated from components of other pixels. The non-light transmitting layer may be formed by depositing two or more insulating layers having different refractive indices from each other. For example, the non-light transmitting layer may be formed by sequentially stacking a material having a relatively low refractive index and a material having a relatively high refractive index or by alternately stacking insulating layers having different refractive indices from each other. The materials having different refractive indices are not be particularly limited, and may include, for example, $SiO_2$ and $SiN_x$.

As described above, in the display device according to exemplary embodiments, the epitaxial stacks may be sequentially stacked, and then the contact with the line part may be substantially simultaneously formed in the epitaxial stacks.

After the light emitting stacked structures are formed on the substrate, the substrate may be cut by the pixel tile along the cutting line. The pixel tile is transferred to the base substrate, and the display device may be provided.

According to an exemplary embodiment, the pixel tile has substantially the triangular shape, however, the inventive concepts are not limited to a particular shape of the pixel tile. For example, the pixel tile may have substantially a polygonal shape or a bar shape. In particular, the pixel tile may have substantially a quadrangular shape, such as a square shape, a rectangular shape, or a lozenge shape, a pentagonal shape, or a hexagonal shape.

Figure 26A:
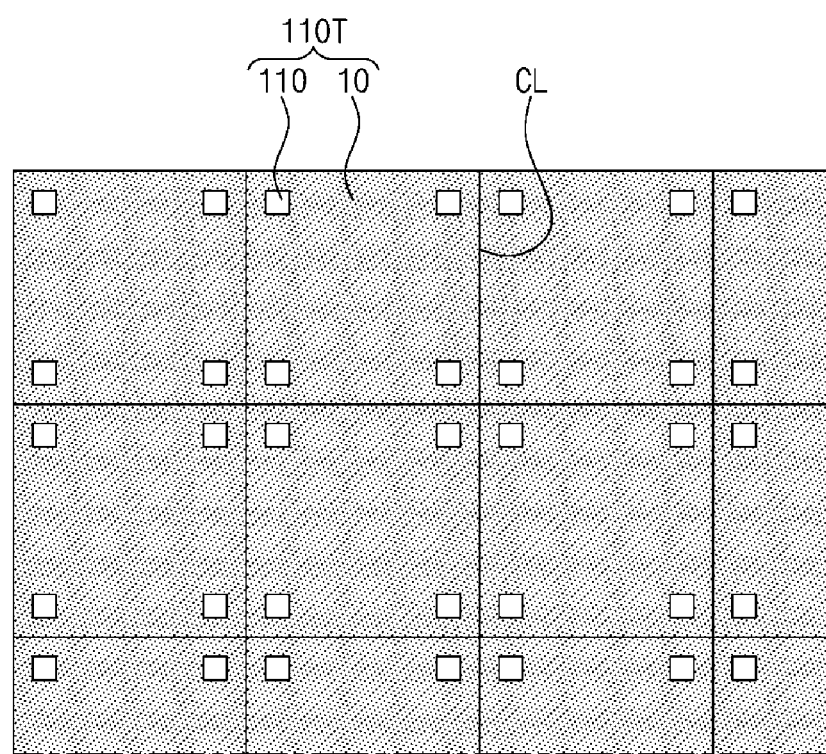
FIGS. 26A and 26B are plan views illustrating a pixel tile and a display device according to an exemplary embodiment.
Figure 26B:
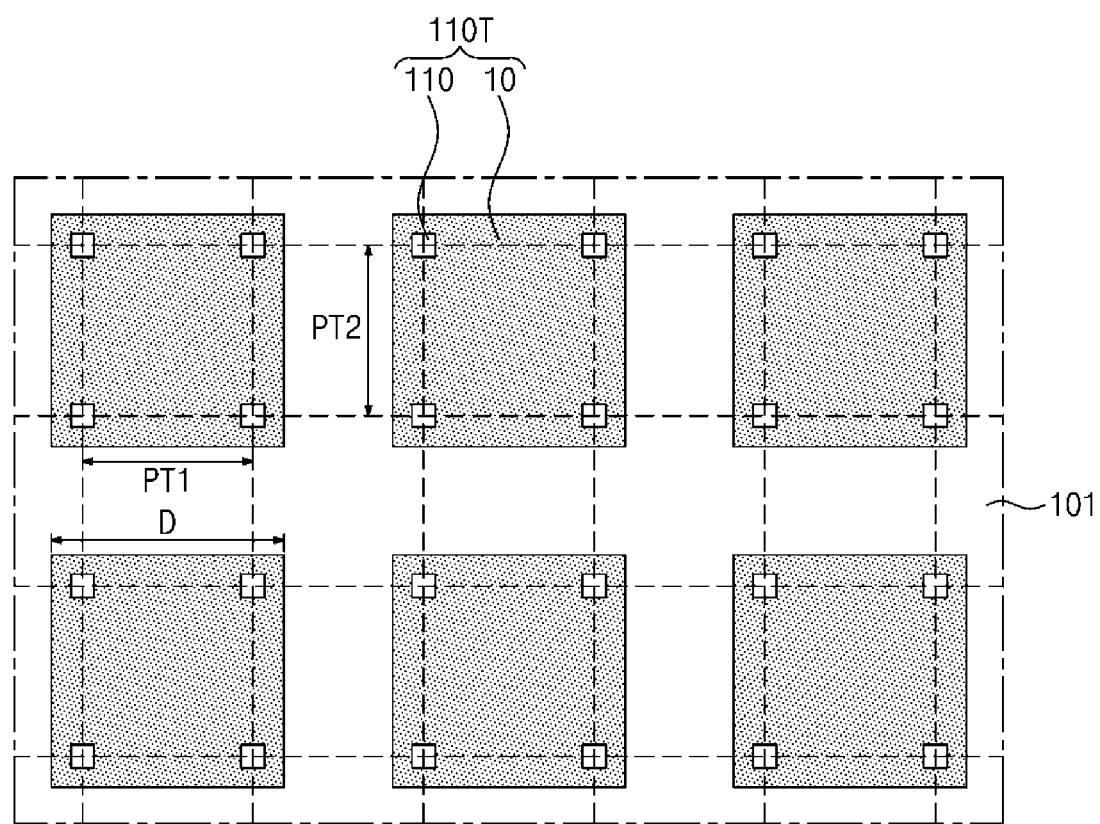
Figure 27A:
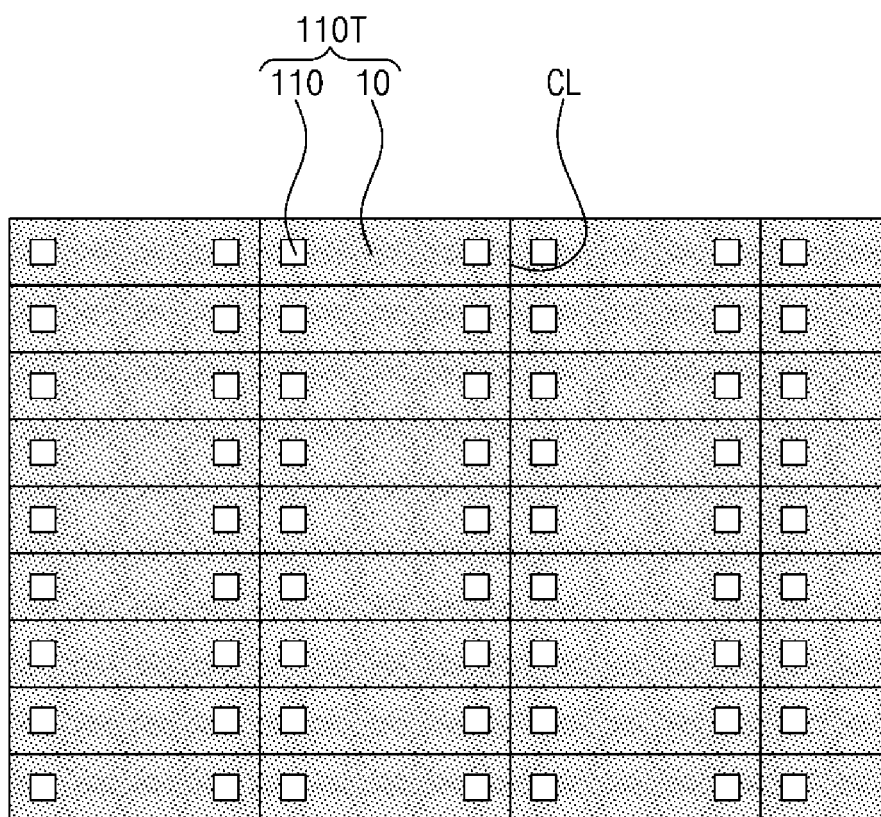
FIGS. 27A and 27B are plan views illustrating a pixel tile and a display device according to an exemplary embodiment.
Figure 27B:
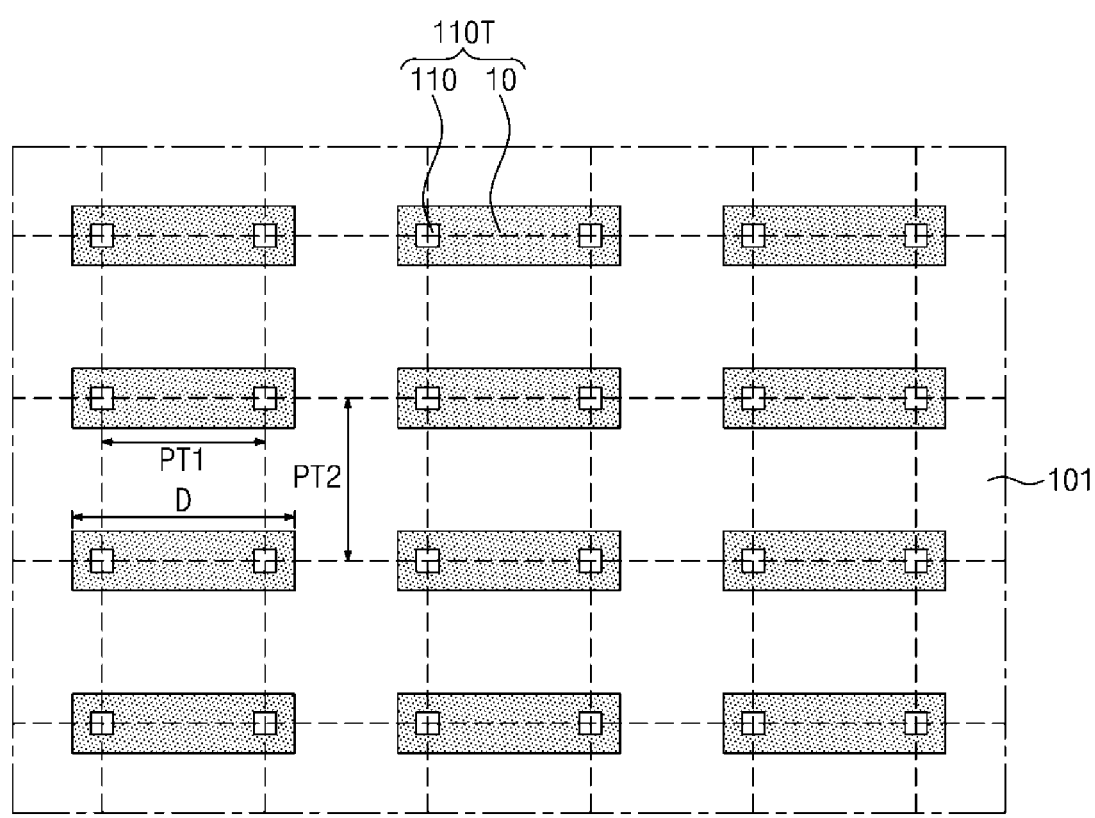

FIGS. 26A and 26B are plan views of a pixel tile and a display device according to an exemplary embodiment, respectively FIGS. 27A and 27B are plan views of a pixel tile and a display device according to another exemplary embodiment.

Referring to FIGS. 26A, 26B, 27A, and 27B, the pixels 110 may be arranged in accordance with the various shapes of the substrate 10. The pixels 110 may be arranged at positions as far as possible from a center of the substrate 10. When the substrate 10 has substantially the quadrangular shape, the pixels 110 are arranged at positions corresponding to vertices of the quadrangular shape, and when the substrate 10 has the bar shape, the pixels 110 are arranged at both ends of the bar shape. However, the inventive concepts are not limited to particular positions of the pixels 110, and the pixels 110 may be arranged at the center of the substrate 10 or other positions, in some exemplary embodiments.

The pixel tiles 110T are formed by taking into account that the pixel tiles 110T are arranged regularly on the display device. The pixel tiles 110T are arranged at a predetermined interval, such that a distance between the pixels 110 disposed on the pixel tiles 110T may be constant when the pixel tiles 110T are transferred to the base substrate 101. In FIGS. 26B and 27B, the pixels 110 are arranged to have a first pitch PT1 and a second pitch PT2 in predetermined directions, and a width D of the pixel tile 110T is greater than the first pitch PT1.

The pixel tiles 110T may have substantially the same shape and size, however, the inventive concepts are not limited thereto. For example, the display device may include two or more types of pixel tiles 110T having different shapes from each other. In this case, the pixel tiles 110T may be arranged to have the pixels 110 arranged substantially regularly arranged. As another example, the display device may include the pixel tiles 110T having substantially the same shape as each other and different sizes from each other. In this case, although the pixel tiles 110T have the different sizes from each other, the pixel tiles 110T may be arranged to have the pixels 110 arranged substantially regularly.

The imaginary cutting line CL is defined on the substrate 10, the pixel tiles 110T are separated from each other along the cutting line CL, and the separated pixel tiles 110T are transferred onto the base substrate 101 and arranged as shown in FIGS. 26B and 27B, thereby providing the display device.

In exemplary embodiments, since the pixel tiles 110T are individually transferred onto the base substrate 101, the plural pixels 110 arranged on each pixel tile 110T may be substantially simultaneously transferred when each pixel tile 110T is transferred. For instance, when four pixels 110 are disposed on the substrate 10 as shown in FIG. 26A, the number of transfer times is reduced by about ¼ of the number of transfer times of a conventional device. Further, since one light emitting stacked structure, in which the red, green, and blue pixels overlap with each other, is used as the pixel 110, the number of transfer times may be further reduced by about ⅓ of the number of transfer times of the conventional device. As shown in FIG. 27A, when two pixels 110 are disposed on the substrate 10, the number of transfer times is reduced by about ½ of the number of transfer times of the conventional device. Further, since one light emitting stacked structure, in which the red, green, and blue pixels overlap with each other, is used as the pixel 110, the number of transfer times according to an exemplary embodiment may be further reduced by about ⅓ of the number of transfer times of the conventional device.

In addition, since the pixels disposed at fixed positions of each pixel tile 110T are transferred onto the base substrate 101 by the unit of pixel tile 110T, the possibility of the pixels being misaligned on the adhesive layer and the possibility of the pixels being tilted are significantly reduced.

Figure 28:
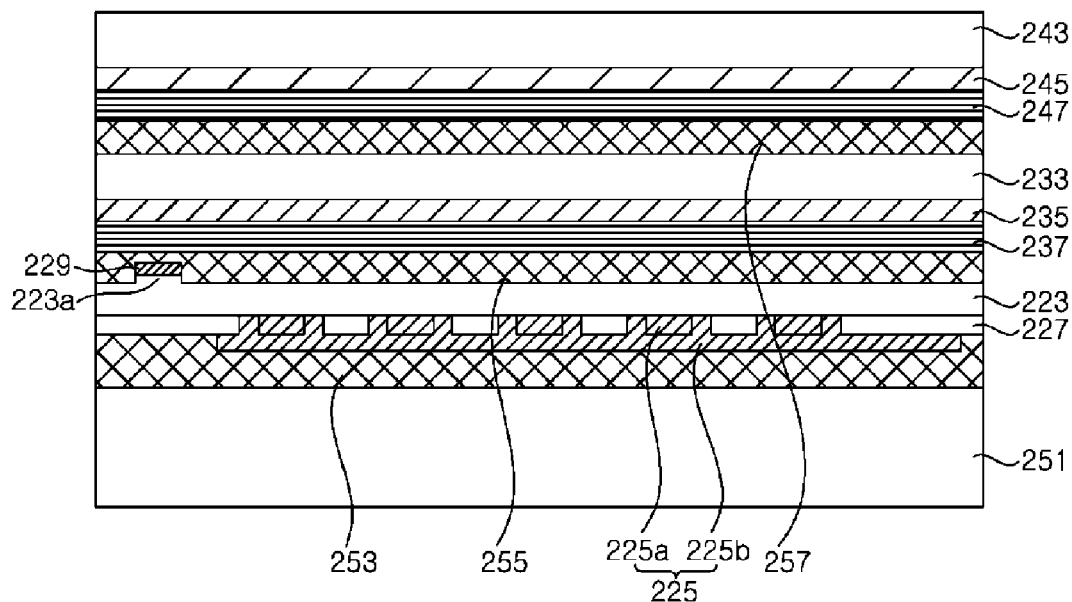
FIG. 28 is a schematic cross-sectional view of a light emitting stacked structure according to an exemplary embodiment.

FIG. 28 is a schematic cross-sectional view of a light emitting stacked structure for a display according to an exemplary embodiment.

Referring to FIG. 28, a light emitting stacked structure 2100 according to an exemplary embodiment may include a support substrate 251, a first epitaxial stack 223, a second epitaxial stack 233, a third epitaxial stack 243, a reflective electrode 225, an ohmic electrode 229, a second-p transparent electrode 235, a third-p transparent electrode 245, an insulation layer 227, a first color filter, 237, a second color filter 247, a first bonding layer 253, a second bonding layer 255, and a third bonding layer 257. In addition, the first epitaxial stack 223 may include an ohmic contact portion 223a for ohmic contact.

The support substrate 251 supports the epitaxial stacks 223, 233, and 243. The support substrate 251 may include a circuit on a surface thereof or therein, without being limited thereto. The support substrate 251 may include, for example, a glass substrate, a sapphire substrate, a Si substrate, or a Ge substrate.

Each of the first epitaxial stack 223, the second epitaxial stack 233, and the third epitaxial stack 243 includes an n-type semiconductor layer, a p-type semiconductor layer, and an active layer interposed therebetween. The active layer, in particular, may have a multi-quantum well structure in some exemplary embodiments.

According to an exemplary embodiment, the first epitaxial stack 223 may be an inorganic light emitting diode that may emit red light, the second epitaxial stack 233 may be an inorganic light emitting diode that may emit green light, and the third epitaxial stack 243 may be an inorganic light emitting diode that may emit blue light. The first epitaxial stack 223 may include a GaInP-based well layer, and each of the second epitaxial stack 233 and the third epitaxial stack 243 may include a GaInN-based well layer. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first epitaxial stack 223 may emit any one of red, green, and blue light, and the second and third epitaxial stacks 233 and 243 may emit a different one of red, green, and blue light, without adversely affecting operation, due to the small form factor of a micro LED.

Both surfaces of each of the first to third epitaxial stacks 223, 233, and 243 are an n-type semiconductor layer and a p-type semiconductor layer, respectively. In an exemplary embodiment, each of the first to third epitaxial stacks 223, 233, 243 may have an n-type semiconductor layer disposed on an upper surface thereof, and a p-type semiconductor layer disposed on a lower surface thereof. Since the third epitaxial stack 243 has an n-type upper surface, in some exemplary embodiments, a roughened surface may be formed on the upper surface of the third epitaxial stack 243 through chemical etching or the like. However, the inventive concepts are not limited thereto, and the types of semiconductor layers disposed on the upper and lower surfaces of each of the epitaxial stacks may be changed.

The first epitaxial stack 223 is disposed near the support substrate 251, the second epitaxial stack 233 is disposed on the first epitaxial stack 223, and the third epitaxial stack 243 is disposed on the second epitaxial stack 233. Since the first epitaxial stack 223 may emit light having a longer wavelength than that of the second and third epitaxial stacks 233 and 243, light generated from the first epitaxial stack 223 may be emitted outside through the second and third epitaxial stacks 233 and 243. In addition, since the second epitaxial stack 233 may emit light having a longer wavelength than that of the third epitaxial stack 243, light generated from the second epitaxial stack 233 may be emitted outside through the third epitaxial stack 243. However, the inventive concepts are not limited thereto. When the light emitting stacked structure includes a micro LED, which has a surface area less than about 10,000 square μm as known in the art, or less than about 4,000 square μm or 2,500 square μm in other exemplary embodiments, the first, second, and third epitaxial stacks 223, 233, and 243 may emit light having any wavelength, without adversely affecting operation, due to the small form factor of a micro LED.

The reflective electrode 225 is in ohmic contact with the p-type semiconductor layer of the first epitaxial stack 223 and reflects light generated from the first epitaxial stack 223.

In an exemplary embodiment, the reflective electrode 225 may include an ohmic contact layer 225a and a reflection layer 225b. The ohmic contact layer 225a partially contacts the p-type semiconductor layer of the first epitaxial stack 223. In order to prevent absorption of light by the ohmic contact layer 225a, a region in which the ohmic contact layer 225a contacts the p-type semiconductor layer may not exceed about 50% of a total area of the p-type semiconductor layer. The reflection layer 225b covers the ohmic contact layer 225a and the insulation layer 227. As shown in the drawing, the reflection layer 225b may cover the substantially the entire ohmic contact layer 225a, but it is not limited thereto, and the reflection layer 225b may cover a portion of the ohmic contact layer 225a in some exemplary embodiments.

Since the reflection layer 225b covers the insulation layer 227, an omnidirectional reflector may be formed by the stacked structure of the first epitaxial stack 223 having a relatively high refractive index and the insulation layer 227 having a relatively low refractive index, and the reflection layer 225b. The reflection layer 225b covers about 50% or more of the area of the first epitaxial stack 223 or most of the first epitaxial stack 223, thereby improving luminous efficacy.

The ohmic contact layer 225a and the reflection layer 225b may be formed of metal layers including Au. For example, the ohmic contact layer 225a may be formed of an Au—Zn alloy or an Au—Be alloy, and the reflection layer 225b may include a reflective metal layer, such as Al, Ag, or Au. In addition, the reflection layer 225b may include an adhesive metal layer of Ti, Ta, Ni, Cr, or others on upper and lower surfaces of the reflective metal layer to improve an adhesion of the reflective metal layer. Since Au has a high reflectance to red light and a low reflectance to blue and green light, luminous efficiency of the first epitaxial stack may be improved. In addition, since light generated from the second and third epitaxial stacks 233 and 243 that travel toward the support substrate 251 may be absorbed by Au, optical interference may be prevented.

In another exemplary embodiment, the reflective electrode 225 may be formed of a highly reflective ohmic contact layer in the first epitaxial stack 223. In this case, the insulation layer 227 and an additional reflection layer may be omitted. For example, the Au—Zn alloy or the Au—Be alloy may be used without an additional reflection layer because it has a relatively high reflectivity to red light while being in ohmic contact with the p-type semiconductor layer of the first epitaxial stack 223.

The insulation layer 227 is interposed between the support substrate 251 and the first epitaxial stack 223, and has openings exposing the first epitaxial stack 223. The ohmic contact layer 225a is connected to the first epitaxial stack 223 through the openings of the insulation layer 227.

The ohmic electrode 229 is disposed on an upper surface of the first epitaxial stack 223. In order to reduce ohmic contact resistance of the ohmic electrode 229, the ohmic contact portion 223a may protrude from the upper surface of the first epitaxial stack 223. The ohmic electrode 229 may be restrictively disposed on the ohmic contact portion 223a.

The second-p transparent electrode 235 is in ohmic contact with the p-type semiconductor layer of the second epitaxial stack 233. The second-p transparent electrode 235 may include a metal layer or a conductive oxide layer transparent to red light and green light.

The third-p transparent electrode 245 is in ohmic contact with the p-type semiconductor layer of the third epitaxial stack 243. The third-p transparent electrode 245 may include a metal layer or a conductive oxide layer transparent to red light, green light, and blue light.

The reflective electrode 225, the second-p transparent electrode 235, and the third-p transparent electrode 245 may assist in current spreading through ohmic contact with the p-type semiconductor layer of each of the epitaxial stacks.

A first color filter 237 may be disposed between the first epitaxial stack 223 and the second epitaxial stack 233. Also, a second color filter 247 may be disposed between the second epitaxial stack 233 and the third epitaxial stack 243. The first color filter 237 transmits light generated from the first epitaxial stack 223 and reflects light generated from the second epitaxial stack 233. The second color filter 247 transmits light generated from the first and second epitaxial stacks 223 and 233 and reflects light generated from the third epitaxial stack 243. Accordingly, light generated from the first epitaxial stack 223 may be emitted to the outside through the second epitaxial stack 233 and the third epitaxial stack 243, and light generated from the second epitaxial stack 233 may be emitted to the outside through the third epitaxial stack 243. Further, it is possible to prevent light generated from the second epitaxial stack 233 being incident on the first epitaxial stack 223 and lost, or light generated from the third epitaxial stack 243 being incident on the second epitaxial stack 233 and lost.

In some exemplary embodiments, the first color filter 237 may reflect light generated from the third epitaxial stack 243.

The first and second color filters 237 and 247 may be a low pass filter passing only a low frequency region, e.g., a long wavelength region, a band pass filter passing only a predetermined wavelength band, or a band stop filter blocking only a predetermined wavelength band. In particular, the first and second color filters 237 and 247 may include a distributed Bragg reflector DBR. The distributed Bragg reflector may be formed by alternately stacking insulating layers having different refractive indices, for example, by alternately stacking $TiO_2$ and $SiO_2$. In addition, a stop band of the distributed Bragg reflector may be controlled by adjusting the thicknesses of $TiO_2$ and $SiO_2$. The low pass filter and the band pass filter may also be formed by alternately stacking insulating layers having different refractive indices.

The first bonding layer 253 couples the first epitaxial stack 223 to the support substrate 251. As shown in the drawing, the reflective electrode 225 may adjoin the first bonding layer 253. The first bonding layer 253 may be a light transmissive or opaque layer. When the first bonding layer 253 is an opaque layer, the first bonding layer 253 may be formed of, for example, a black epoxy or a white photo-sensitive solder resistor (PSR). When the first bonding layer 253 is a light transmissive layer, the first bonding layer 253 may be formed of a transparent organic material layer or a transparent inorganic material layer. Examples of the transparent organic material layers may include SU8, poly(methyl methacrylate) PMMA, polyimide, Parylene, benzocyclobutene (BCB), or others, and examples of the transparent inorganic material layers may include $Al_2O_3$, $SiO_2$, $SiN_x$, or others. The organic material layer may be bonded in a high vacuum and high pressure, and a surface of the inorganic material layer may be flattened by, for example, a chemical mechanical polishing process, then a surface energy thereof may be controlled by using plasma or others, and may be bonded in a high vacuum. In some exemplary embodiments, the first bonding layer 253 may be formed of transparent spin-on-glass (SOG).

The second bonding layer 255 couples the second epitaxial stack 233 to the first epitaxial stack 223. As shown in the drawing, the second bonding layer 255 may adjoin the first epitaxial stack 223 and the first color filter 237. The ohmic electrode 229 may be covered with the second bonding layer 255. The second bonding layer 255 transmits light generated from the first epitaxial stack 223.

The third bonding layer 257 couples the third epitaxial stack 243 to the second epitaxial stack 233. As shown in the drawing, the third bonding layer 257 may adjoin the second epitaxial stack 233 and the second color filter 247. However, the inventive concepts are not limited thereto, and a transparent conductive layer may be disposed on the second epitaxial stack 233. The third bonding layer 257 transmits light generated from the first epitaxial stack 223 and the second epitaxial stack 233.

The second bonding layer 255 and the third bonding layer 257 may be formed of substantially the same materials as the first bonding layer 253, and thus, detailed descriptions thereof will be omitted to avoid redundancy.

FIGS. 29A, 29B, 29C, 29D, and 29E are schematic cross-sectional views illustrating a method of manufacturing a light emitting stacked structure for display according to an exemplary embodiment.

Figure 29A:
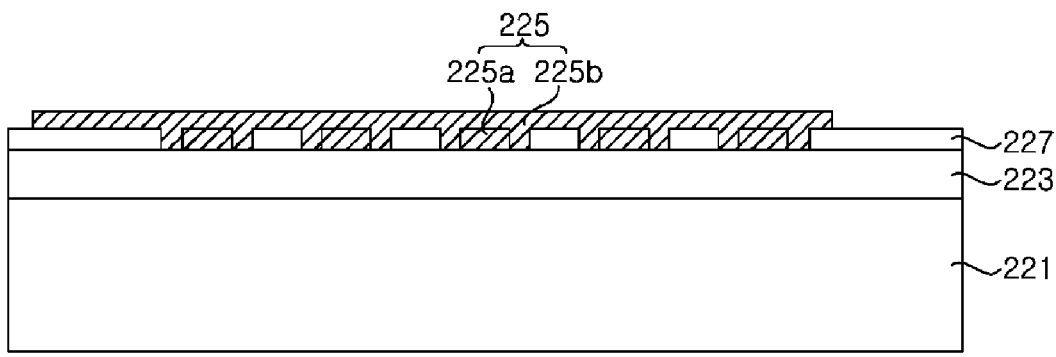
FIGS. 29A, 29B, 29C, 29D, and 29E are schematic cross-sectional views illustrating a method of manufacturing a light emitting stacked structure.

Referring to FIG. 29A, first, a first epitaxial stack 223 is grown on a first substrate 221. The first substrate 221 may be, for example, a GaAs substrate. In addition, the first epitaxial stack 223 may be formed of AlGaInP-based semiconductor layers, and includes an n-type semiconductor layer, an active layer, and a p-type semiconductor layer.

An insulation layer 227 is formed on the first epitaxial stack 223, and is subjected to patterning to form opening(s). For example, a $SiO_2$ layer is formed on the first epitaxial stack 223, and a photoresist is deposited onto the $SiO_2$ layer, followed by photolithography and development to form a photoresist pattern. Then, the $SiO_2$ layer is subjected to patterning through the photoresist pattern used as an etching mask, thereby forming the insulation layer 227 having the opening(s).

Thereafter, an ohmic contact layer 225a is formed in the opening(s) of the insulation layer 227. The ohmic contact layer 225a may be formed by a lift-off process or the like. After the ohmic contact layer 225a is formed, a reflection layer 225b is formed to cover the ohmic contact layer 225a and the insulation layer 227. The reflection layer 225b may be formed by a lift-off process or the like. The reflection layer 225b may cover a portion of the ohmic contact layer 225a or the entirety thereof, as shown in the drawings. The ohmic contact layer 225a and the reflection layer 225b form a reflective electrode.

Although the ohmic contact layer 225a and the reflection layer 225b are described as being formed by separate processes, in some exemplary embodiments, an ohmic reflection layer having ohmic characteristics and reflective properties, such as Au—Zn or Au—Be alloy, may be formed directly on the first epitaxial stack 223.

The reflective electrode 225 is in ohmic contact with a p-type semiconductor layer of the first epitaxial stack 223, and thus, hereinafter will be referred to as a first-p reflective electrode 225.

Figure 29B:
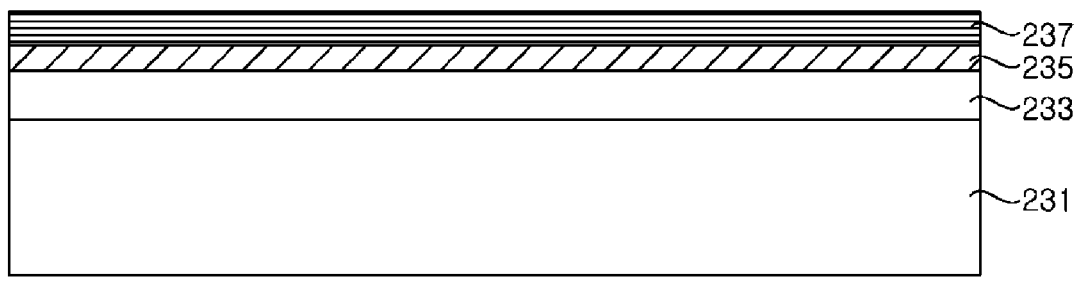

Referring to FIG. 29B, a second epitaxial stack 233 is grown on a second substrate 231, and a second-p transparent electrode 235 and a first color filter 237 are formed on the second epitaxial stack 233. The second epitaxial stack 233 may be formed of GaN-based semiconductor layers, and may include a GaInN well layer. The second substrate 231 is a substrate capable of growing GaN-based semiconductor layers thereon, and may be different from the first substrate 221. A composition ratio of GaInN for the second epitaxial stack 233 may be determined for the second epitaxial stack 233 to emit green light, for example. The second-p transparent electrode 235 is in ohmic contact with the p-type semiconductor layer.

Figure 29C:
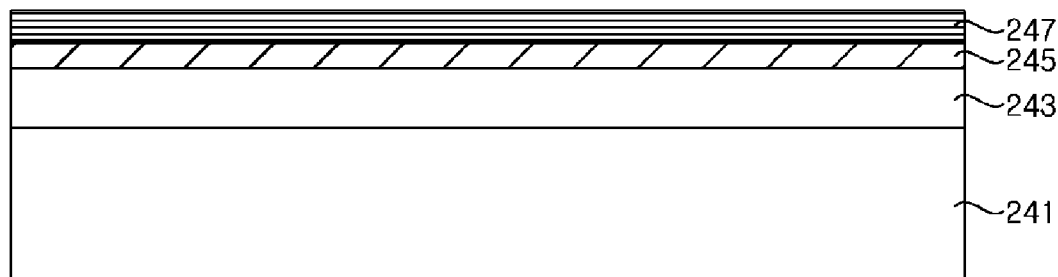

Referring to FIG. 29C, a third epitaxial stack 243 is grown on a third substrate 241, and a third-p transparent electrode 245 and a second color filter 247 are formed on the third epitaxial stack 243. The third epitaxial stack 243 may be formed of GaN-based semiconductor layers, and may include a GaInN well layer. The third substrate 241 is a substrate capable of growing GaN-based semiconductor layers thereon, and may be different from the first substrate 221. A composition ratio of GaInN for the third epitaxial stack 243 may be determined for the third epitaxial stack 243 to emit blue light, for example. The third-p transparent electrode 245 is in ohmic contact with the p-type semiconductor layer of the third epitaxial stack 243.

Since the first color filter 237 and the second color filter 247 are substantially the same as those described with reference to FIG. 28, detailed descriptions thereof will be omitted to avoid redundancy.

As the first epitaxial stack 223, the second epitaxial stack 233, and the third epitaxial stack 243 are grown on different substrates, the formation sequence thereof is not limited to a particular sequence.

Figure 29D:
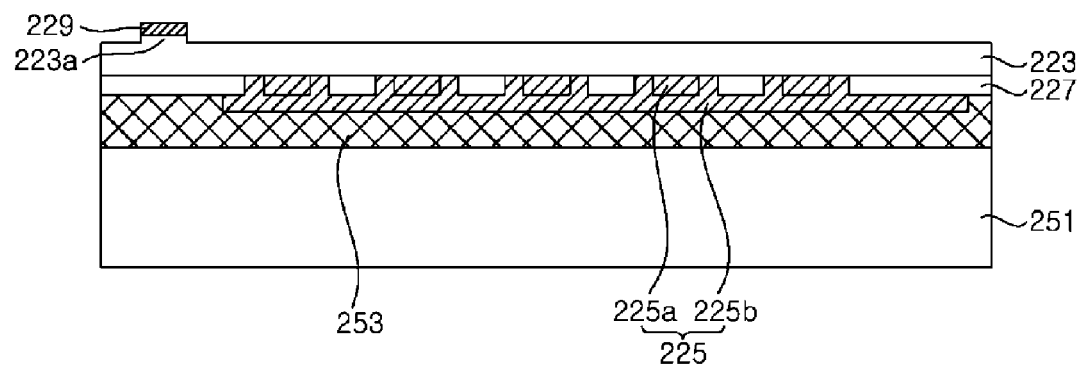

Subsequently, referring to FIG. 29D, the first epitaxial stack 223 is coupled to the support substrate 251 via a first bonding layer 253. The reflective electrode 225 may be disposed to face the support substrate 251 and may be bonded to the first bonding layer 253. Furthermore, when a surface of the reflective electrode 225 or a surface of the support substrate 251 is hydrophobic, a hydrophilic material layer may be previously formed on these surfaces.

The hydrophilic material layer may be formed, for example, by depositing the hydrophilic material layer on the hydrophobic surface, or by forming a modified layer on the hydrophobic surface through a treatment, such as plasma. The first substrate 221 is removed from the first epitaxial stack 223 using a chemical etching technique or the like. Accordingly, an n-type semiconductor layer of the first epitaxial stack 223 is exposed on an upper surface. In some exemplary embodiments, a roughened surface may be formed on the exposed surface of the n-type semiconductor layer by surface texturing or the like.

Then, an ohmic electrode 229 is formed in an exposed region of the first epitaxial stack 223. In order to reduce ohmic contact resistance of the ohmic electrode 229, the ohmic electrode 229 may be subjected to heat treatment. The ohmic electrode 229 may be formed in each pixel region so as to correspond to pixel regions.

Figure 29E:
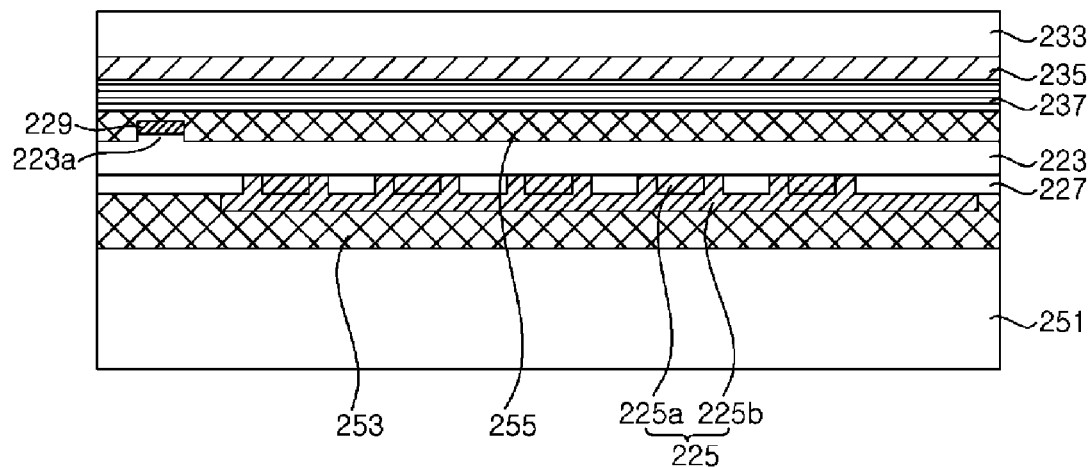

Referring to FIG. 29E, the second epitaxial stack 233 is coupled to the first epitaxial stack 223, on which the ohmic electrode 229 is formed, via a second bonding layer 255. The first color filter 237 is disposed to face the first epitaxial stack 223 and is bonded to the second bonding layer 255. Furthermore, when a surface of the first color filter 237 or a surface of the first epitaxial stack 223 is hydrophobic, a hydrophilic material layer may be previously formed on the hydrophobic surface. The second substrate 231 may be separated from the second epitaxial stack 233 using techniques, such as laser lift-off or chemical lift-off.

Then, referring to FIG. 28 and FIG. 29C, the third epitaxial stack 243 of FIG. 29C is coupled to the second epitaxial stack 233 via a third bonding layer 257. The second color filter 247 is disposed to face the second epitaxial stack 233 and is bonded to the third bonding layer 257. In some exemplary embodiments, a hydrophilic material layer may be added to a surface of the second color filter 247 or the second epitaxial stack 233. The third substrate 241 may be separated from the third epitaxial stack 243 by a laser lift-off or a chemical lift-off process. As such, the light emitting stacked structure 2100 for a display is provided, which has the n-type semiconductor layer of the third epitaxial stack 243 exposed to the outside as shown in FIG. 28.

A display apparatus may be provided by patterning the stack of the first to third epitaxial stacks 223, 233, and 243 on the support substrate 251 in pixel units, followed by connecting the first to third epitaxial stacks to one another through interconnections.

Figure 30:
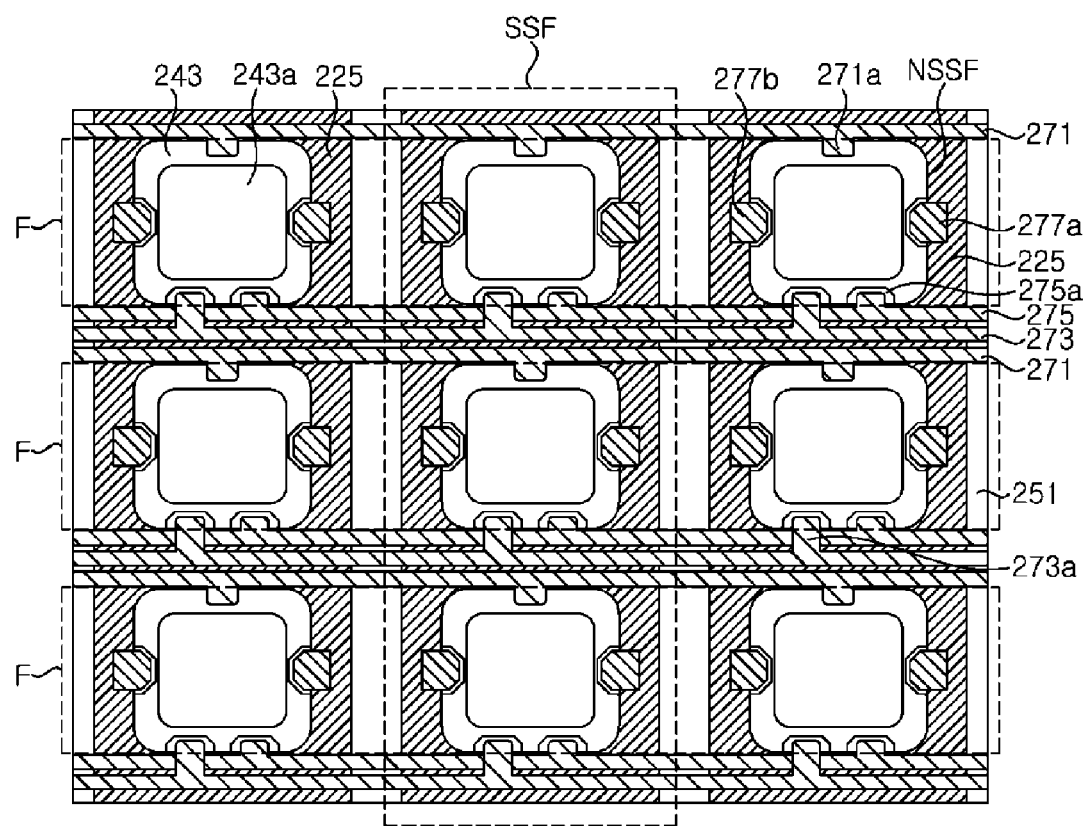
FIG. 30 is a schematic plan view of a display apparatus according to an exemplary embodiment.
Figure 31:
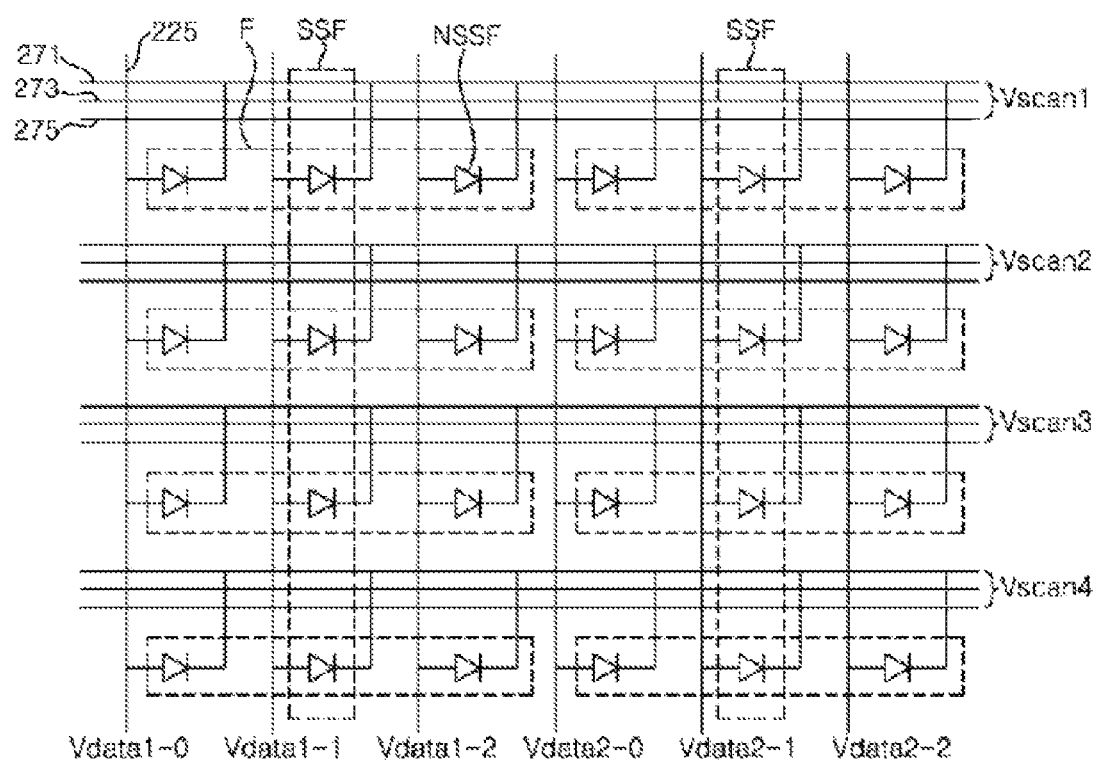
FIG. 31 is a circuit diagram of the display apparatus of FIG. 30 according to an exemplary embodiment.

FIG. 30 is a schematic plan view of a display apparatus according to an exemplary embodiment. FIG. 31 is a schematic circuit diagram of a display apparatus according to an exemplary embodiment.

Referring to FIG. 30 and FIG. 31, a plurality of light emitting stacked structures arranged substantially in a matrix form are disposed on the support substrate 251. One unit region of a repeated structure in FIG. 30 may have a stacked structure of the first to third epitaxial stacks 223, 233, and 243 according to exemplary embodiments, each stacked structure is illustrated as one diode in FIG. 31. However, since the light emitting stacked structure 2100 for a display shown in FIG. 28 has the structure of the first to third epitaxial stacks 223, 233, and 243 stacked in the vertical direction, each of the diodes shown in FIG. 31 represents three diodes in which the first epitaxial stack 223, the second epitaxial stack 233 and the third epitaxial stack 243 are stacked in the vertical direction. The first to third epitaxial stacks 223, 233, and 243 may correspond to subpixels, respectively, which emit light, and thus, the stacked structure of the subpixels may be referred to as the light emitting stacked structure.

As shown in FIG. 30, the light emitting stacked structures have substantially the same structure and are arranged substantially in the matrix form on the substrate 251 or a display panel. As shown in FIG. 31, the plurality of light emitting stacked structures are arranged in one pixel region F, and during operation, some of these light emitting stacked structures are driven while the remaining non-selected light emitting stacked structures are not driven and maintain idle states. Hereinafter, the light emitting stacked structure that is driven is referred to as a "selected light emitting stacked structure SSF", and the remaining light emitting stacked structures maintaining idle states are referred to as a "non-selected light emitting stacked structure NSSF."

Referring to FIG. 31, the pixel region F may correspond to a minimum area defined to implement an image, and the plurality of light emitting stacked structures are arranged in this region. In addition, one of the light emitting stacked structures arranged in one pixel region F is selected and driven, and the selected light emitting stacked structure SSF covers the corresponding pixel region.

In particular, currents are supplied to data lines (Vdata1-1, Vdata2-1, . . . ) and scan lines (Vscan1, Vscan2, Vscan3, . . . ) connected to the selected light emitting stacked structure SSF. Data lines (Vdata1-0, Vdata1-2) connected to the non-selected light emitting stacked structures NSSF are disconnected from the current supply, so that the non-selected light emitting stacked structures NSSF maintain idle states during the operation of the display apparatus.

In an exemplary embodiment, since three light emitting stacked structures in 1×3 matrix are arranged in one pixel region F, three data lines are connected for each pixel region F. Accordingly, data lines Vdata1-0, Vdata1-1, and Vdata1-2 are shown to represent data lines corresponding to the respective pixel regions F. "Vdata1" represents a data line connected to pixel regions F in the first set of columns. Similarly, data lines connected to pixel regions F in the second set of columns are represented by Vdata2, and light emitting stacked structures within each pixel region F in the second set of columns are connected to data lines Vdata2-0, Vdata2-1, and Vdata2-2, respectively. However, the inventive concepts are not limited to particular number of the light emitting stacked structures in one pixel region F, and in some exemplary embodiments, the number of the light emitting stacked structures may be varied.

Each of scan lines Vscan1, Vscan2, Vscan3 includes a set of three auxiliary scan lines 271, 273, and 275. Each of the first to third epitaxial stacks 223, 233, and 243 in one light emitting stacked structure may be connected to different auxiliary scan lines 271, 273, and 275, respectively. The data lines may be formed as an interconnection line 225.

In an exemplary embodiment, the first to third epitaxial stacks 223, 233, and 243 of the selected light emitting stacked structure SSF are commonly connected to a data line 225, and are connected to the different auxiliary scan lines 271, 273, and 275, respectively. Accordingly, the first to third epitaxial stacks 223, 233, and 243 in the selected light emitting stacked structure SSF may be independently driven, and display a required color.

Although anodes of the first to third epitaxial stacks 223, 233, and 243 are described as being commonly connected to the data line 225, and cathodes thereof are described as being connected to the different auxiliary scan lines, respectively, the inventive concepts are not limited thereto. For example, the anodes of the first to third epitaxial stacks 223, 233, and 243 may be connected to the different scan lines, respectively, and the cathodes may be commonly connected to the data lines.

Each of the first to third epitaxial stacks 223, 233, and 243 may be driven by pulse width modulation or by changing the magnitude of electric current to control the brightness of each subpixel.

Referring back to FIG. 30, a plurality of pixels is formed by patterning the epitaxial stacks described with reference to FIG. 28, and each of the pixels is connected to the reflective electrodes 225 and interconnection lines 271, 273, and 275. As shown in FIG. 31, the reflective electrode 225 may be used as the data line Vdata, and the interconnection lines 271, 273, and 275 may be formed as the scan lines.

Subpixel stacks (or light emitting stacked structures) may be arranged substantially in a matrix form, and the plurality of light emitting stacked structures may be arranged in one pixel region F.

Figure 32:
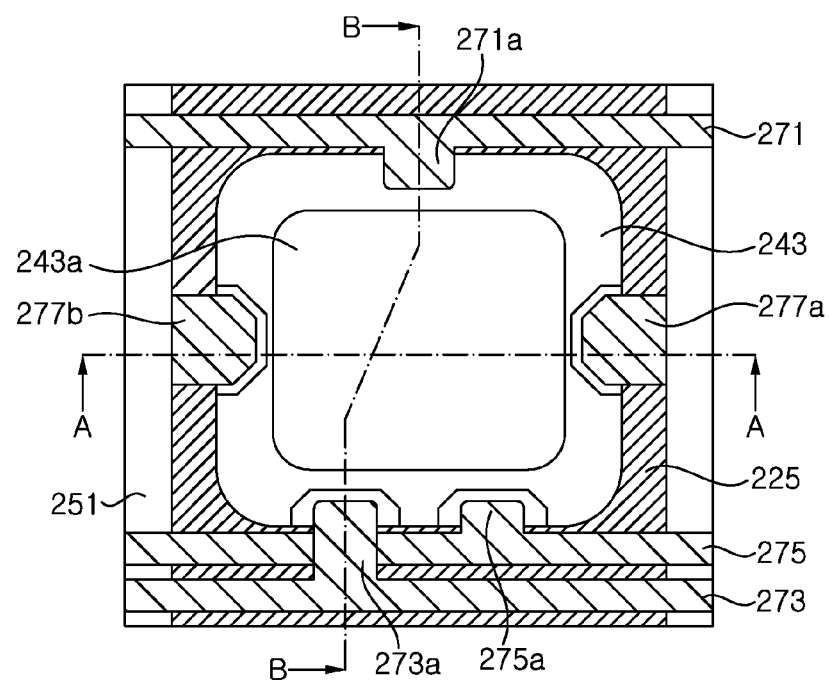
FIG. 32 is an enlarged plan view of one light emitting stacked structure of the display apparatus of FIG. 30.
Figure 33:
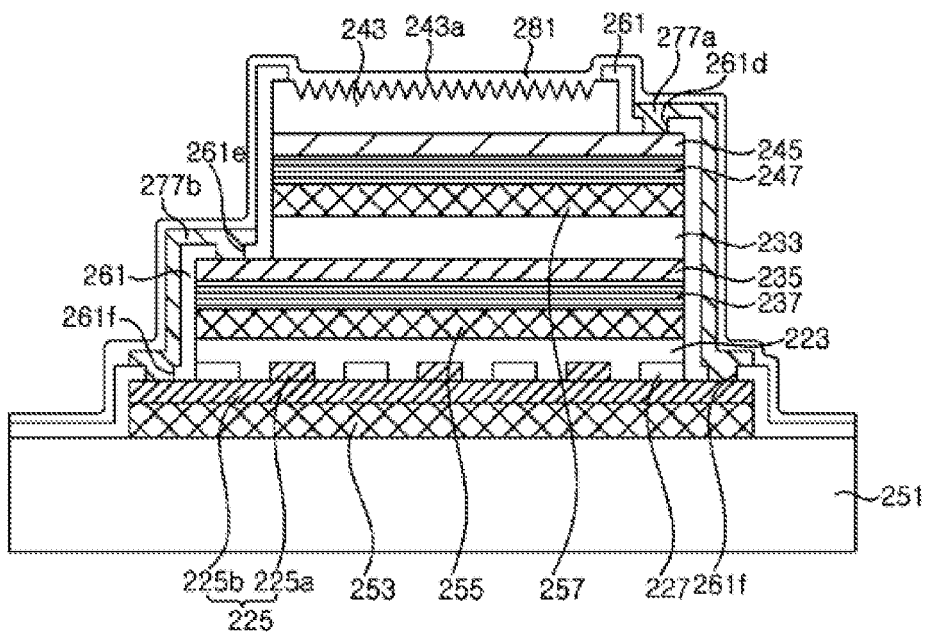
FIG. 33 is a schematic cross-sectional view taken along line A-A of FIG. 32.
Figure 34:
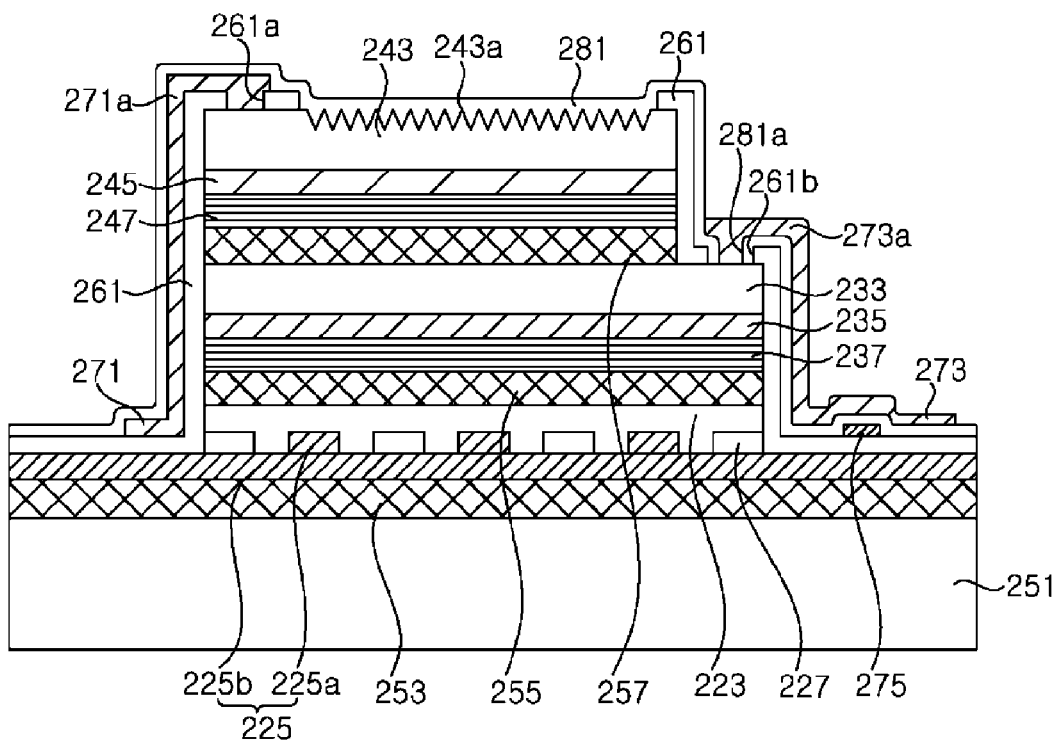
FIG. 34 is a schematic cross-sectional view taken along line B-B of FIG. 32.

FIG. 32 is an enlarged plan view of one light emitting stacked structure of the display apparatus of FIG. 30, FIG. 33 is a schematic cross-sectional view taken along line A-A of FIG. 32, and FIG. 34 is a schematic cross-sectional view taken along line B-B of FIG. 32.

Referring to FIG. 30, FIG. 32, FIG. 33, and FIG. 34, in each pixel (or in each light emitting stacked structure), a portion of the reflective electrode 225, the ohmic electrode 229 formed on the upper surface of the first epitaxial stack 223, a portion of the second-p transparent electrode 235, a portion of the upper surface of the second epitaxial stack 233, a portion of the third-p transparent electrode 245, and the upper surface of the third epitaxial stack 243 are exposed to the outside.

The third epitaxial stack 243 may have a roughened surface 243a on the upper surface thereof. The roughened surface 243a may be formed over the entire upper surface of the third epitaxial stack 243, or may be formed in some regions thereof, as shown in the drawings.

A lower insulation layer 261 may cover a side surface of each pixel. The lower insulation layer 261 may be formed of a light transmissive material, such as $SiO_2$. In this case, the lower insulation layer 261 may cover substantially the entire upper surface of the third epitaxial stack 243. Alternatively, the lower insulation layer 261 may include a distributed Bragg reflector to reflect light traveling towards the side surfaces of the first to third epitaxial stacks 223, 233, and 243. In this case, the lower insulation layer 261 at least partially exposes the upper surface of the third epitaxial stack 243. The lower insulation layer 261 may also include a light absorbing layer. For example, the lower insulation layer 261 may include a light absorbing material such as black epoxy. Further, the lower insulation layer 261 may be formed of a light transmissive material, and an organic or inorganic reflection layer may be added thereon.

The lower insulation layer 261 may also include an opening 261a exposing the upper surface of the third epitaxial stack 243, an opening 261b exposing the upper surface of the second epitaxial stack 233, an opening 261c (see FIG. 35H) exposing the ohmic electrode 229 of the first epitaxial stack 223, an opening 261d exposing the third-p transparent electrode 245, an opening 261e exposing the second-p transparent electrode 235, and openings 261f exposing the first-p reflective electrode 225.

The interconnection lines 271 and 275 may be formed near the first to third epitaxial stacks 223, 233, and 243 on the support substrate 251, and may be disposed on the lower insulation layer 261 to be insulated from the first-p reflective electrode 225. A connecting portion 277a connects the third-p transparent electrode 245 to the reflective electrode 225, and a connecting portion 277b connects the second-p transparent electrode 235 to the reflective electrode 225, so that the anodes of the first epitaxial stack 223, the second epitaxial stack 233 and the third epitaxial stack 243 are commonly connected to the reflective electrode 225.

A connecting portion 271a connects the upper surface of the third epitaxial stack 243 to the interconnection line 271, and a connecting portion 275a connects the ohmic electrode 229 on the first epitaxial stack 223 to the interconnection line 275.

An upper insulation layer 281 may be disposed on the interconnection lines 271 and 275 and the lower insulation layer 261 to cover the upper surface of the third epitaxial stack 243. The upper insulation layer 281 may have an opening 281a which partially exposes the upper surface of the second epitaxial stack 233.

The interconnection line 273 may be disposed on the upper insulation layer 281, and the connecting portion 273a may connect the upper surface of the second epitaxial stack 233 to the interconnection line 273. The connecting portion 273a may pass through an upper portion of the interconnection line 275 and is insulated from the interconnection line 275 by the upper insulation layer 281.

Although the electrodes of each light emitting stacked structure are described as being connected to the data line and the scan lines, the interconnection lines 271 and 275 are described as being formed on the lower insulation layer 261, and the interconnection line 273 is described as being formed on the upper insulation layer 281, the inventive concepts are not limited thereto. For example, all of the interconnection lines 271, 273, and 275 may be formed on the lower insulation layer 261, and may be covered by the upper insulation layer 281, which may have openings to expose the interconnection line 273. In this case, the connecting portion 273a may connect the upper surface of the second epitaxial stack 233 to the interconnection line 273 through the openings of the upper insulation layer 281.

Alternatively, the interconnection lines 271, 273, and 275 may be formed inside the support substrate 251, and the connecting portions 271a, 273a, and 275a on the lower insulation layer 261 may connect the ohmic electrode 229, the upper surface of the first epitaxial stack 223, and the upper surface of the third epitaxial stack 243 to the interconnection lines 271, 273, and 275, respectively.

FIG. 35A to FIG. 35K are schematic plan views illustrating a method of manufacturing a display apparatus according to an exemplary embodiment.

First, the light emitting stacked structure 2100 of FIG. 28 is prepared.

Figure 35A:
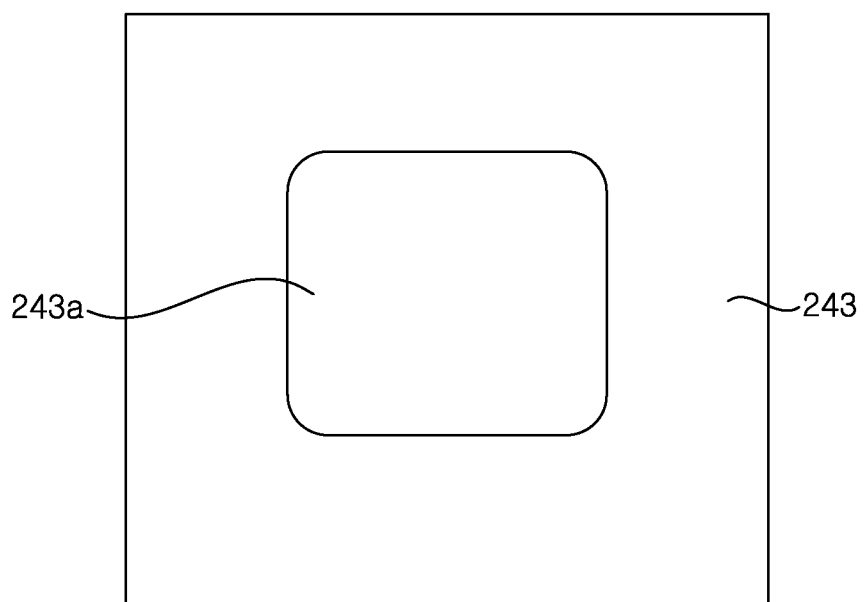
FIGS. 35A, 35B, 35C, 35D, 35E, 35F, 35G, 35H, 35I, 35J, and 35K are schematic plan views illustrating a method of manufacturing a display apparatus according to an exemplary embodiment.

Then, referring to FIG. 35A, a roughened surface 243a may be formed on the upper surface of the third epitaxial stack 243. The roughened surface 243a may be formed on the upper surface of the third epitaxial stack 243 to correspond to each pixel region. The roughened surface 243a may be formed by chemical etching, for example, photo-enhanced chemical etching (PEC).

The roughened surface 243a may be partially formed in each pixel region by taking into account a region of the third epitaxial stack 243 to be etched in the subsequent process, without being limited thereto. Alternatively, the roughened surface 243a may be formed over the entire upper surface of the third epitaxial stack 243.

Figure 35B:
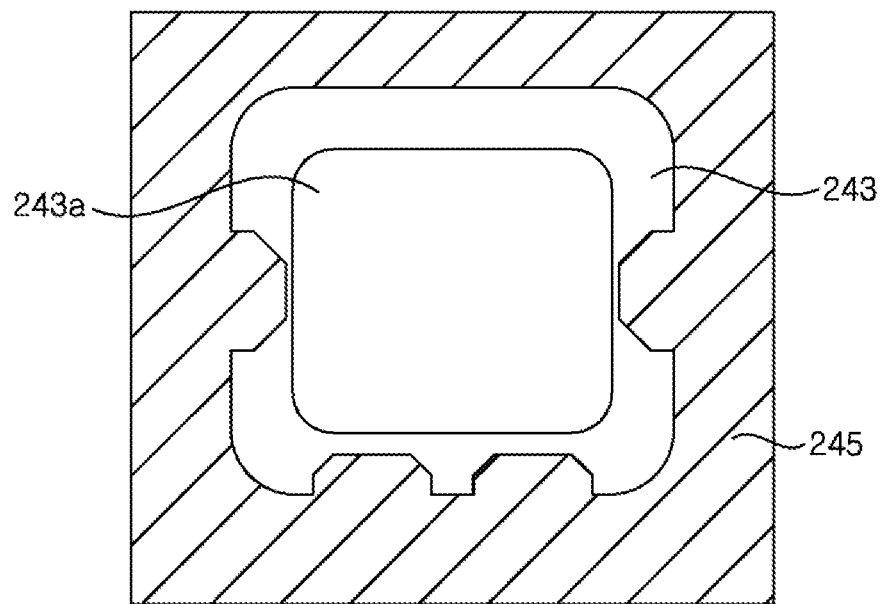

Referring to FIG. 35B, a surrounding region of the third epitaxial stack 243 in each pixel is removed by etching to expose the third-p transparent electrode 245. As shown in the drawings, the third epitaxial stack 243 may remain to have substantially a rectangular shape or a square shape, as shown in the drawings. The third epitaxial stack 243 may be patterned to have a plurality of depressions along an edge thereof.

Figure 35C:
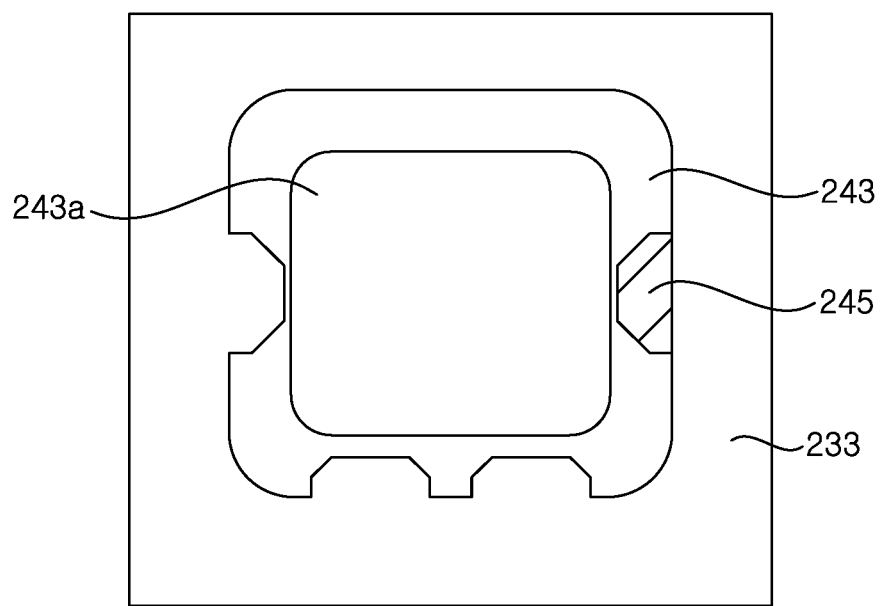

Referring to FIG. 35C, the upper surface of the second epitaxial stack 233 is exposed by removing the third-p transparent electrode 245 in areas other than one depression. Accordingly, the upper surface of the second epitaxial stack 233 is exposed around the third epitaxial stack 243 and in other depressions excluding the one on which the third-p transparent electrode 245 is partially remained.

Figure 35D:
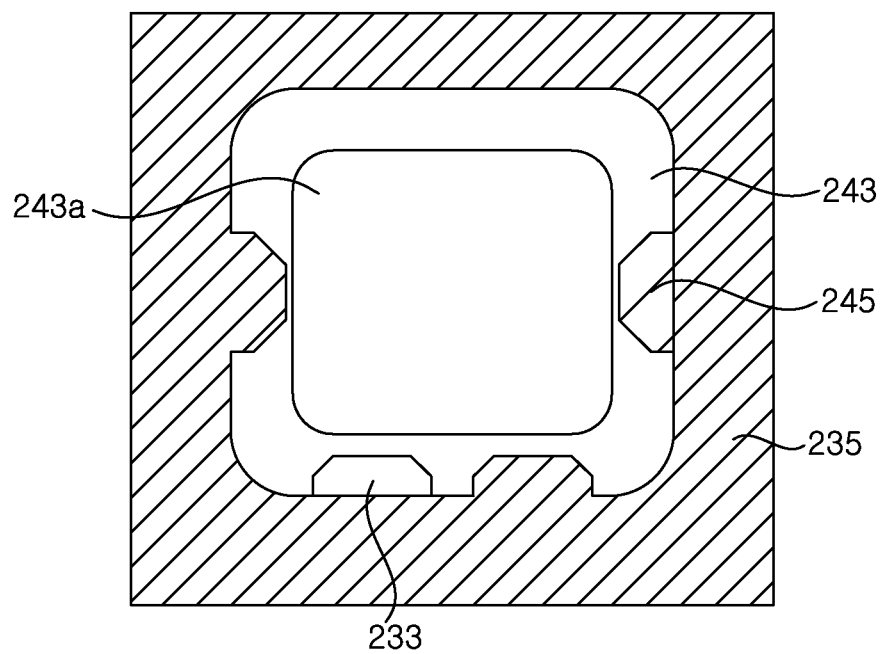

Referring to FIG. 35D, the second-p transparent electrode 235 is exposed by removing the second epitaxial stack 233 in areas other than another depression.

Figure 35E:
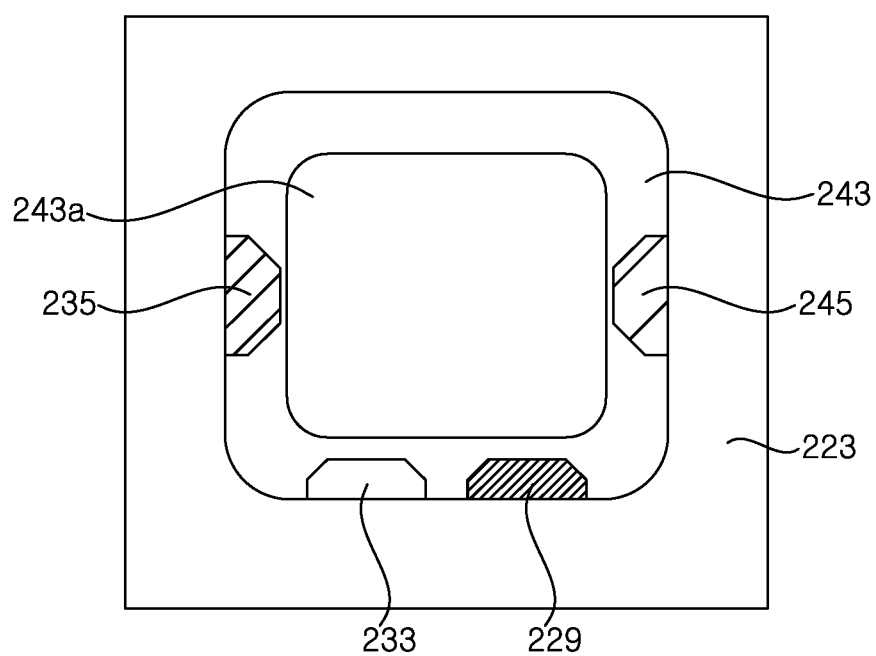

Referring to FIG. 35E, the ohmic electrode 229 is exposed together with the upper surface of the first epitaxial stack 223 by removing the second-p transparent electrode 235 in areas other than another depression. Here, the ohmic electrode 229 may be exposed in one depression. Accordingly, the upper surface of the first epitaxial stack 223 is exposed around the third epitaxial stack 243, and an upper surface of the ohmic electrode 229 is exposed in at least one of the depressions formed in the third epitaxial stack 243.

Figure 35F:
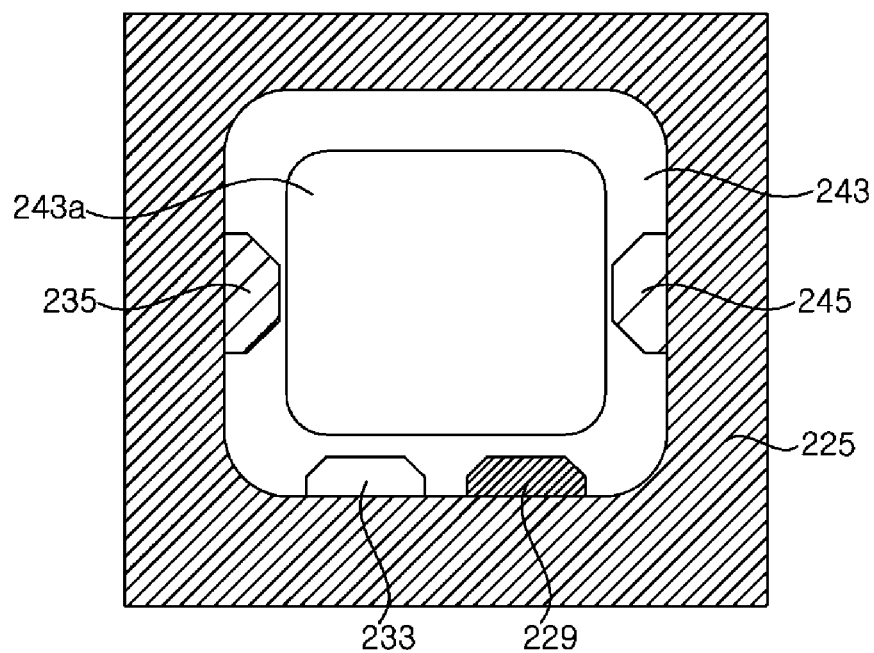

Referring to FIG. 35F, the reflective electrode 225 is exposed by removing an exposed portion of the first epitaxial stack 223 in areas other than the ohmic electrode 229 exposed in one depression. In this manner, the reflective electrode 225 is exposed around the third epitaxial stack 243.

Figure 35G:
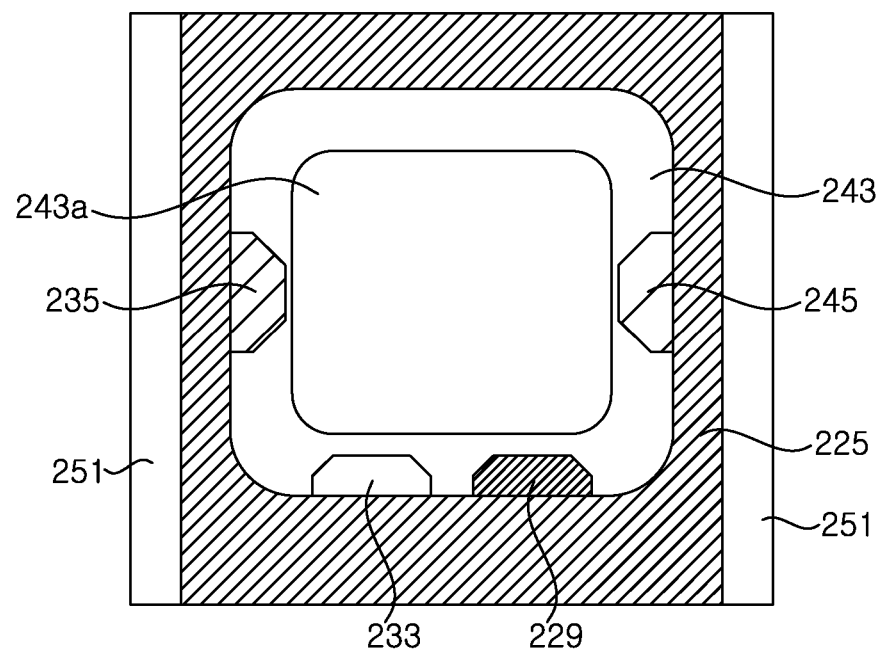

Referring to FIG. 35G, linear interconnection lines are formed by patterning the reflective electrode 225. In this case, the support substrate 251 may be exposed. The reflective electrode 225 may connect the light emitting stacked structures arranged in one or more set of columns to each other among light emitting stacked structures arranged in a matrix (see FIG. 31).

Figure 35H:
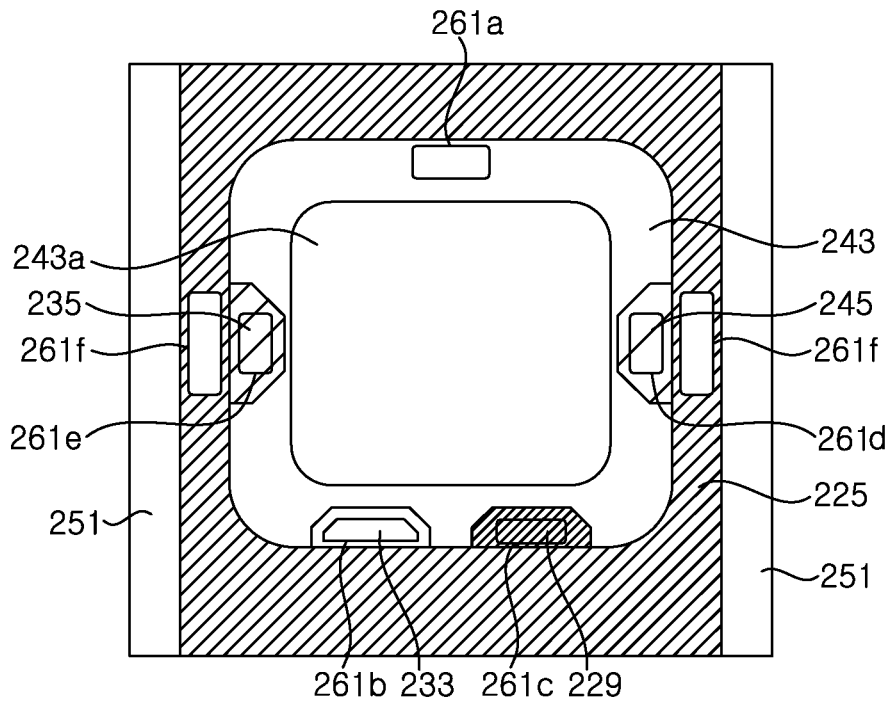

Referring to FIG. 35H, a lower insulation layer 261 (see FIG. 33 and FIG. 34) is formed to cover the pixels. The lower insulation layer 261 covers the reflective electrode 225 and side surfaces of the first to third epitaxial stacks 223, 233, 243. In addition, the lower insulation layer 261 may at least partially cover the upper surface of the third epitaxial stack 243. When the lower insulation layer 261 is transparent, such as a SiO$_2$ layer, the lower insulation layer 261 may cover substantially the entire upper surface of the third epitaxial stack 243. Alternatively, the lower insulation layer 261 may include a distributed Bragg reflector. In this case, the lower insulation layer 261 may at least partially expose the upper surface of the third epitaxial stack 243 to allow light to be emitted to the outside.

The lower insulation layer 261 may include an opening 261a exposing the third epitaxial stack 243, an opening 261b exposing the second epitaxial stack 233, an opening 261c which exposes the ohmic electrode 229, an opening 261d exposing the third-p transparent electrode 245, an opening 261e exposing the second-p transparent electrode 235, and an opening 261f exposing the reflective electrode 225. The opening 261f may be formed singularly or in plural.

Figure 35I:
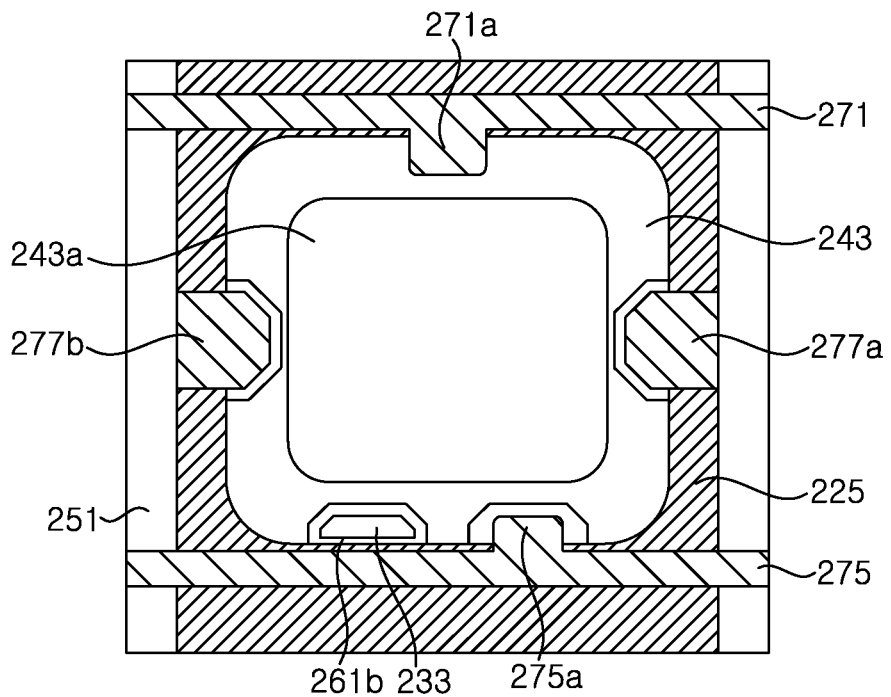

Referring to FIG. 35I, interconnection lines 271 and 275 and connecting portions 271a, 275a, 277a, and 277b are formed by a lift-off process or the like. The interconnection lines 271 and 275 are insulated from the reflective electrode 225 by the lower insulation layer 261. The connecting portion 271a electrically connects the third epitaxial stack 243 to the interconnection line 271, and the connecting portion 275a electrically connects the ohmic electrode 229 to the interconnection line 275 so that the first epitaxial stack 223 is electrically connected to the interconnection line 275. The connecting portion 277a electrically connects the third-p transparent electrode 245 to the first-p reflective electrode 225, and the connecting portion 277b electrically connects the second-p transparent electrode 235 to the first-p reflective electrode 225.

Figure 35J:
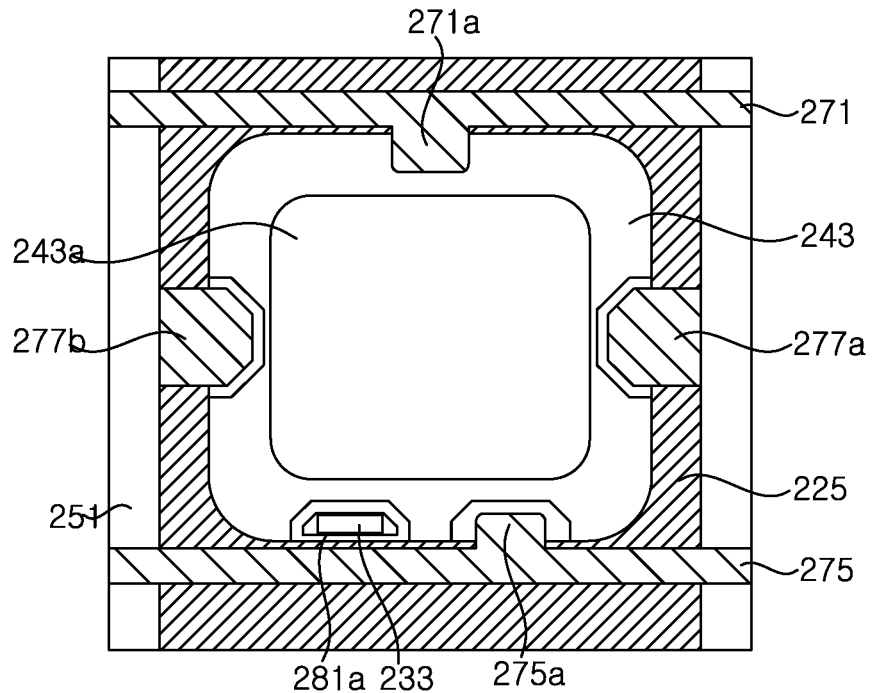

Subsequently, referring to FIG. 35J, an upper insulation layer 281 (see FIG. 33 and FIG. 34) covers the interconnection lines 271 and 275 and the connecting portions 271a, 275a, 277a, and 277b. The upper insulation layer 281 may also cover substantially the entire upper surface of the third epitaxial stack 243. The upper insulation layer 281 has an opening 281a exposing the upper surface of the second epitaxial stack 233. The upper insulation layer 281 may be formed of, for example, silicon oxide or silicon nitride, and may include a distributed Bragg reflector. Alternatively, the upper insulation layer 281 may include a light absorbing layer. When the upper insulation layer 281 includes a reflection layer or the light absorbing layer, the upper insulation layer 281 may expose at least a portion of the upper surface of the third epitaxial stack 243 to allow light to be emitted to the outside.

Figure 35K:
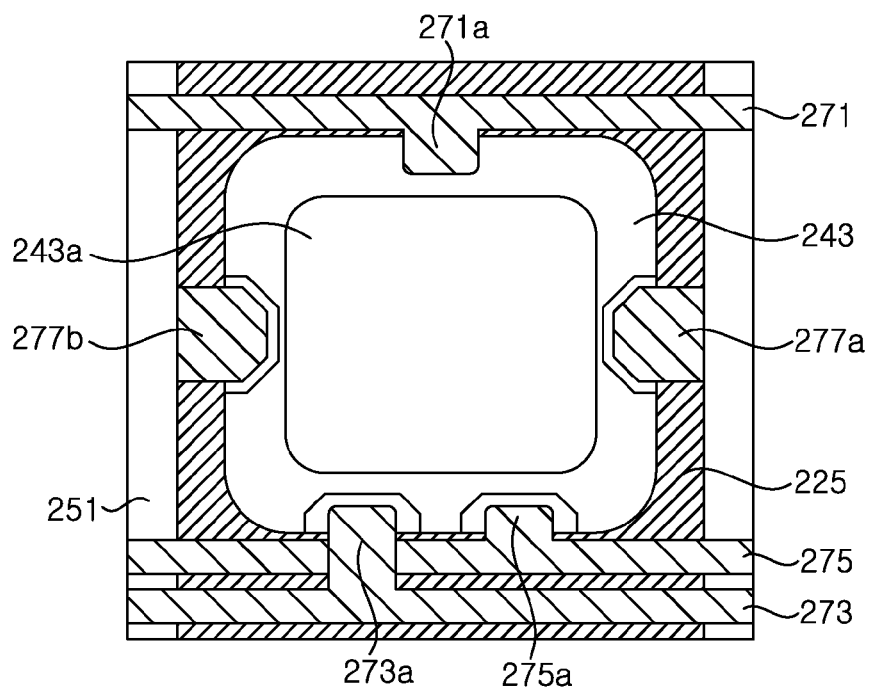

Referring to FIG. 35K, an interconnection line 273 and a connecting portion 273a are formed. An interconnection line 273 and a connecting portion 273a may be formed by a lift-off process or the like. The interconnection line 273 is disposed on the upper insulation layer 281 and is insulated from the reflective electrode 225 and the interconnection lines 271, 275. The connecting portion 273a electrically connects the second epitaxial stack 233 to the interconnection line 273. The connecting portion 273a may pass through an upper portion of the interconnection line 275 and is insulated from the interconnection line 275 by the upper insulation layer 281.

As such, a light emitting stacked structure region of FIG. 32 is provided. In addition, as shown in FIG. 30, a plurality of light emitting stacked structures may be formed on the support substrate 251, and an image may be implemented by selecting a light emitting stacked structure SSF among a plurality of light emitting stacked structures in one pixel region F to be actually used.

Although a method of manufacturing the display apparatus configured to be driven in the passive matrix manner has been illustrated according to an exemplary embodiment, the inventive concepts are not limited thereto. For example, a display apparatus may be manufactured in various ways to be driven in the active matrix manner using the light emitting stacked structure.

For example, although the interconnection line 273 is described as being formed on the upper insulation layer 281, the interconnection line 273 may be formed together with the interconnection lines 271 and 275 on the lower insulation layer 261, and the connecting portion 273a may be formed on the upper insulation layer 281 to connect the second epitaxial stack 233 to the interconnection line 273. Alternatively, the interconnection lines 271, 273, and 275 may be disposed inside the support substrate 251.

In some exemplary embodiments, a display apparatus may be formed to be driven in an active matrix manner.

According to an exemplary embodiment, one pixel region F includes the plurality of light emitting stacked structures, and the selected light emitting stacked structures SSF among the plurality of light emitting stacked structures is used to display the image. The first to third epitaxial stacks 223, 233, and 243 in the non-selected light emitting stacked structures NSSF are also connected to the data lines and the scan lines, but the non-selected light emitting stacked structures NSSF maintain the idle state during the operation of the display apparatus, since the data lines connected to the non-selected light emitting stacked structures NSSF, for example data lines Vdata1-0 and Vdata1-2, are disconnected from the current supply.

According to exemplary embodiments, since the display apparatus is manufactured by using the plurality of light emitting stacked structures formed on the support substrate 251, the steps for separately mounting small-sized LEDs may be obviated.

Further, by arranging the plurality of light emitting stacked structures within one pixel region F, a defective pixel region F may be easily replaced with new light emitting stacked structures.

Figure 36:
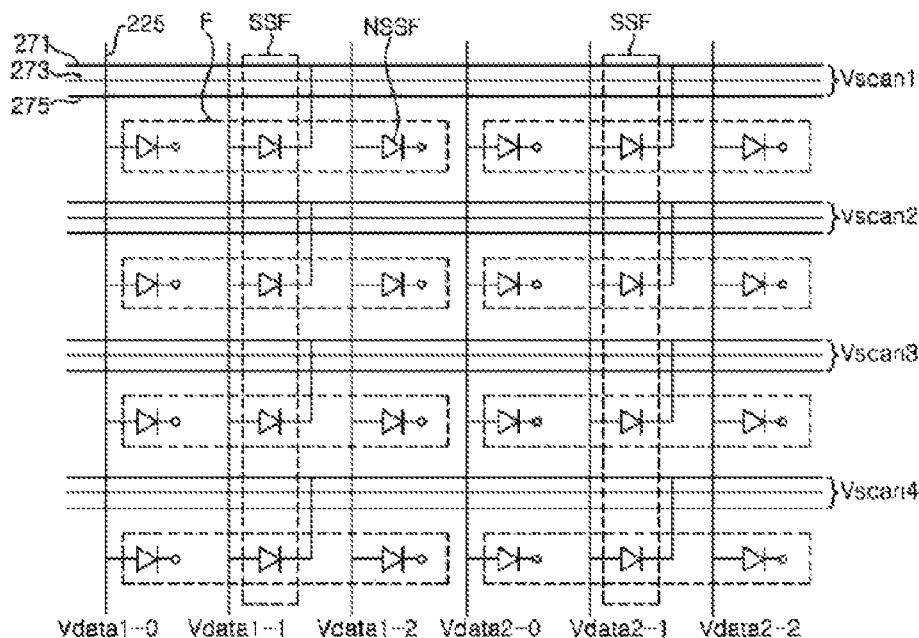
FIG. 36 is a circuit diagram of a display apparatus according to another exemplary embodiment.

FIG. 36 is a circuit diagram of a display apparatus according to another exemplary embodiment.

Referring back to FIG. 31, the display apparatus includes non-selected light emitting stacked structures NSSF connected to the data line 225 and the auxiliary scan lines 271, 273, and 275. Referring to FIG. 36, the display apparatus according to an exemplary embodiment includes the non-selected light emitting stacked structure NSSF connected to the data line 225, but disconnected from the auxiliary scan lines 271, 273, and 275.

For example, by omitting the connection portions 271a, 273a, and 275a formed on the non-selected light emitting stacked structures NSSF, the non-selected light emitting stacked structures NSSF may be disconnected from the auxiliary scan lines 271, 273, and 275.

Accordingly, the non-selected light emitting stacked structures NSSF are originally cut off from the current supply.

In some exemplary embodiments, the non-selected light emitting stacked structures NSSF may be disconnected from the data line 225. For example, the connection portions 277a and 277b, which insulate the first epitaxial stack 223 in the non-selected light emitting stacked structures NSSF from the reflective electrode 225, may be omitted, and connect the second and third epitaxial stacks 233 and 243 to the reflective electrode 225.

The pixel regions F are arranged substantially in a matrix form, and the plurality of light emitting stacked structures arranged in each pixel region F are arranged in a 1×3 matrix. However, the inventive concepts are not limited thereto, and the light emitting stacked structures may be arranged in two columns or four or more columns, and in two or more rows.

Figure 37:
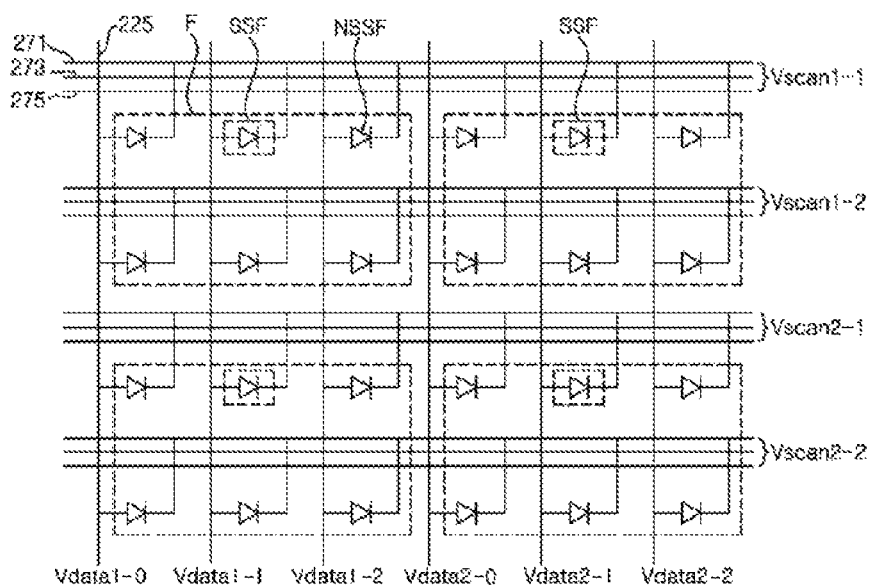
FIG. 37 is a circuit diagram of a display apparatus according to another exemplary embodiment.

FIG. 37 is a circuit diagram of a display apparatus according to another exemplary embodiment.

Referring to FIG. 37, the light emitting stacked structures according to an exemplary embodiment in each pixel region F are arranged in a plurality of rows. More particularly, the light emitting stacked structures are arranged in a 2×2 matrix in each pixel region F. However, the inventive concepts are not limited thereto, and the light emitting stacked structures but may be arranged in a 2×1 matrix or more, or 2×3 matrix or more in each pixel region F.

Since the light emitting stacked structures are arranged in a plurality of rows in each pixel region F, scan lines Vscan connected to each pixel region F are represented by a plurality of lines, such as scan lines Vscan 1-1 and Vscan 1-2. In addition, each scan line Vscan includes a set of the auxiliary scan lines 271, 273, and 275, to which the first to third epitaxial stacks 223, 233, and 243 are connected, respectively.

During operation, the selected light emitting stacked structure SSF in each pixel region F may operate and the remaining non-selected light emitting stacked structures NSSF may maintain an idle state. The unselected light emitting stacked structures NSSF may be connected to the data line 225 and the auxiliary scan lines 271, 273, and 275 as shown in the drawings, but the current supply to the data line 225 and/or the auxiliary scanning lines 271, 273, and 275 may be interrupted. For example, the data line 225 and/or the auxiliary scan lines 271, 273, and 275 connected to the non-selected light emitting stacked structures NSSF may be disconnected from the current supply, so that the non-selected light emitting stacked structures NSSF maintain the idle state during the operation of the display apparatus.

As shown in FIG. 37, when only one light emitting stacked structure SSF is selected in one pixel region F, the remaining light emitting stacked structures in in another row or another column in the same pixel region F may not be selected.

Although the non-selected light emitting stacked structures NSSF are described as being connected to the data line 225 and the auxiliary scan lines 271, 273, and 275, in some exemplary embodiments, the non-selected light emitting stacked structures NSSF may not be connected to the data lines 225 and/or the auxiliary scan lines 271, 273, and 275, or the data lines 225 and/or the auxiliary scan lines 271, 273, and 275 thereto may be omitted.

According to the exemplary embodiments, the first to third epitaxial stacks 223, 233, and 243 are stacked on each other to form the light emitting stacked structures, which may be formed at the wafer level. As such, the steps for individually mounting the light emitting stacked structures may be obviated to simplify to the manufacturing process of the display apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a plurality of pixel tiles spaced apart from each other, each of the pixel tiles including:
   a substrate; and
   a plurality of light emitting stacked structures disposed on the substrate, each of the light emitting stacked structures comprising a plurality of epitaxial sub-units sequentially disposed one over another to have overlapping light emitting areas, and each of the plurality of epitaxial sub-units being configured to to emit different colored light,
   wherein a distance between two adjacent light emitting stacked structures in the same pixel tile is substantially equal to a shortest distance between two adjacent light emitting stacked structures of different pixel tiles.

2. The display device of claim 1, wherein each of the pixel tiles has substantially the same shape.

3. The display device of claim 2, wherein:
   the substrate has a substantially polygonal shape; and
   the light emitting stacked structures are disposed at vertices of the polygonal shape.

4. The display device of claim 3, wherein:
   the substrate has substantially a triangular shape; and
   the light emitting stacked structures are disposed at vertices of the triangular shape.

5. The display device of claim 1, wherein the light emitting stacked structures are arranged substantially regularly along at least one of a first direction and a second direction intersecting the first direction.

6. The display device of claim 1, wherein the pixel tiles have different shapes from each other.

7. The display device of claim 1, wherein the substrate comprises a silicon substrate.

8. The display device of claim 7, wherein the substrate includes a penetrating electrode that penetrates upper and lower surfaces of the substrate and is electrically connected to the light emitting stacked structures.

9. The display device of claim 1, wherein
   at least one of the epitaxial sub-units has an area different from that of another one of the epitaxial sub-units.

10. The display device of claim 9, wherein the area of the epitaxial sub-units gradually decreases along a first direction.

11. The display device of claim 10, wherein an upper epitaxial sub-unit completely overlaps a lower epitaxial sub-unit.

12. The display device of claim 9, wherein:
    light emitted from each epitaxial sub-units has a different energy band; and
    the energy band of light gradually increases along a first direction.

13. The display device of claim 9, wherein each of the epitaxial sub-units is independently drivable.

14. The display device of claim 9, wherein light emitted from a lower epitaxial sub-unit is configured to be emitted to the outside of the display device through an epitaxial sub-unit disposed thereon.

15. The display device of claim 14, wherein an upper epitaxial stack is configured to transmit about 80% or more of light emitted from a lower epitaxial stack.

16. The display device of claim 9, wherein the epitaxial sub-units comprise:

a first epitaxial stack configured to emit a first color light;
a second epitaxial stack disposed on the first epitaxial stack and configured to emit a second color light having a wavelength band different from the first color light; and
a third epitaxial stack disposed on the second epitaxial stack and configured to emit a third color light having a wavelength band different from the first and second color lights.

17. The display device of claim 16, wherein the first, second, and third color lights are red light, green light, and blue light, respectively.

18. The display device of claim 16, wherein each of the first, second, and third epitaxial stacks comprises:
a p-type semiconductor layer;
an active layer disposed on the p-type semiconductor layer; and
an n-type semiconductor layer disposed on the active layer.

19. The display device of claim 1, wherein the display device is configured to be driven in at least one of a passive matrix manner and an active matrix manner.

20. The display device of claim 1, wherein at least one of the light emitting stacked structures comprises a micro LED having a surface area less than about 10,000 square μm.

* * * * *